United States Patent
Kiyomori et al.

(10) Patent No.: US 10,727,410 B2
(45) Date of Patent: *Jul. 28, 2020

(54) SURFACE MODIFIER FOR TRANSPARENT OXIDE ELECTRODE, SURFACE-MODIFIED TRANSPARENT OXIDE ELECTRODE, AND METHOD FOR PRODUCING SURFACE-MODIFIED TRANSPARENT OXIDE ELECTRODE

(71) Applicant: Shin-Etsu Chemical Co., Ltd., Tokyo (JP)

(72) Inventors: Ayumu Kiyomori, Joetsu (JP); Yusuke Itoh, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 341 days.

This patent is subject to a terminal disclaimer.

(21) Appl. No.: 14/084,036

(22) Filed: Nov. 19, 2013

(65) Prior Publication Data

US 2014/0147628 A1 May 29, 2014

(30) Foreign Application Priority Data

Nov. 28, 2012 (JP) ................. 2012-259748

(51) Int. Cl.
| | |
|---|---|
| *C07F 7/18* | (2006.01) |
| *H01B 1/08* | (2006.01) |
| *H01B 5/00* | (2006.01) |
| *H01L 51/00* | (2006.01) |
| *C09D 183/06* | (2006.01) |
| *C09D 183/08* | (2006.01) |
| *H01L 51/44* | (2006.01) |
| *H01L 51/52* | (2006.01) |
| *C08G 77/14* | (2006.01) |
| *C08G 77/26* | (2006.01) |
| *C08G 77/00* | (2006.01) |
| *H01L 51/10* | (2006.01) |

(52) U.S. Cl.
CPC ........ *H01L 51/0021* (2013.01); *C07F 7/1804* (2013.01); *C09D 183/06* (2013.01); *C09D 183/08* (2013.01); *H01B 1/08* (2013.01); *C08G 77/14* (2013.01); *C08G 77/26* (2013.01); *C08G 77/80* (2013.01); *H01L 51/102* (2013.01); *H01L 51/442* (2013.01); *H01L 51/5206* (2013.01); *H01L 51/5215* (2013.01); *H01L 51/5221* (2013.01); *Y10T 428/24355* (2015.01); *Y10T 428/265* (2015.01)

(58) Field of Classification Search
CPC ............... H01L 51/0021; H01L 51/102; H01L 51/5221; H01L 51/5206; H01L 51/442; H01L 51/5215; C07F 7/1804; C07F 7/1836; C09D 183/08; C09D 183/06; H01B 1/08; Y10T 428/24355; Y10T 428/265; C08G 77/26; C08G 77/14; C08G 77/80

See application file for complete search history.

(56) References Cited

U.S. PATENT DOCUMENTS

| | | | |
|---|---|---|---|
| 5,951,912 A | 9/1999 | Mercer | |
| 2002/0084553 A1 | 7/2002 | Nun et al. | |
| 2003/0235933 A1 | 12/2003 | Rantala et al. | |
| 2007/0026580 A1 | 1/2007 | Fujii | |
| 2008/0042129 A1 | 2/2008 | Nakagawa et al. | |
| 2009/0004772 A1 | 1/2009 | Jinbo et al. | |
| 2010/0230639 A1* | 9/2010 | Yamada ................ | C07C 211/54 252/500 |
| 2011/0248291 A1 | 10/2011 | Jinbo et al. | |
| 2012/0003485 A1 | 1/2012 | Habich et al. | |

FOREIGN PATENT DOCUMENTS

| | | |
|---|---|---|
| CN | 1905136 | 1/2007 |
| CN | 101236897 | 8/2008 |
| CN | 102653638 A | 9/2012 |
| JP | 2001-512779 | 8/2001 |
| JP | 2005001996 A * | 1/2005 |
| JP | 2005 070369 A | 3/2005 |
| JP | 2005-158765 A | 6/2005 |
| JP | 2007-59893 A | 3/2007 |

(Continued)

OTHER PUBLICATIONS

Translation to English for 2005-070369. accessed Nov. 6, 2017 (Year: 2005).*
Espacenet Translation to English of JP 2005001996 A. accessed Oct. 4, 2018. (Year: 2005).*
"Carboxylate Methylenation with a Functionalized Silylmethyl Anion: A Two-Step Synthesis of 2-Substitution Allylic Alcohols from Esters." Tammy J. Mickelson, Jennifer L. Koviach, and Craig J. Forsyth. The Journal of Organic Chemistry. 1996 61 (26), 9617-9620. DOI: 10.1021/jo961639h. (Year: 1996).*
International Written Opinion for corresponding International Application No. PCT/JP2013/081035, dated Feb. 18, 2014.

(Continued)

*Primary Examiner* — Nancy R Johnson
(74) *Attorney, Agent, or Firm* — Alston & Bird LLP

(57) ABSTRACT

A surface modifier for a transparent oxide electrode contains a reactive silyl compound represented by General Formula (1):

$$\text{Rf—X-A-SiR}^1_{3-n}(\text{OR}^2)_n \quad (1)$$

in which, Rf is an aryl group having 10 or fewer carbon atoms that may have an alkyl substituent having 1 to 5 carbon atoms, wherein at least one hydrogen atom is replaced with a fluorine atom, X represents a divalent group selected from —O—, —NH—, —C(=O)O—, —C(=O)NH—, —OC(=O)NH—, —NHC(=O)NH—, or a single bond, A represents a straight chain, branched chain or cyclic aliphatic divalent hydrocarbon group having 1 to 10 carbon atoms, an aromatic divalent hydrocarbon group, or a single bond, a surface-modified transparent oxide electrode formed by coating with the surface modifier. A method for producing a surface-modified transparent oxide electrode is also provided.

9 Claims, No Drawings

(56) References Cited

FOREIGN PATENT DOCUMENTS

| | | |
|---|---|---|
| JP | 2007-157752 A | 6/2007 |
| JP | 2008-130882 | 6/2008 |
| JP | 2008-211191 A | 9/2008 |
| JP | 2012-532813 A | 12/2012 |
| JP | 2013-153177 | 8/2013 |
| JP | 2014-507056 A | 3/2014 |
| KR | 20070014057 | 1/2007 |
| KR | 20080072571 | 8/2008 |
| WO | WO 99/07806 A1 | 2/1999 |
| WO | WO-2006068189 | 6/2006 |
| WO | WO 2012/117035 A1 | 9/2012 |

OTHER PUBLICATIONS

Chen, H.-Y. et al., *Self-assembled monolayer modification of silver source-drain electrodes for high-performance pentacene organic field-effect transistors*, Organic Electronics, vol. 13 (2012) 593-598.

Gundlach, D. J. et al., *Pentacene TFT With Improved Linear Region Characteristics Using Chemically Modified Source and Drain Electrodes*, IEEE Electron Device Letters, vol. 22, No. 12 (Dec. 2001) 571-573.

Material Matters, Molecular Self-Assembly, Aldrich vol. 1, No. 2 (2006) 1-20.

Office Action from corresponding Chinese Patent Application No. 201310631216.3 dated Sep. 6, 2015.

Yamamoto Takamichi et al.; "*AFM Anodization Lithography on Transparent Conductive Substrates*"; Journal of Nanoscience and Nanotechnology; vol. 8, No. 8; pp. 3833-3842; Dec. 2008.

Search Report for European Application No. EP 13 19 4528 dated Feb. 25, 2014.

International Search Report for Application No. PCT/JP2013/081035 dated Feb. 18, 2014.

Lee, J. Y., *Relationship Between the Chemical Nature of Silanes and Device Performance of Polymer Light Emitting Diodes*, Thin Solid Films, vol. 515, No. 4 (Dec. 5, 2006) 2705-2708 (XP-002720118).

Mori, T. et al., *Effect of Self-Assembled Monolayer on Electroluminescence Properties of Organic Light-Emitting Diodes*, Japanese Journal of Applied Physics, vol. 47, No. 1 (2008) pp. 455-459.

Hatton, R.A. et al., *Organic Electroluminescent Devices: Enhanced Carrier Injection Using an Organosilane Self Assembled Monolayer (SAM) Derivatized ITO Electrode*, Thin Solid Films, vol. 394 (2001) pp. 292-297.

Lee, J. et al., *Modification of an ITO Anode with a Hole-transporting SAM for Improved CLED Device Characteristics*, J. Mater Chem., vol. 12 (2002) pp. 3494-3498.

Office Action for Japanese Application No. 2014-550133 dated Jul. 8, 2016.

Extended European Search Report for corresponding European Application No. 13857749.9 dated Oct. 14, 2016.

Office Action for corresponding Japanese Patent Application No. 2013-234929 dated Sep. 16, 2016.

Huang, Cheng et al., *Solution-Processed Organic Field Transistors and Unipolar Inverters Using Self-Assembled Interface Dipoles on Gate Dielectrics*, Langmuir 2007, vol. 23, No. 26, (2007) pp. 13223-13231.

Hozumi, Atsushi et al., *Fluoroalkylsilane Monolayers Formed by Chemical Vapor Surface Modification on Hydroxylated Oxide Surfaces*, Langmuir 1999, vol. 15, No. 22, (1999) pp. 7600-7604.

Walker, P. et al., (editors), Handbook of Metal Etchants, CRC, (1991) p. 321.

Office Action for Chinese Application No. 201380061333.9 dated Jun. 2, 2017, 24 pages total.

Office Action for U.S. Appl. No. 14/647,635 dated Jun. 19, 2017.

Office Action for European Application No. EP 13 194 528.9 dated Mar. 1, 2017.

Ciriminna, R. et al., *Organofluoro-silica xerogels as high-performance optical oxygen sensors*, The Royal Society of Chemistry, vol. 134 (Jan. 2009)1531-1535.

Office Action for European Application No. EP 13 194 528.9 dated Aug. 22, 2018, 6 pages.

Li, J. et al., "Synthesis of rhodium N-heterocyclic carbene complexes and their catalytic activity in the hydrosilylation of alkenes in iconic liquid medium" Journal of Organometallic Chemistry, 696, (2011), pp. 2116-2121.

Office Action for Chinese Application No. 201710313331.4 dated Dec. 20, 2018.

* cited by examiner

SURFACE MODIFIER FOR TRANSPARENT OXIDE ELECTRODE, SURFACE-MODIFIED TRANSPARENT OXIDE ELECTRODE, AND METHOD FOR PRODUCING SURFACE-MODIFIED TRANSPARENT OXIDE ELECTRODE

BACKGROUND OF THE INVENTION

1. Field of the Invention

The present invention relates to a surface modifier for a transparent oxide electrode, to a surface-modified transparent oxide electrode, and to a method for producing a surface-modified transparent oxide electrode. The present invention particularly relates to a surface modifier for a transparent oxide electrode that has a greatly advantageous effect in increasing the work function of the transparent oxide electrode and provides good wettability of the modified electrode surface to organic solvents, a surface-modified transparent oxide electrode, and a method for producing a surface-modified transparent oxide electrode.

2. Description of the Related Art

Transparent conductive films, which have high visible light transmittance, are used as transparent electrodes for display devices such as liquid-crystal displays, organic EL displays, and electronic paper; and for touch panels, organic solar cells, and the like. Use of organic conductive polymers, carbon nanotubes, graphenes, and the like as materials for transparent conductive films are considered, in addition to metal thin films. Compounds called transparent conductive oxides, which absorb a small amount of visible light and exhibit high electric conductivity among inorganic metal oxides, are now mainly used.

As specific transparent conductive oxides, tin oxides, zinc oxides, indium oxides, and titanium oxides are known. Among these, tin-doped indium oxide (hereinafter, also referred to as "ITO"), which is indium oxide doped with tin, is a widely used material for reasons such as its ability to be made into thin films due to its low volume resistivity, its ability to increase transmittance, and its ease of being patterned. Transparent electrodes made of transparent conductive oxides are herein called transparent oxide electrodes.

In the case in which ITO is used in organic EL devices, ITO is often used as anodes because the work function of ITO itself is relatively high. One of important technical challenges of organic EL devices is to reduce the drive voltages. As such, a hole injection barrier from an anode to a hole transport layer must be reduced. Hole transport materials have an ionization potential from about 5.2 to 5.8 eV, and the difference with the work function of ITO will be the hole injection barrier. Since the work function of ITO is around 4.5 to 4.8 eV, there exists a high injection barrier of about 0.4 to 1.3 eV. Several methods for reducing this injection barrier have been proposed.

Generally, a method for inserting a hole injection layer having an ionization potential intermediate between the work function of the anode and the hole transport layer material has been adopted. As the material for the hole injection layer, various materials such as phthalocyanines, porphyrins, triarylamines, polyethylenedioxythiophene/polystyrene sulfonate (PEDOT/PSS), and transition metal oxides are used.

In recent years, it has been reported that forming a monolayer on an anode surface by using predetermined compounds increases hole injectionability. This monolayer formation replaces the above-described hole injection layer and can also eliminate the hole injection layer, allowing devices to be thinner. For example, Non-Patent Literature 1 (Japanese Journal of Applied Physics, 2008, vol. 47, pp. 455-459) discloses that depositing a self-assembled monolayer (F-SAM) of heptadecafluorodecyl triethoxysilane on ITO enhances the performance of organic EL devices compared to the case in which copper phthalocyanine is used as a hole injection layer. As the factor, it is indicated that the stability of N,N'-di-1-naphthyl-N,N'-diphenylbenzidine (NPD) layer is enhanced compared to ITO having no F-SAM by increase in the work function of the ITO surface due to formation of an F-SAM and deposition of NPD, which is a hole transport layer, on the ITO with an F-SAM.

A method using a silane derivative is excellent in that a layer can be formed in a short time. Additionally, since silane derivatives have a relatively high vapor pressure, layer deposition in a gas phase is possible, in addition to layer deposition in a liquid phase. Furthermore, it is also preferable that layers with fewer impurities can be deposited. However, an ITO surface with an F-SAM has very high water and oil repellency due to its low surface free energy. As the result, contact angles of solvents and solutions are increased. Patent Literature 1 (Japanese Patent Laid-Open No. 2008-130882) discloses a method for making silicon thermal oxidation layers highly liquid-repellent by a surface treatment using various silanes having fluorinated hydrocarbon groups.

In contrast, Non-Patent Literature 2 (Thin Solid Films, 2001, vol. 394, p. 292-297) and Non-Patent Literature 3 (Journal of Materials Chemistry, 2002, vol. 12, pp. 3494-3498) discloses that surface modification of ITO by use of a silane derivative having a particular structure increases the work function of ITO. As described above, the purpose of increasing the work function of ITO is, for example in the case of organic EL devices, is to adapt the ionization potential of the anode to the ionization potential of the hole transport layer to reduce the hole injection barrier. While the hole injection barrier from non-surface modified ITO to a hole transport layer is generally 1 eV or more, the amount of change in the work function of ITO is about +0.3 eV in Non-Patent Literature 2 and +0.5 eV in Non-Patent Literature 3. The amount of change in these work functions is still insufficient.

SUMMARY OF THE INVENTION

As described above, the method for increasing the work function of a transparent oxide electrode using a silane derivative of Non-Patent Literature 1 is excellent in that a layer can be formed in a short time and both liquid phase-gas phase processes can be applied, but the liquid repellency of the electrode surface after the treatment is extremely high. Thus, processes for stacking organic layers such as hole transport layers by solution coating, which are being developed as low-cost production methods, cannot be applied. Surface modification with various silane derivatives according to Patent Literature 1 seems to be inappropriate as well because the modification provides highly liquid-repellent surfaces. Furthermore, surface modification with silane derivatives disclosed in Non-Patent Literature 2 or Non-Patent Literature 3 does not provide a sufficient amount of change in the work function. A surface modifier that can appropriately regulate both the work function and the surface free energy of a transparent oxide electrode and can rapidly treat the surface of the transparent oxide electrode is required.

The present inventors, as a result of intensive studies, have found that the above described problem can be solved by use of a reactive silane with a fluorinated hydrocarbon group having a particular structure as a surface modifier for a transparent oxide electrode, thereby completing the present invention.

That is, according to one embodiment, the present invention relates to a surface modifier for a transparent oxide electrode comprising a reactive silyl compound represented by General Formula (1):

(1)

wherein,

Rf is an aryl group having 6 to 10 carbon atoms that may have an alkyl substituent having 1 to 5 carbon atoms, wherein at least one hydrogen atom is replaced with a fluorine atom, X represents a divalent group selected from —O—, —NH—, —C(=O)O—, —C(=O)NH—, —OC(=O)NH—, —NHC(=O)NH—, or a single bond, A represents a straight chain, branched chain, or cyclic aliphatic divalent hydrocarbon group having 1 to 10 carbon atoms, an aromatic divalent hydrocarbon group, or a single bond, $R^1$ is a monovalent hydrocarbon group having 1 to 3 carbon atoms, $R^2$ represents a monovalent hydrocarbon group having 1 to 3 carbon atoms, an acetyl group, a propanoyl group, or a hydrogen atom, and n is an integer of 1 to 3.

According to another aspect, the present invention is a surface-modified transparent oxide electrode formed by coating a transparent oxide electrode with a surface modifier for a transparent oxide electrode comprising a reactive silyl compound represented by the above described General Formula (1), wherein the surface-modified transparent oxide electrode has a surface free energy of 20 mN/m or more.

According to still another aspect, the present invention is a method for producing a surface-modified transparent oxide electrode, comprising steps of:

contacting a surface modifier for a transparent oxide electrode comprising a reactive silyl compound represented by the above described General Formula (1) with a surface of a transparent oxide electrode, and thereby obtaining a surface-modified transparent oxide electrode, wherein the surface work function of the surface-modified transparent oxide electrode is greater by 0.55 eV or more than the surface work function of the transparent oxide electrode before the contacting step.

The surface modifier for a transparent oxide electrode of the present invention has a great advantageous effect in increasing the work function of the transparent oxide electrode and provides good wettability of the modified electrode surface to organic solvents. Furthermore, the surface modification method for a transparent oxide electrode according to the present invention enables a monolayer of the surface modifier to be formed on the transparent oxide electrode in a short time, and the resulting transparent oxide electrode is free from contaminants. Furthermore, since it is chemically bonded with the surfaces of transparent oxide electrodes, the surface modifier for a transparent oxide electrode has excellent solvent resistance, heat resistance, and durability.

DETAILED DESCRIPTION OF PREFERRED EMBODIMENTS

A surface modifier for a transparent oxide electrode of the present invention is a compound having a reactive silyl group represented by the following General Formula (1):

(1)

In General Formula (1), Rf is an aryl group having 6 to 10 carbon atoms that may have an alkyl substituent having 1 to 5 carbon atoms, wherein at least one hydrogen atom is replaced with a fluorine atom.

Rf may be an aryl group, such as a phenyl group, or a naphtyl group, wherein at least one hydrogen atom is replaced with a fluorine atom. Specifically, in view of the formability of a dense monolayer, a phenyl group is preferable.

In the case in which Rf has alkyl substituents, the number of the alkyl substituents is 1 to 5, and preferably 1 to 3. Examples of the alkyl substituents include, for example, a methyl group, an ethyl group, an n-propyl group, and an isopropyl group, and particularly a methyl group is preferred in view of increasing the density of the surface modifier on the surface of the transparent oxide electrode. Fluorine atoms may be directly bonded to the aromatic ring constituting Rf, or may be bonded to the alkyl substituents. The number of fluorine atoms contained in Rf is preferably 1 to 10, more preferably 1 to 6.

Specific examples of Rf include a pentafluorophenyl group; a tetrafluoroaryl group, such as a 2,3,4,5-tetrafluorophenyl group and a 2,3,5,6-tetrafluorophenyl group; a trifluoroaryl group, such as a 2,3,5-trifluorophenyl group, a 2,4,5-trifluorophenyl group, a 3,4,5-trifluorophenyl group, and a 2,4,6-trifluorophenyl group; a difluoroaryl group, such as a 2,4-difluorophenyl group, a 3,4-difluorophenyl group, and a 3,5-difluorophenyl group; a monofluoroaryl group, such as a 2-fluorophenyl group, a 3-fluorophenyl group, and a 4-fluorophenyl group; a fluoroalkylaryl group, such as a 4-trifluoromethylphenyl group, a 3-trifluoromethylphenyl group, and a 3,5-bis(trifluoromethyl)phenyl group.

In General Formula (1), X represents a divalent group selected from —O—, —NH—, —C(=O)O—, —C(=O)NH—, —OC(=O)NH—, and —NHC(=O)NH— or a single bond. Particularly, a case in which X is a single bond is preferred in respect of heat resistance and durability of the surface modified layer.

In General Formula (1), A represents a straight chain, branched chain or cyclic aliphatic divalent hydrocarbon group having 1 to 10 carbon atoms, an aromatic divalent hydrocarbon group having 6 to 10 carbon atoms such as benzene or substituted benzene, naphthalene, or a single bond. Specific examples of A include a single bond; a straight chain, branched chain or cyclic aliphatic divalent hydrocarbon group, such as a methylene group, a 1,2-ethanediyl group, a 1,1-ethanediyl group, a 1,2-ethenediyl group, a 1,1-ethenediyl group, a 1,3-propanediyl group, a 1,2-propanediyl group, a 2-methyl-1,3-propanediyl group, a 1,3-butanediyl group, a 1,4-butanediyl group, a 1,5-pentanediyl group, a 1,6-hexanediyl group, a 1,4-cyclohexanediyl group, a 1,7-heptanediyl group, a 1,8-octanediyl group, a 1,9-nonanediyl group, and a 1,10-decanediyl group; an aromatic divalent hydrocarbon group, such as a 1,3-benzenediyl group, a 1,4-benzenediyl group, a 2-methyl-1,4-benzenediyl group, a 3-methyl-1,4-benzenediyl group, a 2,5-dimethyl-1,4-benzenediyl group, a 1,4-naphthalenediyl group, a 2,6-naphthalenediyl group, a 2,7-naphthalenediyl group, a 4-ethylbenzene-1,2-diyl group, and a 4-propylbenzene-1,3-diyl group. From a viewpoint of regulating the coverage of a surface modifier detailed below, it can be said that the more bulky the substituent A, the lower the coverage can be and the less bulky the substituent A, the higher the coverage can be. Thus, from a viewpoint of increasing the coverage, as for aliphatic divalent hydrocarbon groups with the same carbon number, straight chain divalent hydrocarbon groups are more preferred over branched chain or cyclic divalent hydrocarbon groups. Additionally, as for aromatic divalent hydrocarbon groups, from a viewpoint of increasing the coverage, over bulky groups with a substituent in the ortho position to the silicon atom, less bulky groups with no substituents are preferred.

In General Formula (1), $R^1$ is a monovalent hydrocarbon group having 1 to 3 carbon atoms. Specific examples of $R^1$ include a methyl group, an ethyl group, a propyl group, and an isopropyl group. Considering the balance between the reactivity and the stability of the compound of Formula (1), a methyl group is most preferred. Additionally, from a viewpoint of regulating the coverage of surface modifiers detailed below, these substituents can be listed in descending order of bulkiness as follows: an isopropyl group, a propyl group, an ethyl group, and a methyl group. Therefore, in the context of increasing the coverage as well, a methyl group is preferred.

$R^2$ represents a monovalent hydrocarbon group having 1 to 3 carbon atoms, an acetyl group, a propanoyl group, or a hydrogen atom. Examples of the monovalent hydrocarbon group include a methyl group, an ethyl group, a propyl group, an isopropyl group, an acetyl group, and a propanoyl group. Considering the balance between the reactivity and the stability of compounds of Formula (1), a methyl group and an ethyl group are preferred as $R^2$.

In General Formula (1), n is an integer of 1 to 3. A compound represented by General Formula (1) has at least one reactive silyl group. Reactive silyl groups, after it is hydrolyzed or as it is, can form a chemical bond with a substance constituting the surface of a transparent oxide electrode. Examples of the chemical bond include covalent bonds, coordination bonds, ionic bonds, and hydrogen bonds. Accordingly, an advantage is that the greater the number of reactive silyl groups, the higher the surface modification rate.

Specific examples of the compounds represented by General Formula (1) include, but are not limited to, the following:

pentafluorophenyltrimethoxysilane, pentafluorophenyltriethoxysilane, pentafluorophenyltripropoxysilane, pentafluorophenyltriisopropoxysilane, pentafluorophenylethoxydimethoxysilane, pentafluorophenyldiethoxymethoxysilane, pentafluorophenylisopropoxydimethoxysilane, pentafluorophenyldiisopropoxymethoxysilane, pentafluorophenyltriacetoxysilane, pentafluorophenyltri(propanoyloxy)silane, pentafluorophenylhydroxydimethoxysilane, pentafluorophenylhydroxydiethoxysilane, pentafluorophenylhydroxydiisopropoxysilane, pentafluorophenyldihydroxymethoxysilane, pentafluorophenyltrihydroxysilane, pentafluorophenyl(methyl)dimethoxysilane, pentafluorophenyl(methyl)diethoxysilane, pentafluorophenyl(ethyl)dimethoxysilane, pentafluorophenyldimethylmethoxysilane, pentafluorophenyldimethylethoxysilane, pentafluorophenyldiethylmethoxysilane, pentafluorophenyldiisopropylhydroxysilane;

pentafluorobenzyltrimethoxysilane, pentafluorobenzyltriethoxysilane, pentafluorobenzyltripropoxysilane, pentafluorobenzyltriisopropoxysilane, pentafluorobenzylethoxydimethoxysilane, pentafluorobenzyldiethoxymethoxysilane, pentafluorobenzylisopropoxydimethoxysilane, pentafluorobenzyldiisopropoxymethoxysilane, pentafluorobenzyltriacetoxysilane, pentafluorobenzyltri(propanoyloxy)silane, pentafluorobenzylhydroxydimethoxysilane, pentafluorobenzylhydroxydiethoxysilane, pentafluorobenzylhydroxydiisopropoxysilane, pentafluorobenzyldihydroxymethoxysilane, pentafluorobenzyltrihydroxysilane, pentafluorobenzyl(methyl)dimethoxysilane, pentafluorobenzyl(methyl)diethoxysilane, pentafluorobenzyl(ethyl)dimethoxysilane, pentafluorobenzyldimethylmethoxysilane, pentafluorobenzyldimethylethoxysilane, pentafluorobenzyldiethylmethoxysilane, pentafluorobenzyldiisopropylhydroxysilane;

2-(pentafluorophenyl)ethyltrimethoxysilane, 2-(pentafluorophenyl)ethyltriethoxysilane, 2-(pentafluorophenyl)ethyltripropoxysilane, 2-(pentafluorophenyl)ethyltriisopropoxysilane, 2-(pentafluorophenyl)ethylethoxydimethoxysilane, 2-(pentafluorophenyl)ethyldiethoxymethoxysilane, 2-(pentafluorophenyl)ethylisopropoxydimethoxysilane, 2-(pentafluorophenyl)ethyldiisopropoxymethoxysilane, 2-(pentafluorophenyl)ethyltriacetoxysilane, 2-(pentafluorophenyl)ethyltri(propanoyloxy)silane, 2-(pentafluorophenyl)ethylhydroxydimethoxysilane, 2-(pentafluorophenyl)ethylhydroxydiethoxysilane, 2-(pentafluorophenyl)ethylhydroxydiisopropoxysilane, 2-(pentafluorophenyl)ethyldihydroxymethoxysilane, 2-(pentafluorophenyl)ethyltrihydroxysilane, 2-(pentafluorophenyl)ethyl(methyl)dimethoxysilane, 2-(pentafluorophenyl)ethyl(methyl)diethoxysilane, 2-(pentafluorophenyl)ethyl(ethyl)dimethoxysilane, 2-(pentafluorophenyl)ethyldimethylmethoxysilane, 2-(pentafluorophenyl)ethyldimethylethoxysilane, 2-(pentafluorophenyl)ethyldiethylmethoxysilane, 2-(pentafluorophenyl)ethyldiisopropylhydroxysilane;

2-(pentafluorophenyl)propyltrimethoxysilane, 2-(pentafluorophenyl)propyltriethoxysilane, 2-(pentafluorophenyl)propyltripropoxysilane, 2-(pentafluorophenyl)propyltriisopropoxysilane, 2-(pentafluorophenyl)propylethoxydimethoxysilane, 2-(pentafluorophenyl)propyldiethoxymethoxysilane, 2-(pentafluorophenyl)propylisopropoxydimethoxysilane, 2-(pentafluorophenyl)propyldiisopropoxymethoxysilane, 2-(pentafluorophenyl)propyltriacetoxysilane, 2-(pentafluorophenyl)propyltri(propanoyloxy)silane, 2-(pentafluorophenyl)propylhydroxydimethoxysilane, 2-(pentafluorophenyl)propylhydroxydiethoxysilane, 2-(pentafluorophenyl)propylhydroxydiisopropoxysilane, 2-(pentafluorophenyl)propyldihydroxymethoxysilane, 2-(pentafluorophenyl)propyltrihydroxysilane, 2-(pentafluorophenyl)propyl(methyl)dimethoxysilane, 2-(pentafluorophenyl)propyl(methyl)diethoxysilane, 2-(pentafluorophenyl)propyl(ethyl)dimethoxysilane, 2-(pentafluorophenyl)propyldimethylmethoxysilane, 2-(pentafluorophenyl)propyldimethylethoxysilane, 2-(pentafluorophenyl)propyldiethylmethoxysilane, 2-(pentafluorophenyl)propyldiisopropylhydroxysilane;

3-(pentafluorophenyl)propyltrimethoxysilane, 3-(pentafluorophenyl)propyltriethoxysilane, 3-(pentafluorophenyl)propyltripropoxysilane, 3-(pentafluorophenyl)propyltriisopropoxysilane, 3-(pentafluorophenyl)propylethoxydimethoxysilane, 3-(pentafluorophenyl)propyldiethoxymethoxysilane, 3-(pentafluorophenyl)propylisopropoxydimethoxysilane, 3-(pentafluorophenyl)propyldiisopropoxymethoxysilane, 3-(pentafluorophenyl)propyltriacetoxysilane, 3-(pentafluorophenyl)propyltri(propanoyloxy)silane, 3-(pentafluorophenyl)propylhydroxydimethoxysilane, 3-(pentafluorophenyl)

propylhydroxydiethoxysilane, 3-(pentafluorophenyl)propylhydroxydiisopropoxysilane, 3-(pentafluorophenyl)propyldihydroxymethoxysilane, 3-(pentafluorophenyl)propyltrihydroxysilane, 3-(pentafluorophenyl)propyl(methyl)dimethoxysilane, 3-(pentafluorophenyl)propyl(methyl)diethoxysilane, 3-(pentafluorophenyl)propyl(ethyl)dimethoxysilane, 3-(pentafluorophenyl)propyldimethylmethoxysilane, 3-(pentafluorophenyl)propyldimethylethoxysilane, 3-(pentafluorophenyl)propyldiethylmethoxysilane, 3-(pentafluorophenyl)propyldiisopropylhydroxysilane;

2-methyl-3-(pentafluorophenyl)propyltrimethoxysilane, 2-methyl-3-(pentafluorophenyl)propyltriethoxysilane, 2-methyl-3-(pentafluorophenyl)propyltripropoxysilane, 2-methyl-3-(pentafluorophenyl)propyltriisopropoxysilane, 2-methyl-3-(pentafluorophenyl)propylethoxydimethoxysilane, 2-methyl-3-(pentafluorophenyl)propyldiethoxymethoxysilane, 2-methyl-3-(pentafluorophenyl)propylisopropoxydimethoxysilane, 2-methyl-3-(pentafluorophenyl)propyldiisopropoxymethoxysilane, 2-methyl-3-(pentafluorophenyl)propyltriacetoxysilane, 2-methyl-3-(pentafluorophenyl)propyltri(propanoyloxy)silane, 2-methyl-3-(pentafluorophenyl)propylhydroxydimethoxysilane, 2-methyl-3-(pentafluorophenyl)propylhydroxydiethoxysilane, 2-methyl-3-(pentafluorophenyl)propylhydroxydiisopropoxysilane, 2-methyl-3-(pentafluorophenyl)propyldihydroxymethoxysilane, 2-methyl-3-(pentafluorophenyl)propyltrihydroxysilane, 2-methyl-3-(pentafluorophenyl)propylmethyl)dimethoxysilane, 2-methyl-3-(pentafluorophenyl)propylmethyl)diethoxysilane, 2-methyl-3-(pentafluorophenyl)propyhethyl)dimethoxysilane, 2-methyl-3-(pentafluorophenyl)propyldimethylmethoxysilane, 2-methyl-3-(pentafluorophenyl)propyldimethylethoxysilane, 2-methyl-3-(pentafluorophenyl)propyldiethylmethoxysilane, 2-methyl-3-(pentafluorophenyl)propyldiisopropylhydroxysilane;

4-(pentafluorophenyl)butyltrimethoxysilane, 4-(pentafluorophenyl)butyltriethoxysilane, 4-(pentafluorophenyl)butyltripropoxysilane, 4-(pentafluorophenyl)butyltriisopropoxysilane, 4-(pentafluorophenyl)butylethoxydimethoxysilane, 4-(pentafluorophenyl)butyldiethoxymethoxysilane, 4-(pentafluorophenyl)butylisopropoxydimethoxysilane, 4-(pentafluorophenyl)butyldiisopropoxymethoxysilane, 4-(pentafluorophenyl)butyltriacetoxysilane, 4-(pentafluorophenyl)butyltri(propanoyloxy)silane, 4-(pentafluorophenyl)butylhydroxydimethoxysilane, 4-(pentafluorophenyl)butylhydroxydiethoxysilane, 4-(pentafluorophenyl)butylhydroxydiisopropoxysilane, 4-(pentafluorophenyl)butyldihydroxymethoxysilane, 4-(pentafluorophenyl)butyltrihydroxysilane, 4-(pentafluorophenyl)butyl(methyl)dimethoxysilane, 4-(pentafluorophenyl)butyl(methyl)diethoxysilane, 4-(pentafluorophenyl)butyl(ethyl)dimethoxysilane, 4-(pentafluorophenyl)butyldimethylmethoxysilane, 4-(pentafluorophenyl)butyldimethylethoxysilane, 4-(pentafluorophenyl)butyldiethylmethoxysilane, 4-(pentafluorophenyl)butyldiisopropylhydroxysilane;

5-(pentafluorophenyl)pentyltrimethoxysilane, 5-(pentafluorophenyl)pentyltriethoxysilane, 5-(pentafluorophenyl)pentyltripropoxysilane, 5-(pentafluorophenyl)pentyltriisopropoxysilane, 5-(pentafluorophenyl)pentylethoxydimethoxysilane, 5-(pentafluorophenyl)pentyldiethoxymethoxysilane, 5-(pentafluorophenyl)pentylisopropoxydimethoxysilane, 5-(pentafluorophenyl)pentyldiisopropoxymethoxysilane, 5-(pentafluorophenyl)pentyltriacetoxysilane, 5-(pentafluorophenyl)pentyltri(propanoyloxy)silane, 5-(pentafluorophenyl)pentylhydroxydimethoxysilane, 5-(pentafluorophenyl)pentylhydroxydiethoxysilane, 5-(pentafluorophenyl)pentylhydroxydiisopropoxysilane, 5-(pentafluorophenyl)pentyldihydroxymethoxysilane, 5-(pentafluorophenyl)pentyltrihydroxysilane, 5-(pentafluorophenyl)pentyl(methyl)dimethoxysilane, 5-(pentafluorophenyl)pentyl(methyl)diethoxysilane, 5-(pentafluorophenyl)pentyl(ethyl)dimethoxysilane, 5-(pentafluorophenyl)pentyldimethylmethoxysilane, 5-(pentafluorophenyl)pentyldimethylethoxysilane, 5-(pentafluorophenyl)pentyldiethylmethoxysilane, 5-(pentafluorophenyl)pentyldiisopropylhydroxysilane;

6-(pentafluorophenyl)hexyltrimethoxysilane, 6-(pentafluorophenyl)hexyltriethoxysilane, 6-(pentafluorophenyl)hexyltripropoxysilane, 6-(pentafluorophenyl)hexyltriisopropoxysilane, 6-(pentafluorophenyl)hexylethoxydimethoxysilane, 6-(pentafluorophenyl)hexyldiethoxymethoxysilane, 6-(pentafluorophenyl)hexylisopropoxydimethoxysilane, 6-(pentafluorophenyl)hexyldiisopropoxymethoxysilane, 6-(pentafluorophenyl)hexyltriacetoxysilane, 6-(pentafluorophenyl)hexyltri(propanoyloxy)silane, 6-(pentafluorophenyl)hexylhydroxydimethoxysilane, 6-(pentafluorophenyl)hexylhydroxydiethoxysilane, 6-(pentafluorophenyl)hexylhydroxydiisopropoxysilane, 6-(pentafluorophenyl)hexyldihydroxymethoxysilane, 6-(pentafluorophenyl)hexyltrihydroxysilane, 6-(pentafluorophenyl)hexyl(methyl)dimethoxysilane, 6-(pentafluorophenyl)hexyl(methyl)diethoxysilane, 6-(pentafluorophenyl)hexyl(ethyl)dimethoxysilane, 6-(pentafluorophenyl)hexyldimethylmethoxysilane, 6-(pentafluorophenyl)hexyldimethylethoxysilane, 6-(pentafluorophenyl)hexyldiethylmethoxysilane, 6-(pentafluorophenyl)hexyldiisopropylhydroxysilane;

7-(pentafluorophenyl)heptyltrimethoxysilane, 7-(pentafluorophenyl)heptyltriethoxysilane, 7-(pentafluorophenyl)heptyltripropoxysilane, 7-(pentafluorophenyl)heptyltriisopropoxysilane, 7-(pentafluorophenyl)heptylethoxydimethoxysilane, 7-(pentafluorophenyl)heptyldiethoxymethoxysilane, 7-(pentafluorophenyl)heptylisopropoxydimethoxysilane, 7-(pentafluorophenyl)heptyldiisopropoxymethoxysilane, 7-(pentafluorophenyl)heptyltriacetoxysilane, 7-(pentafluorophenyl)heptyltri(propanoyloxy)silane, 7-(pentafluorophenyl)heptylhydroxydimethoxysilane, 7-(pentafluorophenyl)heptylhydroxydiethoxysilane, 7-(pentafluorophenyl)heptylhydroxydiisopropoxysilane, 7-(pentafluorophenyl)heptyldihydroxymethoxysilane, 7-(pentafluorophenyl)heptyltrihydroxysilane, 7-(pentafluorophenyl)heptyl(methyl)dimethoxysilane, 7-(pentafluorophenyl)heptyl(methyl)diethoxysilane, 7-(pentafluorophenyl)heptyl(ethyl)dimethoxysilane, 7-(pentafluorophenyl)heptyldimethylmethoxysilane, 7-(pentafluorophenyl)heptyldimethylethoxysilane, 7-(pentafluorophenyl)heptyldiethylmethoxysilane, 7-(pentafluorophenyl)heptyldiisopropylhydroxysilane;

8-(pentafluorophenyl)octyltrimethoxysilane, 8-(pentafluorophenyl)octyltriethoxysilane, 8-(pentafluorophenyl)octyltripropoxysilane, 8-(pentafluorophenyl)octyltriisopropoxysilane, 8-(pentafluorophenyl)octylethoxydimethoxysilane, 8-(pentafluorophenyl)octyldiethoxymethoxysilane, 8-(pentafluorophenyl)octylisopropoxydimethoxysilane, 8-(pentafluorophenyl)octyldiisopropoxymethoxysilane, 8-(pentafluorophenyl)octyltriacetoxysilane, 8-(pentafluorophenyl)octyltri (propanoyloxy)silane, 8-(pentafluorophenyl)octylhydroxydimethoxysilane, 8-(pentafluorophenyl)octylhydroxydiethoxysilane, 8-(pentafluorophenyl)octylhydroxydiisopropoxysilane, 8-(pentafluorophenyl)octyldihydroxymethoxysilane, 8-(pentafluorophenyl)octyltrihydroxysilane, 8-(pentafluorophenyl)octyl(methyl)dimethoxysilane, 8-(pentafluorophenyl)octyl(methyl)diethoxysilane, 8-(pentafluorophenyl)octyl(ethyl)dimethoxysilane, 8-(pentafluorophenyl)octyldimethylmethoxysilane, 8-(pentafluorophenyl)octyldimethylethoxysilane, 8-(pentafluorophenyl)octyldiethylmethoxysilane, 8-(pentafluorophenyl)octyldiisopropylhydroxysilane;

9-(pentafluorophenyl)nonyltrimethoxysilane, 9-(pentafluorophenyl)nonyltriethoxysilane, 9-(pentafluorophenyl)nonyltripropoxysilane, 9-(pentafluorophenyl)nonyltriisopropoxysilane, 9-(pentafluorophenyl)nonylethoxydimethoxysilane, 9-(pentafluorophenyl)nonyldiethoxymethoxysilane, 9-(pentafluorophenyl)nonylisopropoxydimethoxysilane, 9-(pentafluorophenyl)nonyldiisopropoxymethoxysilane, 9-(pentafluorophenyl)nonyltriacetoxysilane, 9-(pentafluorophenyl)nonyltri(propanoyloxy)silane, 9-(pentafluorophenyl)nonylhydroxydimethoxysilane, 9-(pentafluorophenyl)nonylhydroxydiethoxysilane, 9-(pentafluorophenyl)nonylhydroxydiisopropoxysilane, 9-(pentafluorophenyl)nonyldihydroxymethoxysilane, 9-(pentafluorophenyl)nonyltrihydroxysilane, 9-(pentafluorophenyl)nonyl(methyl)dimethoxysilane, 9-(pentafluorophenyl)nonyl(methyl)diethoxysilane, 9-(pentafluorophenyl)nonyl(ethyl)dimethoxysilane, 9-(pentafluorophenyl)nonyldimethylmethoxysilane, 9-pentafluorophenyl)nonyldimethylethoxysilane, 9-(pentafluorophenyl)nonyldiethylmethoxysilane, 9-(pentafluorophenyl)nonyldiisopropylhydroxysilane;

10-(pentafluorophenyl)decyltrimethoxysilane, 10-(pentafluorophenyl)decyltriethoxysilane, 10-(pentafluorophenyl)decyltripropoxysilane, 10-(pentafluorophenyl)decyltriisopropoxysilane, 10-(pentafluorophenyl)decylethoxydimethoxysilane, 10-(pentafluorophenyl)decyldiethoxymethoxysilane, 10-(pentafluorophenyl)decylisopropoxydimethoxysilane, 10-(pentafluorophenyl)decyldiisopropoxymethoxysilane, 10-(pentafluorophenyl)decyltriacetoxysilane, 10-(pentafluorophenyl)decyltri(propanoyloxy)silane, 10-(pentafluorophenyl)decylhydroxydimethoxysilane, 10-(pentafluorophenyl)decylhydroxydiethoxysilane, 10-(pentafluorophenyl)decylhydroxydiisopropoxysilane, 10-(pentafluorophenyl)decyldihydroxymethoxysilane, 10-(pentafluorophenyl)decyltrihydroxysilane, 10-(pentafluorophenyl)decyl(methyl)dimethoxysilane, 10-(pentafluorophenyl)decyl(methyl)diethoxysilane, 10-(pentafluorophenyl)decyl(ethyl)dimethoxysilane, 10-(pentafluorophenyl)decyldimethylmethoxysilane, 10-(pentafluorophenyl)decyldimethylethoxysilane, 10-(pentafluorophenyl)decyldiethylmethoxysilane, 10-(pentafluorophenyl)decyldiisopropylhydroxysilane;

4-(pentafluorophenyl)cyclohexyltrimethoxysilane, 4-(pentafluorophenyl)cyclohexyltriethoxysilane, 4-(pentafluorophenyl)cyclohexyltripropoxysilane, 4-(pentafluorophenyl)cyclohexyltriisopropoxysilane, 4-(pentafluorophenyl)cyclohexylethoxydimethoxysilane, 4-(pentafluorophenyl)cyclohexyldiethoxymethoxysilane, 4-(pentafluorophenyl)cyclohexylisopropoxydimethoxysilane, 4-(pentafluorophenyl)cyclohexyldiisopropoxymethoxysilane, 4-(pentafluorophenyl)cyclohexyltriacetoxysilane, 4-(pentafluorophenyl)cyclohexyltri(propanoyloxy)silane, 4-(pentafluorophenyl)cyclohexylhydroxydimethoxysilane, 4-(pentafluorophenyl)cyclohexylhydroxydiethoxysilane, 4-(pentafluorophenyl)cyclohexylhydroxydiisopropoxysilane, 4-(pentafluorophenyl)cyclohexyldihydroxymethoxysilane, 4-(pentafluorophenyl)cyclohexyltrihydroxysilane, 4-(pentafluorophenyl)cyclohexyl(methyl)dimethoxysilane, 4-(pentafluorophenyl)cyclohexyl(methyl)diethoxysilane, 4-(pentafluorophenyl)cyclohexyl(ethyl)dimethoxysilane, 4-(pentafluorophenyl)cyclohexyldimethylmethoxysilane, 4-(pentafluorophenyl)cyclohexyldimethylethoxysilane, 4-(pentafluorophenyl)cyclohexyldiethylmethoxysilane, 4-(pentafluorophenyl)cyclohexyldiisopropylhydroxysilane;

3-(pentafluorophenyl)cyclohexyltrimethoxysilane, 3-(pentafluorophenyl)cyclohexyltriethoxysilane, 3-(pentafluorophenyl)cyclohexyltripropoxysilane, 4-(pentafluorophenyl)cyclohexyltriisopropoxysilane, 3-(pentafluorophenyl)cyclohexylethoxydimethoxysilane, 3-(pentafluorophenyl)cyclohexyldiethoxymethoxysilane, 3-(pentafluorophenyl)cyclohexylisopropoxydimethoxysilane, 3-(pentafluorophenyl)cyclohexyldiisopropoxymethoxysilane, 3-(pentafluorophenyl)cyclohexyltriacetoxysilane, 3-(pentafluorophenyl)cyclohexyltri(propanoyloxy)silane, 3-(pentafluorophenyl)cyclohexylhydroxydimethoxysilane, 3-(pentafluorophenyl)cyclohexylhydroxydiethoxysilane, 3-(pentafluorophenyl)cyclohexylhydroxydiisopropoxysilane, 3-(pentafluorophenyl)cyclohexyldihydroxymethoxysilane, 3-(pentafluorophenyl)cyclohexyltrihydroxysilane, 3-(pentafluorophenyl)cyclohexyl(methyl)dimethoxysilane, 3-(pentafluorophenyl)cyclohexyl(methyl)diethoxysilane, 3-(pentafluorophenyl)cyclohexyethyl)dimethoxysilane, 3-(pentafluorophenyl)cyclohexyldimethylmethoxysilane, 3-(pentafluorophenyl)cyclohexyldimethylethoxysilane, 3-(pentafluorophenyl)cyclohexyldiethylmethoxysilane, 3-(pentafluorophenyl)cyclohexyldiisopropylhydroxysilane;

4-(pentafluorophenyl)phenyltrimethoxysilane, 4-(pentafluorophenyl)phenyltriethoxysilane, 4-(pentafluorophenyl)phenyltripropoxysilane, 4-(pentafluorophenyl)phenyltriisopropoxysilane, 4-(pentafluorophenyl)phenylethoxydimethoxysilane, 4-(pentafluorophenyl)phenyldiethoxymethoxysilane, 4-(pentafluorophenyl)phenylisopropoxydimethoxysilane, 4-(pentafluorophenyl)phenyldiisopropoxymethoxysilane, 4-(pentafluorophenyl)phenyltriacetoxysilane, 4-(pentafluorophenyl)phenyltri(propanoyloxy)silane, 4-(pentafluorophenyl)phenylhydroxydimethoxysilane, 4-(pentafluorophenyl)phenylhydroxydiethoxysilane, 4-(pentafluorophenyl)phenylhydroxydiisopropoxysilane, 4-(pentafluorophenyl)phenyldihydroxymethoxysilane, 4-(pentafluorophenyl)phenyltrihydroxysilane, 4-(pentafluorophenyl)phenyl(methyl)dimethoxysilane, 4-(pentafluorophenyl)phenyl(methyl)diethoxysilane, 4-(pentafluorophenyl)phenyl(ethyl)dimethoxysilane, 4-(pentafluorophenyl)phenyldimethylmethoxysilane, 4-(pentafluorophenyl)phenyldimethylethoxysilane, 4-(pentafluorophenyl)phenyldiethylmethoxysilane, 4-(pentafluorophenyl)phenyldiisopropylhydroxysilane;

3-(pentafluorophenyl)phenyltrimethoxysilane, 3-(pentafluorophenyl)phenyltriethoxysilane, 3-(pentafluorophenyl)phenyltripropoxysilane, 3-(pentafluorophenyl)phenyltriisopropoxysilane, 3-(pentafluorophenyl)phenylethoxydimethoxysilane, 3-(pentafluorophenyl)phenyldiethoxymethoxysilane, 3-(pentafluorophenyl)phenylisopropoxydimethoxysilane, 3-(pentafluorophenyl)phenyldiisopropoxymethoxysilane, 3-(pentafluorophenyl)phenyltriacetoxysilane, 3-(pentafluorophenyl)phenyltri(propanoyloxy)silane, 3-(pentafluorophenyl)phenylhydroxydimethoxysilane, 3-(pentafluorophenyl)

phenylhydroxydiethoxysilane, 3-(pentafluorophenyl)phenylhydroxydiisopropoxysilane, 3-(pentafluorophenyl)phenyldihydroxymethoxysilane, 3-(pentafluorophenyl)phenyltrihydroxysilane, 3-(pentafluorophenyl)phenyl(methyl)dimethoxysilane, 3-(pentafluorophenyl)phenyl(methyl)diethoxysilane, 3-(pentafluorophenyl)phenyl(ethyl)dimethoxysilane, 3-(pentafluorophenyl)phenyldimethylmethoxysilane, 3-(pentafluorophenyl)phenyldimethylethoxysilane, 3-(pentafluorophenyl)phenyldiethylmethoxysilane, 3-(pentafluorophenyl)phenyldiisopropylhydroxysilane;

(pentafluorophenyloxymethyl)trimethoxysilane, (pentafluorophenyloxymethyl)triethoxysilane, (pentafluorophenyloxymethyl)tripropoxysilane, (pentafluorophenyloxymethyl)triisopropoxysilane, (pentafluorophenyloxymethyl)ethoxydimethoxysilane, (pentafluorophenyloxymethyl)diethoxymethoxysilane, (pentafluorophenyloxymethyl)isopropoxydimethoxysilane, (pentafluorophenyloxymethyl)diisopropoxymethoxysilane, (pentafluorophenyloxymethyl)triacetoxysilane, (pentafluorophenyloxymethyl)tri(propanoyloxy)silane, (pentafluorophenyloxymethyl)hydroxydimethoxysilane, (pentafluorophenyloxymethyl)hydroxydiethoxysilane, (pentafluorophenyloxymethyl)hydroxydiisopropoxysilane, (pentafluorophenyloxymethyl)hydroxymethoxysilane, (pentafluorophenyloxymethyl)trihydroxysilane, (pentafluorophenyloxymethyl)(methyl)dimethoxysilane, (pentafluorophenyloxymethyl)(methyl)diethoxysilane, (pentafluorophenyloxymethyl)(ethyl)dimethoxysilane, (pentafluorophenyloxymethyl)dimethylmethoxysilane, (pentafluorophenyloxymethyl)dimethylethoxysilane, (pentafluorophenyloxymethyl)diethylmethoxysilane, (pentafluorophenyloxymethyl)diisopropylhydroxysilane;

3-(pentafluorophenyloxy)propyltrimethoxysilane, 3-(pentafluorophenyloxy)propyltriethoxysilane, 3-(pentafluorophenyloxy)propyltripropoxysilane, 3-(pentafluorophenyloxy)propyltriisopropoxysilane, 3-(pentafluorophenyloxy)propylethoxydimethoxysilane, 3-(pentafluorophenyloxy)propyldiethoxymethoxysilane, 3-(pentafluorophenyloxy)propylisopropoxydimethoxysilane, 3-(pentafluorophenyloxy)propyldiisopropoxymethoxysilane, 3-(pentafluorophenyloxy)propyltriacetoxysilane, 3-(pentafluorophenyloxy)propyltri(propanoyloxy)silane, 3-(pentafluorophenyloxy)propylhydroxydimethoxysilane, 3-(pentafluorophenyloxy)propylhydroxydiethoxysilane, 3-(pentafluorophenyloxy)propylhydroxydiisopropoxysilane, 3-(pentafluorophenyloxy)propyldihydroxymethoxysilane, 3-(pentafluorophenyloxy)propyltrihydroxysilane, 3-(pentafluorophenyloxy)propyl(methyl)dimethoxysilane, 3-(pentafluorophenyloxy)propyl(methyl)diethoxysilane, 3-(pentafluorophenyloxy)propyl(ethyl)dimethoxysilane, 3-(pentafluorophenyloxy)propyldimethylmethoxysilane, 3-(pentafluorophenyloxy)propyldimethylethoxysilane, 3-(pentafluorophenyloxy)propyldiethylmethoxysilane, 3-(pentafluorophenyloxy)propyldiisopropylhydroxysilane;

4-(pentafluorophenyloxy)butyltrimethoxysilane, 4-(pentafluorophenyloxy)butyltriethoxysilane, 4-(pentafluorophenyloxy)butyltripropoxysilane, 4-(pentafluorophenyloxy)butyltriisopropoxysilane, 4-(pentafluorophenyloxy)butylethoxydimethoxysilane, 4-(pentafluorophenyloxy)butyldiethoxymethoxysilane, 4-(pentafluorophenyloxy)butylisopropoxydimethoxysilane, 4-(pentafluorophenyloxy)butyldiisopropoxymethoxysilane, 4-(pentafluorophenyloxy)butyltriacetoxysilane, 4-(pentafluorophenyloxy)butyltri(propanoyloxy)silane, 4-(pentafluorophenyloxy)butylhydroxydimethoxysilane, 4-(pentafluorophenyloxy)butylhydroxydiethoxysilane, 4-(pentafluorophenyloxy)butylhydroxydiisopropoxysilane, 4-(pentafluorophenyloxy)butyldihydroxymethoxysilane, 4-(pentafluorophenyloxy)butyltrihydroxysilane, 4-(pentafluorophenyloxy)butyl(methyl)dimethoxysilane, 4-(pentafluorophenyloxy)butyl(methyl)diethoxysilane, 4-(pentafluorophenyloxy)butyl(ethyl)dimethoxysilane, 4-(pentafluorophenyloxy)butyldimethylmethoxysilane, 4-(pentafluorophenyloxy)butyldimethylethoxysilane, 4-(pentafluorophenyloxy)butyldiethylmethoxysilane, 4-(pentafluorophenyloxy)butyldiisopropylhydroxysilane;

(pentafluorophenylaminomethyl)trimethoxysilane, (pentafluorophenylaminomethyl)triethoxysilane, (pentafluorophenylaminomethyl)tripropoxysilane, (pentafluorophenylaminomethyl)triisopropoxysilane, (pentafluorophenylaminomethyl)ethoxydimethoxysilane, (pentafluorophenylaminomethyl)diethoxymethoxysilane, (pentafluorophenylaminomethyl)isopropoxydimethoxysilane, (pentafluorophenylaminomethyl)diisopropoxymethoxysilane, (pentafluorophenylaminomethyl)triacetoxysilane, (pentafluorophenylaminomethyl)tri(propanoyloxy)silane, (pentafluorophenylaminomethyl)hydroxydimethoxysilane, (pentafluorophenylaminomethyl)hydroxydiethoxysilane, (pentafluorophenylaminomethyl)hydroxydiisopropoxysilane, (pentafluorophenylaminomethyl)hydroxymethoxysilane, (pentafluorophenylaminomethyl)trihydroxysilane, (pentafluorophenylaminomethyl)(methyl)dimethoxysilane, (pentafluorophenylaminomethyl)(methyl)diethoxysilane, (pentafluorophenylaminomethyl)(ethyl)dimethoxysilane, (pentafluorophenylaminomethyl)dimethylmethoxysilane, (pentafluorophenylaminomethyl)dimethylethoxysilane, (pentafluorophenylaminomethyl)diethylmethoxysilane, (pentafluorophenylaminomethyl)diisopropylhydroxysilane;

3-(pentafluorophenylamino)propyltrimethoxysilane, 3-(pentafluorophenylamino)propyltriethoxysilane, 3-(pentafluorophenylamino)propyltripropoxysilane, 3-(pentafluorophenylamino)propyltriisopropoxysilane, 3-(pentafluorophenylamino)propylethoxydimethoxysilane, 3-(pentafluorophenylamino)propyldiethoxymethoxysilane, 3-(pentafluorophenylamino)propylisopropoxydimethoxysilane, 3-(pentafluorophenylamino)propyldiisopropoxymethoxysilane, 3-(pentafluorophenylamino)propyltriacetoxysilane, 3-(pentafluorophenylamino)propyltri(propanoyloxy)silane, 3-(pentafluorophenylamino)propylhydroxydimethoxysilane, 3-(pentafluorophenylamino)propylhydroxydiethoxysilane, 3-(pentafluorophenylamino)propylhydroxydiisopropoxysilane, 3-(pentafluorophenylamino)propyldihydroxymethoxysilane, 3-(pentafluorophenylamino)propyltrihydroxysilane, 3-(pentafluorophenylamino)propyl(methyl)dimethoxysilane, 3-(pentafluorophenylamino)propyl(methyl)diethoxysilane, 3-(pentafluorophenylamino)propyl(ethyl)dimethoxysilane, 3-(pentafluorophenylamino)propyldimethylmethoxysilane, 3-(pentafluorophenylamino)propyldimethylethoxysilane, 3-(pentafluorophenylamino)propyldiethylmethoxysilane, 3-(pentafluorophenylamino)propyldiisopropylhydroxysilane;

4-(pentafluorophenylamino)butyltrimethoxysilane, 4-(pentafluorophenylamino)butyltriethoxysilane, 4-(pentafluorophenylamino)butyltripropoxysilane, 4-(pentafluorophenylamino)butyltriisopropoxysilane, 4-(pentafluorophenylamino)butylethoxydimethoxysilane, 4-(pentafluorophenylamino)butyldiethoxymethoxysilane, 4-(pentafluorophenylamino)butylisopropoxydimethoxysilane, 4-(pentafluorophenylamino)butyldiisopropoxymethoxysilane, 4-(pentafluorophenylamino)butyltriacetoxysilane, 4-(pentafluorophenylamino)butyltri(propanoyloxy)silane, 4-(pentafluorophenylamino)

butylhydroxydimethoxysilane, 4-(pentafluorophenylamino)butylhydroxydiethoxysilane, 4-(pentafluorophenylamino)butylhydroxydiisopropoxysilane, 4-(pentafluorophenylamino)butyldihydroxymethoxysilane, 4-(pentafluorophenylamino)butyltrihydroxysilane, 4-(pentafluorophenylamino)butyl(methyl)dimethoxysilane, 4-(pentafluorophenylamino)butyl(methyl)diethoxysilane, 4-(pentafluorophenylamino)butyl(ethyl)dimethoxysilane, 4-(pentafluorophenylamino)butyldimethylmethoxysilane, 4-(pentafluorophenylamino)butyldimethylethoxysilane, 4-(pentafluorophenylamino)butyldiethylmethoxysilane, 4-(pentafluorophenylamino)butyldiisopropylhydroxysilane;

(pentafluorobenzoyloxymethyl)trimethoxysilane, (pentafluorobenzoyloxymethyl)triethoxysilane, (pentafluorobenzoyloxymethyl)tripropoxysilane, (pentafluorobenzoyloxymethyl)triisopropoxysilane, (pentafluorobenzoyloxymethyl)ethoxydimethoxysilane, (pentafluorobenzoyloxymethyl)diethoxymethoxysilane, (pentafluorobenzoyloxymethyl)isopropoxydimethoxysilane, (pentafluorobenzoyloxymethyl)diisopropoxymethoxysilane, (pentafluorobenzoyloxymethyl)triacetoxysilane, (pentafluorobenzoyloxymethyl)tri(propanoyloxy)silane, (pentafluorobenzoyloxymethyl)hydroxydimethoxysilane, (pentafluorobenzoyloxymethyl)hydroxydiethoxysilane, (pentafluorobenzoyloxymethyl)hydroxydiisopropoxysilane, (pentafluorobenzoyloxymethyl)hydroxymethoxysilane, (pentafluorobenzoyloxymethyl)trihydroxysilane, (pentafluorobenzoyloxymethyl)(methyl)dimethoxysilane, (pentafluorobenzoyloxymethyl)(methyl)diethoxysilane, (pentafluorobenzoyloxymethyl)(ethyl)dimethoxysilane, (pentafluorobenzoyloxymethyl)dimethylmethoxysilane, (pentafluorobenzoyloxymethyl)dimethylethoxysilane, (pentafluorobenzoyloxymethyl)diethylmethoxysilane, (pentafluorobenzoyloxymethyl)diisopropylhydroxysilane;

3-(pentafluorobenzoyloxy)propyltrimethoxysilane, 3-(pentafluorobenzoyloxy)propyltriethoxysilane, 3-(pentafluorobenzoyloxy)propyltripropoxysilane, 3-(pentafluorobenzoyloxy)propyltriisopropoxysilane, 3-(pentafluorobenzoyloxy)propylethoxydimethoxysilane, 3-(pentafluorobenzoyloxy)propyldiethoxymethoxysilane, 3-(pentafluorobenzoyloxy)propylisopropoxydimethoxysilane, 3-(pentafluorobenzoyloxy)propyldiisopropoxymethoxysilane, 3-(pentafluorobenzoyloxy)propyltriacetoxysilane, 3-(pentafluorobenzoyloxy)propyltri(propanoyloxy)silane, 3-(pentafluorobenzoyloxy)propylhydroxydimethoxysilane, 3-(pentafluorobenzoyloxy)propylhydroxydiethoxysilane, 3-(pentafluorobenzoyloxy)propylhydroxydiisopropoxysilane, 3-(pentafluorobenzoyloxy)propyldihydroxymethoxysilane, 3-(pentafluorobenzoyloxy)propyltrihydroxysilane, 3-(pentafluorobenzoyloxy)propyl(methyl)dimethoxysilane, 3-(pentafluorobenzoyloxy)propyl(methyl)diethoxysilane, 3-(pentafluorobenzoyloxy)propyl(ethyl)dimethoxysilane, 3-(pentafluorobenzoyloxy)propyldimethylmethoxysilane, 3-(pentafluorobenzoyloxy)propyldimethylethoxysilane, 3-(pentafluorobenzoyloxy)propyldiethylmethoxysilane, 3-(pentafluorobenzoyloxy)propyldiisopropylhydroxysilane;

4-(pentafluorobenzoyloxy)butyltrimethoxysilane, 4-(pentafluorobenzoyloxy)butyltriethoxysilane, 4-(pentafluorobenzoyloxy)butyltripropoxysilane, 4-(pentafluorobenzoyloxy)butyltriisopropoxysilane, 4-(pentafluorobenzoyloxy)butylethoxydimethoxysilane, 4-(pentafluorobenzoyloxy)butyldiethoxymethoxysilane, 4-(pentafluorobenzoyloxy)butylisopropoxydimethoxysilane, 4-(pentafluorobenzoyloxy)butyldiisopropoxymethoxysilane, 4-(pentafluorobenzoyloxy)butyltriacetoxysilane, 4(pentafluorobenzoyloxy)butyltri(propanoyloxy)silane, 4-(pentafluorobenzoyloxy)butylhydroxydimethoxysilane, 4-(pentafluorobenzoyloxy)butylhydroxydiethoxysilane, 4-(pentafluorobenzoyloxy)butylhydroxydiisopropoxysilane, 4-(pentafluorobenzoyloxy)butyldihydroxymethoxysilane, 4-(pentafluorobenzoyloxy)butyltrihydroxysilane, 4-(pentafluorobenzoyloxy)butyl(methyl)dimethoxysilane, 4-(pentafluorobenzoyloxy)butyl(methyl)diethoxysilane, 4-(pentafluorobenzoyloxy)butyl(ethyl)dimethoxysilane, 4-(pentafluorobenzoyloxy)butyldimethylmethoxysilane, 4-(pentafluorobenzoyloxy)butyldimethylethoxysilane, 4-(pentafluorobenzoyloxy)butyldiethylmethoxysilane, 4-(pentafluorobenzoyloxy)butyldiisopropylhydroxysilane;

(pentafluorobenzoylaminomethyl)trimethoxysilane, (pentafluorobenzoylaminomethyl)triethoxysilane, (pentafluorobenzoylaminomethyl)tripropoxysilane, (pentafluorobenzoylaminomethyl)triisopropoxysilane, (pentafluorobenzoylaminomethyl)ethoxydimethoxysilane, (pentafluorobenzoylaminomethyl)diethoxymethoxysilane, (pentafluorobenzoylaminomethyl)isopropoxydimethoxysilane, (pentafluorobenzoylaminomethyl)diisopropoxymethoxysilane, (pentafluorobenzoylaminomethyl)triacetoxysilane, (pentafluorobenzoylaminomethyl)tri(propanoyloxy)silane, (pentafluorobenzoylaminomethyl)hydroxydimethoxysilane, (pentafluorobenzoylaminomethyl)hydroxydiethoxysilane, (pentafluorobenzoylaminomethyl)hydroxydiisopropoxysilane, (pentafluorobenzoylaminomethyl)hydroxymethoxysilane, (pentafluorobenzoylaminomethyl)trihydroxysilane, (pentafluorobenzoylaminomethyl)(methyl)dimethoxysilane, (pentafluorobenzoylaminomethyl)(methyl)diethoxysilane, (pentafluorobenzoylaminomethyl)(ethyl)dimethoxysilane, (pentafluorobenzoylaminomethyl)dimethylmethoxysilane, (pentafluorobenzoylaminomethyl)dimethylethoxysilane, (pentafluorobenzoylaminomethyl)diethylmethoxysilane, (pentafluorobenzoylaminomethyl)diisopropylhydroxysilane;

3-(pentafluorobenzoylamino)propyltrimethoxysilane, 3-(pentafluorobenzoylamino)propyltriethoxysilane, 3-(pentafluorobenzoylamino)propyltripropoxysilane, 3-(pentafluorobenzoylamino)propyltriisopropoxysilane, 3-(pentafluorobenzoylamino)propylethoxydimethoxysilane, 3-(pentafluorobenzoylamino)propyldiethoxymethoxysilane, 3-(pentafluorobenzoylamino)propylisopropoxydimethoxysilane, 3-(pentafluorobenzoylamino)propyldiisopropoxymethoxysilane, 3-(pentafluorobenzoylamino)propyltriacetoxysilane, 3-(pentafluorobenzoylamino)propyltri(propanoyloxy)silane, 3-(pentafluorobenzoylamino)propylhydroxydimethoxysilane, 3-(pentafluorobenzoylamino)propylhydroxydiethoxysilane, 3-(pentafluorobenzoylamino)propylhydroxydiisopropoxysilane, 3-(pentafluorobenzoylamino)propyldihydroxymethoxysilane, 3-(pentafluorobenzoylamino)propyltrihydroxysilane, 3-(pentafluorobenzoylamino)propylmethyl)dimethoxysilane, 3-(pentafluorobenzoylamino)propylmethyl)diethoxysilane, 3-(pentafluorobenzoylamino)propyl(ethyl)dimethoxysilane, 3-(pentafluorobenzoylamino)propyldimethylmethoxysilane, 3-(pentafluorobenzoylamino)propyldimethylethoxysilane, 3-(pentafluorobenzoylamino)propyldiethylmethoxysilane, 3-(pentafluorobenzoylamino)propyldiisopropylhydroxysilane;

4-(pentafluorobenzoylamino)butyltrimethoxysilane, 4-(pentafluorobenzoylamino)butyltriethoxysilane, 4-(pentafluorobenzoylamino)butyltripropoxysilane, 4-(pentafluorobenzoylamino)butyltriisoprop oxysilane, 4-(pentafluorobenzoylamino)butylethoxydimethoxysilane, 4-(pentafluorobenzoylamino)butyldiethoxymethoxysilane, 4-(pentafluorobenzoylamino)butylisopropoxydimethoxysilane, 4-(pentafluorobenzoylamino)butyldiisopropoxymethoxysilane, 4-(pentafluorobenzoylamino)butyltriacetoxysilane, 4-(pentafluorobenzoylamino)butyltri(propanoyloxy)silane, 4-(pentafluorobenzoylamino)butylhydroxydimethoxysilane, 4-(pentafluorobenzoylamino)butylhydroxydiethoxysilane, 4-(pentafluorobenzoylamino)butylhydroxydiisopropoxysilane, 4-(pentafluorobenzoylamino)butyldihydroxymethoxysilane, 4-(pentafluorobenzoylamino)butyltrihydroxysilane, 4-(pentafluorobenzoylamino)butyl(methyl)dimethoxysilane, 4-(pentafluorobenzoylamino)butyl(methyl)diethoxysilane, 4-(pentafluorobenzoylamino)butyl(ethyl)dimethoxysilane, 4-(pentafluorobenzoylamino)butyldimethylmethoxysilane, 4-(pentafluorobenzoylamino)butyldimethylethoxysilane, 4-(pentafluorobenzoylamino)butyldiethylmethoxysilane, 4-(pentafluorobenzoylamino)butyldiisopropylhydroxysilane;

(pentafluorophenyloxycarbonylaminomethyl)trimethoxysilane, (pentafluorophenyloxycarbonylaminomethyl)triethoxysilane, (pentafluorophenyloxycarbonylaminomethyl)tripropoxysilane, (pentafluorophenyloxycarbonylaminomethyl)triisopropoxysilane, (pentafluorophenyloxycarbonylaminomethyl)ethoxydimethoxysilane, (pentafluorophenyloxycarbonylaminomethyl)diethoxymethoxysilane, (pentafluorophenyloxycarbonylaminomethyl)isopropoxydimethoxysilane, (pentafluorophenyloxycarbonylaminomethyl)diisopropoxymethoxysilane, (pentafluorophenyloxycarbonylaminomethyl)triacetoxysilane, (pentafluorophenyloxycarbonylaminomethyl)tri(propanoyloxy)silane, (pentafluorophenyloxycarbonylaminomethyl)hydroxydimethoxysilane, (pentafluorophenyloxycarbonylaminomethyl)hydroxydiethoxysilane, (pentafluorophenyloxycarbonylaminomethyl)hydroxydiisopropoxysilane, (pentafluorophenyloxycarbonylaminomethyl)hydroxymethoxysilane, (pentafluorophenyloxycarbonylaminomethyl)trihydroxysilane, (pentafluorophenyloxycarbonylaminomethyl)(methyl)dimethoxysilane, (pentafluorophenyloxycarbonylaminomethyl)(methyl)diethoxysilane, (pentafluorophenyloxycarbonylaminomethyl)(ethyl)dimethoxysilane, (pentafluorophenyloxycarbonylaminomethyl)dimethylmethoxysilane, (pentafluorophenyloxycarbonylaminomethyl)dimethylethoxysilane, (pentafluorophenyloxycarbonylaminomethyl)diethylmethoxysilane, (pentafluorophenyloxycarbonylaminomethyl)diisopropylhydroxysilane;

3-(pentafluorophenyloxycarbonylamino)propyltrimethoxysilane, 3-(pentafluorophenyloxycarbonylamino)propyltriethoxysilane, 3-(pentafluorophenyloxycarbonylamino)propyltripropoxysilane, 3-(pentafluorophenyloxycarbonylamino)propyltriisopropoxysilane, 3-(pentafluorophenyloxycarbonylamino)propylethoxydimethoxysilane, 3-(pentafluorophenyloxycarbonylamino)propyldiethoxymethoxysilane, 3-(pentafluorophenyloxycarbonylamino)propylisopropoxydimethoxysilane, 3-(pentafluorophenyloxycarbonylamino)propyldiisopropoxymethoxysilane, 3-(pentafluorophenyloxycarbonylamino)propyltriacetoxysilane, 3-(pentafluorophenyloxycarbonylamino)propyltri(propanoyloxy)silane, 3-(pentafluorophenyloxycarbonylamino)propylhydroxydimethoxysilane, 3-(pentafluorophenyloxycarbonylamino)propylhydroxydiethoxysilane, 3-(pentafluorophenyloxycarbonylamino)propylhydroxydiisopropoxysilane, 3-(pentafluorophenyloxycarbonylamino)propyldihydroxymethoxysilane, 3-(pentafluorophenyloxycarbonylamino)propyltrihydroxysilane, 3-(pentafluorophenyloxycarbonylamino)propyl(methyl)dimethoxysilane, 3-(pentafluorophenyloxycarbonylamino)propyl(methyl)diethoxysilane, 3-(pentafluorophenyloxycarbonylamino)propyl(ethyl)dimethoxysilane, 3-(pentafluorophenyloxycarbonylamino)propyldimethylmethoxysilane, 3-(pentafluorophenyloxycarbonylamino)propyldimethylethoxysilane, 3-(pentafluorophenyloxycarbonylamino)propyldiethylmethoxysilane, 3-(pentafluorophenyloxycarbonylamino)propyldiisopropylhydroxysilane;

4-(pentafluorophenyloxycarbonylamino)butyltrimethoxysilane, 4-(pentafluorophenyloxycarbonylamino)butyltriethoxysilane, 4-(pentafluorophenyloxycarbonylamino)butyltripropoxysilane, 4-(pentafluorophenyloxycarbonylamino)butyltriisopropoxysilane, 4-(pentafluorophenyloxycarbonylamino)butylethoxydimethoxysilane, 4-(pentafluorophenyloxycarbonylamino)butyldiethoxymethoxysilane, 4-(pentafluorophenyloxycarbonylamino)butylisopropoxydimethoxysilane, 4-(pentafluorophenyloxycarbonylamino)butyldiisopropoxymethoxysilane, 4-(pentafluorophenyloxycarbonylamino)butyltriacetoxysilane, 4-(pentafluorophenyloxycarbonylamino)butyltri(propanoyloxy)silane, 4-(pentafluorophenyloxycarbonylamino)butylhydroxydimethoxysilane, 4-(pentafluorophenyloxycarbonylamino)butylhydroxydiethoxysilane, 4-(pentafluorophenyloxycarbonylamino)butylhydroxydiisopropoxysilane, 4-(pentafluorophenyloxycarbonylamino)butyldihydroxymethoxysilane, 4-(pentafluorophenyloxycarbonylamino)butyltrihydroxysilane, 4-(pentafluorophenyloxycarbonylamino)butyl(methyl)dimethoxysilane, 4-(pentafluorophenyloxycarbonylamino)butyl(methyl)diethoxysilane, 4-(pentafluorophenyloxycarbonylamino)butyl(ethyl)dimethoxysilane, 4-(pentafluorophenyloxycarbonylamino)butyldimethylmethoxysilane, 4-(pentafluorophenyloxycarbonylamino)butyldimethylethoxysilane, 4-(pentafluorophenyloxycarbonylamino)butyldiethylmethoxysilane, 4-(pentafluorophenyloxycarbonylamino)butyldiisopropylhydroxysilane;

(pentafluorophenylaminocarbonylaminomethyl)trimethoxysilane, (pentafluorophenylaminocarbonylaminomethyl)triethoxysilane, (pentafluorophenylaminocarbonylaminomethyl)tripropoxysilane, (pentafluorophenylaminocarbonylaminomethyl)triisopropoxysilane, (pentafluorophenylaminocarbonylaminomethyl)ethoxydimethoxysilane, (pentafluorophenylaminocarbonylaminomethyl)diethoxymethoxysilane, (pentafluorophenylaminocarbonylaminomethyl)isopropoxydimethoxysilane, (pentafluorophenylaminocarbonylaminomethyl)diisopropoxymethoxysilane, (pentafluorophenylaminocarbonylaminomethyl)triacetoxysilane, (pentafluorophenyloxycarbonylaminomethyl)tri(propanoyloxy)silane, (pentafluorophenylaminocarbonylaminomethyl)hydroxydimethoxysilane, (pentafluorophenylaminocarbonylaminomethyl)hydroxydiethoxysilane, (pentafluorophenylaminocarbonylaminomethyl)hydroxydiisopropoxysilane, (pentafluorophenylaminocarbonylaminomethyl)hydroxymethoxysilane, (pentafluorophenylaminocarbonylaminomethyl)trihydroxysilane, (pentafluorophenylaminocarbonylaminomethyl)(methyl)dimethoxysilane, (pentafluorophenylaminocarbonylaminomethyl)(methyl)diethoxysilane, (pentafluorophenylaminocarbonylaminomethyl)(ethyl)dimethoxysilane, (pentafluorophenylaminocarbonylaminomethyl)dimethylmethoxysilane, (pentafluorophenylaminocarbonylaminomethyl)dimethylethoxysilane, (pentafluorophenylaminocarbonylaminomethyl)diethylmethoxysilane, (pentafluorophenylaminocarbonylaminomethyl)diisopropylhydroxysilane;

3-(pentafluorophenylaminocarbonylamino)propyltrimethoxysilane, 3-(pentafluorophenylaminocarbonylamino)propyltriethoxysilane, 3-(pentafluorophenylaminocarbonylamino)propyltripropoxysilane, 3-(pentafluorophenylaminocarbonylamino)propyltriisopropoxysilane, 3-(pentafluorophenylaminocarbonylamino)propylethoxydimethoxysilane, 3-(pentafluorophenylaminocarbonylamino)propyldiethoxymethoxysilane, 3-(pentafluorophenylaminocarbonylamino)propylisopropoxydimethoxysilane, 3-(pentafluorophenylaminocarbonylamino)propyldiisopropoxymethoxysilane, 3-(pentafluorophenylaminocarbonylamino)propyltriacetoxysilane, 3-(pentafluorophenylaminocarbonylamino)propyltri(propanoyloxy)silane, 3-(pentafluorophenylaminocarbonylamino)propylhydroxydimethoxysilane, 3-(pentafluorophenylaminocarbonylamino)propylhydroxydiethoxysilane, 3-(pentafluorophenylaminocarbonylamino)propylhydroxydiisopropoxysilane, 3-(pentafluorophenylaminocarbonylamino)propyldihydroxymethoxysilane, 3-(pentafluorophenylaminocarbonylamino)propyltrihydroxysilane, 3-(pentafluorophenylaminocarbonylamino)propyl(methyl)dimethoxysilane, 3-(pentafluorophenylaminocarbonylamino)propyl(methyl)diethoxysilane, 3-(pentafluorophenylaminocarbonylamino)propykethyl)dimethoxysilane, 3-(pentafluorophenylaminocarbonylamino)propyldimethylmethoxysilane, 3-(pentafluorophenylaminocarbonylamino)propyldimethylethoxysilane, 3-(pentafluorophenylaminocarbonylamino)propyldiethylmethoxysilane, 3-(pentafluorophenylaminocarbonylamino)propyldiisopropylhydroxysilane;

4-(pentafluorophenylaminocarbonylamino)butyltrimethoxysilane, 4-(pentafluorophenylaminocarbonylamino)butyltriethoxysilane, 4-(pentafluorophenylaminocarbonylamino)butyltripropoxysilane, 4-(pentafluorophenylaminocarbonylamino)butyltriisopropoxysilane, 4-(pentafluorophenylaminocarbonylamino)butylethoxydimethoxysilane, 4-(pentafluorophenylaminocarbonylamino)butyldiethoxymethoxysilane, 4-(pentafluorophenylaminocarbonylamino)butylisopropoxydimethoxysilane, 4-(pentafluorophenylaminocarbonylamino)butyldiisopropoxymethoxysilane, 4-(pentafluorophenylaminocarbonylamino)butyltriacetoxysilane, 4-(pentafluorophenylaminocarbonylamino)butyltri(propanoyloxy)silane, 4-(pentafluorophenylaminocarbonylamino)butylhydroxydimethoxysilane, 4-(pentafluorophenylaminocarbonylamino)butylhydroxydiethoxysilane, 4-(pentafluorophenylaminocarbonylamino)butylhydroxydiisopropoxysilane, 4-(pentafluorophenylaminocarbonylamino)butyldihydroxymethoxysilane, 4-(pentafluorophenylaminocarbonylamino)butyltrihydroxysilane, 4-(pentafluorophenylaminocarbonylamino)butyl(methyl)dimethoxysilane, 4-(pentafluorophenylaminocarbonylamino)butylmethyl)diethoxysilane, 4-(pentafluorophenylaminocarbonylamino)butyethyl)dimethoxysilane, 4-(pentafluorophenylaminocarbonylamino)butyldimethylmethoxysilane, 4-(pentafluorophenylaminocarbonylamino)butyldimethylethoxysilane, 4-(pentafluorophenylaminocarbonylamino)butyldiethylmethoxysilane, 4-(pentafluorophenylaminocarbonylamino)butyldiisopropylhydroxysilane;

2,3,4,5-tetrafluorophenyltrimethoxysilane, 2,3,4,5-tetrafluorophenyltriethoxysilane, 2,3,4,5-tetrafluorophenyltripropoxysilane, 2,3,4,5-tetrafluorophenyltriisopropoxysilane, 2,3,4,5-tetrafluorophenylethoxydimethoxysilane, 2,3,4,5-tetrafluorophenyldiethoxymethoxysilane, 2,3,4,5-tetrafluorophenylisopropoxydimethoxysilane, 2,3,4,5-tetrafluorophenyldiisopropoxymethoxysilane, 2,3,4,5-tetrafluorophenyltriacetoxysilane, 2,3,4,5-tetrafluorophenyltri(propanoyloxy)silane, 2,3,4,5-tetrafluorophenylhydroxydimethoxysilane, 2,3,4,5-tetrafluorophenylhydroxydiethoxysilane, 2,3,4,5-tetrafluorophenylhydroxydiisopropoxysilane, 2,3,4,5-tetrafluorophenyldihydroxymethoxysilane, 2,3,4,5-tetrafluorophenyltrihydroxysilane, 2,3,4,5-tetrafluorophenyl(methyl)dimethoxysilane, 2,3,4,5-tetrafluorophenyl(methyl)diethoxysilane, 2,3,4,5-tetrafluorophenyl(ethyl)dimethoxysilane, 2,3,4,5-tetrafluorophenyldimethylmethoxysilane, 2,3,4,5-tetrafluorophenyldimethylethoxysilane, 2,3,4,5-tetrafluorophenyldiethylmethoxysilane, 2,3,4,5-tetrafluorophenyldiisopropylhydroxysilane;

2,3,4,5-tetrafluorobenzyltrimethoxysilane, 2,3,4,5-tetrafluorobenzyltriethoxysilane, 2,3,4,5-tetrafluorobenzyltripropoxysilane, 2,3,4,5-tetrafluorobenzyltriisopropoxysilane, 2,3,4,5-tetrafluorobenzylethoxydimethoxysilane, 2,3,4,5-tetrafluorobenzyldiethoxymethoxysilane, 2,3,4,5-tetrafluorobenzylisopropoxydimethoxysilane, 2,3,4,5-tetrafluorobenzyldiisopropoxymethoxysilane, 2,3,4,5-tetrafluorobenzyltriacetoxysilane, 2,3,4,5-tetrafluorobenzyltri(propanoyloxy)silane, 2,3,4,5-tetrafluorobenzylhydroxydimethoxysilane, 2,3,4,5-tetrafluorobenzylhydroxydiethoxysilane, 2,3,4,5-tetrafluorobenzylhydroxydiisopropoxysilane, 2,3,4,5-tetrafluorobenzyldihydroxymethoxysilane, 2,3,4,5-tetrafluorobenzyltrihydroxysilane, 2,3,4,5-tetrafluorobenzyl(methyl)dimethoxysilane, 2,3,4,5-tetrafluorobenzyl(methyl)diethoxysilane, 2,3,4,5-tetrafluorobenzyl(ethyl)dimethoxysilane, 2,3,4,5-tetrafluorobenzyldimethylmethoxysilane, 2,3,4,5-tetrafluorobenzyldimethylethoxysilane, 2,3,4,5-tetrafluorobenzyldiethylmethoxysilane, 2,3,4,5-tetrafluorobenzyldiisopropylhydroxysilane;

2-(2,3,4,5-tetrafluorophenyl)ethyltrimethoxysilane, 2-(2,3,4,5-tetrafluorophenyl)ethyltriethoxysilane, 2-(2,3,4,5-tetrafluorophenyl)ethyltripropoxysilane, 2-(2,3,4,5-tetrafluorophenyl)ethyltriisopropoxysilane, 2-(2,3,4,5-tetrafluorophenyl)ethylethoxydimethoxysilane, 2-(2,3,4,5-tetrafluorophenyl)ethyldiethoxymethoxysilane, 2-(2,3,4,5-tetrafluorophenyl)ethylisopropoxydimethoxysilane, 2-(2,3,4,5-tetrafluorophenyl)ethyldiisopropoxymethoxysilane, 2-(2,3,4,5-tetrafluorophenyl)ethyltriacetoxysilane, 2-(2,3,4,5-tetrafluorophenyl)ethyltri(propanoyloxy)silane, 2-(2,3,4,5-tetrafluorophenyl)ethylhydroxydimethoxysilane, 2-(2,3,4,5-tetrafluorophenyl)ethylhydroxydiethoxysilane, 2-(2,3,4,5-tetrafluorophenyl)ethylhydroxydiisopropoxysilane, 2-(2,3,4,5-tetrafluorophenyl)ethyldihydroxymethoxysilane, 2-(2,3,4,5-tetrafluorophenyl)ethyltrihydroxysilane, 2-(2,3,4,5-tetrafluorophenyl)ethyl(methyl)dimethoxysilane, 2-(2,3,4,5-tetrafluorophenyl)ethyl(methyl)diethoxysilane, 2-(2,3,4,5-tetrafluorophenyl)ethyl(ethyl)dimethoxysilane, 2-(2,3,4,5-tetrafluorophenyl)ethyldimethylmethoxysilane, 2-(2,3,4,5-tetrafluorophenyl)ethyldimethylethoxysilane, 2-(2,3,4,5-tetrafluorophenyl)ethyldiethylmethoxysilane, 2-(2,3,4,5-tetrafluorophenyl)ethyldiisopropylhydroxysilane;

3-(2,3,4,5-tetrafluorophenyl)propyltrimethoxysilane, 3-(2,3,4,5-tetrafluorophenyl)propyltriethoxysilane, 3-(2,3,4,5-tetrafluorophenyl)propyltripropoxysilane, 3-(2,3,4,5-tetrafluorophenyl)propyltriisopropoxysilane, 3-(2,3,4,5-tetrafluorophenyl)propylethoxydimethoxysilane, 3-(2,3,4,5-tetrafluorophenyl)propyldiethoxymethoxysilane, 3-(2,3,4,5- tetrafluorophenyl)propylisopropoxydimethoxysilane, 3-(2,3,4,5-tetrafluorophenyl)propyldiisopropoxymethoxysilane, 3-(2,3,4,5-tetrafluorophenyl)propyltriacetoxysilane, 3-(2,3,4,5-tetrafluorophenyl)propyltri(propanoyloxy)silane, 3-(2,3,4,5-tetrafluorophenyl)propylhydroxydimethoxysilane, 3-(2,3,4,5-tetrafluorophenyl)propylhydroxydiethoxysilane, 3-(2,3,4,5-tetrafluorophenyl)propylhydroxydiisopropoxysilane, 3-(2,3,4,5-tetrafluorophenyl)propyldihydroxymethoxysilane, 3-(2,3,4,5-tetrafluorophenyl)propyltrihydroxysilane, 3-(2,3,4,5-tetrafluorophenyl)propylmethyl)dimethoxysilane, 3-(2,3,4,5-tetrafluorophenyl)propylmethyl)diethoxysilane, 3-(2,3,4,5-tetrafluorophenyl)propyl(ethyl)dimethoxysilane, 3-(2,3,4,5-tetrafluorophenyl)propyldimethylmethoxysilane, 3-(2,3,4,5-tetrafluorophenyl)propyldimethylethoxysilane, 3-(2,3,4,5-tetrafluorophenyl)propyldiethylmethoxysilane, 3-(2,3,4,5-tetrafluorophenyl)propyldiisopropylhydroxysilane;

4-(2,3,4,5-tetrafluorophenyl)butyltrimethoxysilane, 4-(2,3,4,5-tetrafluorophenyl)butyltriethoxysilane, 4-(2,3,4,5-tetrafluorophenyl)butyltripropoxysilane, 4-(2,3,4,5-tetrafluorophenyl)butyltriisopropoxysilane, 4-(2,3,4,5-tetrafluorophenyl)butylethoxydimethoxysilane, 4-(2,3,4,5-tetrafluorophenyl)butyldiethoxymethoxysilane, 4-(2,3,4,5-tetrafluorophenyl)butylisopropoxydimethoxysilane, 4-(2,3,4,5-tetrafluorophenyl)butyldiisopropoxymethoxysilane, 4-(2,3,4,5-tetrafluorophenyl)butyltriacetoxysilane, 4-(2,3,4,5-tetrafluorophenyl)butyltri(propanoyloxy)silane, 4-(2,3,4,5-tetrafluorophenyl)butylhydroxydimethoxysilane, 4-(2,3,4,5-tetrafluorophenyl)butylhydroxydiethoxysilane, 4-(2,3,4,5-tetrafluorophenyl)butylhydroxydiisopropoxysilane, 4-(2,3,4,5-tetrafluorophenyl)butyldihydroxymethoxysilane, 4-(2,3,4,5-tetrafluorophenyl)butyltrihydroxysilane, 4-(2,3,4,5-tetrafluorophenyl)butyl(methyl)dimethoxysilane, 4-(2,3,4,5-tetrafluorophenyl)butyl(methyl)diethoxysilane, 4-(2,3,4,5-tetrafluorophenyl)butyl(ethyl)dimethoxysilane, 4-(2,3,4,5-tetrafluorophenyl)butyldimethylmethoxysilane, 4-(2,3,4,5-tetrafluorophenyl)butyldimethylethoxysilane, 4-(2,3,4,5-tetrafluorophenyl)butyldiethylmethoxysilane, 4-(2,3,4,5-tetrafluorophenyl)butyldiisopropylhydroxysilane;

5-(2,3,4,5-tetrafluorophenyl)pentyltrimethoxysilane, 5-(2,3,4,5-tetrafluorophenyl)pentyltriethoxysilane, 5-(2,3,4,5-tetrafluorophenyl)pentyltripropoxysilane, 5-(2,3,4,5-tetrafluorophenyl)pentyltriisopropoxysilane, 5-(2,3,4,5-tetrafluorophenyl)pentylethoxydimethoxysilane, 5-(2,3,4,5-tetrafluorophenyl)pentyldiethoxymethoxysilane, 5-(2,3,4,5-tetrafluorophenyl)pentylisopropoxydimethoxysilane, 5-(2,3,4,5-tetrafluorophenyl)pentyldiisopropoxymethoxysilane, 5-(2,3,4,5-tetrafluorophenyl)pentyltriacetoxysilane, 5-(2,3,4,5-tetrafluorophenyl)pentyltri(propanoyloxy)silane, 5-(2,3,4,5-tetrafluorophenyl)pentylhydroxydimethoxysilane, 5-(2,3,4,5-tetrafluorophenyl)pentylhydroxydiethoxysilane, 5-(2,3,4,5-tetrafluorophenyl)pentylhydroxydiisopropoxysilane, 5-(2,3,4,5-tetrafluorophenyl)pentyldihydroxymethoxysilane, 5-(2,3,4,5-tetrafluorophenyl)pentyltrihydroxysilane, 5-(2,3,4,5-tetrafluorophenyl)pentyl(methyl)dimethoxysilane, 5-(2,3,4,5-tetrafluorophenyl)pentyl(methyl)diethoxysilane, 5-(2,3,4,5-tetrafluorophenyl)pentyl(ethyl)dimethoxysilane, 5-(2,3,4,5-tetrafluorophenyl)pentyldimethylmethoxysilane, 5-(2,3,4,5-tetrafluorophenyl)pentyldimethylethoxysilane, 5-(2,3,4,5-tetrafluorophenyl)pentyldiethylmethoxysilane, 5-(2,3,4,5-tetrafluorophenyl)pentyldiisopropylhydroxysilane;

6-(2,3,4,5-tetrafluorophenyl)hexyltrimethoxysilane, 6-(2,3,4,5-tetrafluorophenyl)hexyltriethoxysilane, 6-(2,3,4,5-tetrafluorophenyl)hexyltripropoxysilane, 6-(2,3,4,5-tetrafluorophenyl)hexyltriisopropoxysilane, 6-(2,3,4,5-tetrafluorophenyl)hexylethoxydimethoxysilane, 6-(2,3,4,5-tetrafluorophenyl)hexyldiethoxymethoxysilane, 6-(2,3,4,5-tetrafluorophenyl)hexylisopropoxydimethoxysilane, 6-(2,3,4,5-tetrafluorophenyl)hexyldiisopropoxymethoxysilane, 6-(2,3,4,5-tetrafluorophenyl)hexyltriacetoxysilane, 6-(2,3,4,5-tetrafluorophenyl)hexyltri(propanoyloxy)silane, 6-(2,3,4,5-tetrafluorophenyl)hexylhydroxydimethoxysilane, 6-(2,3,4,5-tetrafluorophenyl)hexylhydroxydiethoxysilane, 6-(2,3,4,5-tetrafluorophenyl)hexylhydroxydiisopropoxysilane, 6-(2,3,4,5-tetrafluorophenyl)hexyldihydroxymethoxysilane, 6-(2,3,4,5-tetrafluorophenyl)hexyltrihydroxysilane, 6-(2,3,4,5-tetrafluorophenyl)hexyl(methyl)dimethoxysilane, 6-(2,3,4,5-tetrafluorophenyl)hexyl(methyl)diethoxysilane, 6-(2,3,4,5-tetrafluorophenyl)hexyl(ethyl)dimethoxysilane, 6-(2,3,4,5-tetrafluorophenyl)hexyldimethylmethoxysilane, 6-(2,3,4,5-tetrafluorophenyl)hexyldimethylethoxysilane, 6-(2,3,4,5-tetrafluorophenyl)hexyldiethylmethoxysilane, 6-(2,3,4,5-tetrafluorophenyl)hexyldiisopropylhydroxysilane;

4-(2,3,4,5-tetrafluorophenyl)phenyltrimethoxysilane, 4-(2,3,4,5-tetrafluorophenyl)phenyltriethoxysilane, 4-(2,3,4,5-tetrafluorophenyl)phenyltripropoxysilane, 4-(2,3,4,5-tetrafluorophenyl)phenyltriisopropoxysilane, 4-(2,3,4,5-tetrafluorophenyl)phenylethoxydimethoxysilane, 4-(2,3,4,5-tetrafluorophenyl)phenyldiethoxymethoxysilane, 4-(2,3,4,5-tetrafluorophenyl)phenylisopropoxydimethoxysilane, 4-(2,3,4,5-tetrafluorophenyl)phenyldiisopropoxymethoxysilane, 4-(2,3,4,5-tetrafluorophenyl)phenyltriacetoxysilane, 4-(2,3,4,5-tetrafluorophenyl)phenyltri(propanoyloxy)silane, 4-(2,3,4,5-tetrafluorophenyl)phenylhydroxydimethoxysilane, 4-(2,3,4,5-tetrafluorophenyl)phenylhydroxydiethoxysilane, 4-(2,3,4,5-tetrafluorophenyl)phenylhydroxydiisopropoxysilane, 4-(2,3,4,5-tetrafluorophenyl)phenyldihydroxymethoxysilane, 4-(2,3,4,5-tetrafluorophenyl)phenyltrihydroxysilane, 4-(2,3,4,5-tetrafluorophenyl)phenyl(methyl)dimethoxysilane, 4-(2,3,4,5-tetrafluorophenyl)phenyl(methyl)diethoxysilane, 4-(2,3,4,5-tetrafluorophenyl)phenyl(ethyl)dimethoxysilane, 4-(2,3,4,5-tetrafluorophenyl)phenyldimethylmethoxysilane, 4-(2,3,4,5-tetrafluorophenyl)phenyldimethylethoxysilane, 4-(2,3,4,5-tetrafluorophenyl)phenyldiethylmethoxysilane, 4-(2,3,4,5-tetrafluorophenyl)phenyldiisopropylhydroxysilane;

2,4,5-trifluorophenyltrimethoxysilane, 2,4,5-trifluorophenyltriethoxysilane, 2,4,5-trifluorophenyltripropoxysilane, 2,4,5-trifluorophenyltriisopropoxysilane, 2,4,5-trifluorophenylethoxydimethoxysilane, 2,4,5-trifluorophenyldiethoxymethoxysilane, 2,4,5-trifluorophenylisopropoxydimethoxysilane, 2,4,5-trifluorophenyldiisopropoxymethoxysilane, 2,4,5-trifluorophenyltriacetoxysilane, 2,4,5-trifluorophenyltri(propanoyloxy)silane, 2,4,5-trifluorophenylhydroxydimethoxysilane, 2,4,5-trifluorophenylhydroxydiethoxysilane, 2,4,5-trifluorophenylhydroxydiisopropoxysilane, 2,4,5-trifluorophenyldihydroxymethoxysilane, 2,4,5-trifluorophenyltrihydroxysilane, 2,4,5-trifluorophenyl(methyl)dimethoxysilane, 2,4,5-trifluorophenylmethyl)diethoxysilane, 2,4,5-trifluorophenyl(ethyl)dimethoxysilane, 2,4,5-trifluorophenyldimethylmethoxysilane, 2,4,5-trifluorophenyldimethylethoxysilane, 2,4,5-trifluorophenyldiethylmethoxysilane, 2,4,5-trifluorophenyldiisopropylhydroxysilane;

2,4,5-trifluorobenzyltrimethoxysilane, 2,4,5-trifluorobenzyltriethoxysilane, 2,4,5-trifluorobenzyltripropoxysilane, 2,4,5-trifluorobenzyltriisopropoxysilane, 2,4,5-trifluorobenzylethoxydimethoxysilane, 2,4,5-trifluorobenzyldiethoxymethoxysilane, 2,4,5-trifluorobenzylisopropoxydimethoxysilane, 2,4,5- trifluorobenzyldiisopropoxymethoxysilane, 2,4,5-trifluorobenzyltriacetoxysilane, 2,4,5-trifluorobenzyltri(propanoyloxy)silane, 2,4,5-trifluorobenzylhydroxydimethoxysilane, 2,4,5-trifluorobenzylhydroxydiethoxysilane, 2,4,5-trifluorobenzylhydroxydiisopropoxysilane, 2,4,5-trifluorobenzyldihydroxymethoxysilane, 2,4,5-trifluorobenzyltrihydroxysilane, 2,4,5-trifluorobenzyl(methyl)dimethoxysilane, 2,4,5-trifluorobenzylmethyl)diethoxysilane, 2,4,5-trifluorobenzyl(ethyl)dimethoxysilane, 2,4,5-trifluorobenzyldimethylmethoxysilane, 2,4,5-trifluorobenzyldimethylethoxysilane, 2,4,5-trifluorobenzyldiethylmethoxysilane, 2,4,5-trifluorobenzyldiisopropylhydroxysilane;

2-(2,4,5-trifluorophenyl)ethyltrimethoxysilane, 2-(2,4,5-trifluorophenyl)ethyltriethoxysilane, 2-(2,4,5-trifluorophenyl)ethyltripropoxysilane, 2-(2,4,5-trifluorophenyl)ethyltriisopropoxysilane, 2-(2,4,5-trifluorophenyl)ethylethoxydimethoxysilane, 2-(2,4,5-trifluorophenyl)ethyldiethoxymethoxysilane, 2-(2,4,5-trifluorophenyl)ethylisopropoxydimethoxysilane, 2-(2,4,5-trifluorophenyl)ethyldiisopropoxymethoxysilane, 2-(2,4,5-trifluorophenyl)ethyltriacetoxysilane, 2-(2,4,5-trifluorophenyl)ethyltri(propanoyloxy)silane, 2-(2,4,5-trifluorophenyl)ethylhydroxydimethoxysilane, 2-(2,4,5-trifluorophenyl)ethylhydroxydiethoxysilane, 2-(2,4,5-trifluorophenyl)ethylhydroxydiisopropoxysilane, 2-(2,4,5-trifluorophenyl)ethyldihydroxymethoxysilane, 2-(2,4,5-trifluorophenyl)ethyltrihydroxysilane, 2-(2,4,5-trifluorophenyl)ethyl(methyl)dimethoxysilane, 2-(2,4,5-trifluorophenyl)ethylmethyl)diethoxysilane, 2-(2,4,5-trifluorophenyl)ethyl(ethyl)dimethoxysilane, 2-(2,4,5-trifluorophenyl)ethyldimethylmethoxysilane, 2-(2,4,5-trifluorophenyl)ethyldimethylethoxysilane, 2-(2,4,5-trifluorophenyl)ethyldiethylmethoxysilane, 2-(2,4,5-trifluorophenyl)ethyldiisopropylhydroxysilane;

3-(2,4,5-trifluorophenyl)propyltrimethoxysilane, 3-(2,4,5-trifluorophenyl)propyltriethoxysilane, 3-(2,4,5-trifluorophenyl)propyltripropoxysilane, 3-(2,4,5-trifluorophenyl)propyltriisopropoxysilane, 3-(2,4,5-trifluorophenyl)propylethoxydimethoxysilane, 3-(2,4,5-trifluorophenyl)propyldiethoxymethoxysilane, 3-(2,4,5-trifluorophenyl)propylisopropoxydimethoxysilane, 3-(2,4,5-trifluorophenyl)propyldiisopropoxymethoxysilane, 3-(2,4,5-trifluorophenyl)propyltriacetoxysilane, 3-(2,4,5-trifluorophenyl)propyltri(propanoyloxy)silane, 3-(2,4,5-trifluorophenyl)propylhydroxydimethoxysilane, 3-(2,4,5-trifluorophenyl)propylhydroxydiethoxysilane, 3-(2,4,5-trifluorophenyl)propylhydroxydiisopropoxysilane, 3-(2,4,5-trifluorophenyl)propyldihydroxymethoxysilane, 3-(2,4,5-trifluorophenyl)propyltrihydroxysilane, 3-(2,4,5-trifluorophenyl)propyl(methyl)dimethoxysilane, 3-(2,4,5-trifluorophenyl)propyl(methyl)diethoxysilane, 3-(2,4,5-trifluorophenyl)propyl(ethyl)dimethoxysilane, 3-(2,4,5-trifluorophenyl)propyldimethylmethoxysilane, 3-(2,4,5-trifluorophenyl)propyldimethylethoxysilane, 3-(2,4,5-trifluorophenyl)propyldiethylmethoxysilane, 3-(2,4,5-trifluorophenyl)propyldiisopropylhydroxysilane;

4-(2,4,5-trifluorophenyl)butyltrimethoxysilane, 4-(2,4,5-trifluorophenyl)butyltriethoxysilane, 4-(2,4,5-trifluorophenyl)butyltripropoxysilane, 4-(2,4,5-trifluorophenyl)butyltriisopropoxysilane, 4-(2,4,5-trifluorophenyl)butylethoxydimethoxysilane, 4-(2,4,5-trifluorophenyl)butyldiethoxymethoxysilane, 4-(2,4,5-trifluorophenyl)butylisopropoxydimethoxysilane, 4-(2,4,5-trifluorophenyl)butyldiisopropoxymethoxysilane, 4-(2,4,5-trifluorophenyl)butyltriacetoxysilane, 4-(2,4,5-trifluorophenyl)butyltri(propanoyloxy)silane, 4-(2,4,5-trifluorophenyl)butylhydroxydimethoxysilane, 4-(2,4,5-trifluorophenyl)butylhydroxydiethoxysilane, 4-(2,4,5-trifluorophenyl)butylhydroxydiisopropoxysilane, 4-(2,4,5-trifluorophenyl)butyldihydroxymethoxysilane, 4-(2,4,5-trifluorophenyl)butyltrihydroxysilane, 4-(2,4,5-trifluorophenyl)butylmethyl)dimethoxysilane, 4-(2,4,5-trifluorophenyl)butylmethyl)diethoxysilane, 4-(2,4,5-trifluorophenyl)butyl(ethyl)dimethoxysilane, 4-(2,4,5-trifluorophenyl)butyldimethylmethoxysilane, 4-(2,4,5-trifluorophenyl)butyldimethylethoxysilane, 4-(2,4,5-trifluorophenyl)butyldiethylmethoxysilane, 4-(2,4,5-trifluorophenyl)butyldiisopropylhydroxysilane;

5-(2,4,5-trifluorophenyl)pentyltrimethoxysilane, 5-(2,4,5-trifluorophenyl)pentyltriethoxysilane, 5-(2,4,5-trifluorophenyl)pentyltripropoxysilane, 5-(2,4,5-trifluorophenyl)pentyltriisopropoxysilane, 5-(2,4,5-trifluorophenyl)pentylethoxydimethoxysilane, 5-(2,4,5-trifluorophenyl)pentyldiethoxymethoxysilane, 5-(2,4,5-trifluorophenyl)pentylisopropoxydimethoxysilane, 5-(2,4,5-trifluorophenyl)pentyldiisopropoxymethoxysilane, 5-(2,4,5-trifluorophenyl)pentyltriacetoxysilane, 5-(2,4,5-trifluorophenyl)pentyltri(propanoyloxy)silane, 5-(2,4,5-trifluorophenyl)pentylhydroxydimethoxysilane, 5-(2,4,5-trifluorophenyl)pentylhydroxydiethoxysilane, 5-(2,4,5-trifluorophenyl)pentylhydroxydiisopropoxysilane, 5-(2,4,5-trifluorophenyl)pentyldihydroxymethoxysilane, 5-(2,4,5-trifluorophenyl)pentyltrihydroxysilane, 5-(2,4,5-trifluorophenyl)pentyl(methyl)dimethoxysilane, 5-(2,4,5-trifluorophenyl)pentyl(methyl)diethoxysilane, 5-(2,4,5-trifluorophenyl)pentyl(ethyl)dimethoxysilane, 5-(2,4,5-trifluorophenyl)pentyldimethylmethoxysilane, 5-(2,4,5-trifluorophenyl)pentyldimethylethoxysilane, 5-(2,4,5-trifluorophenyl)pentyldiethylmethoxysilane, 5-(2,4,5-trifluorophenyl)pentyldiisopropylhydroxysilane;

6-(2,4,5-trifluorophenyl)hexyltrimethoxysilane, 6-(2,4,5-trifluorophenyl)hexyltriethoxysilane, 6-(2,4,5-trifluorophenyl)hexyltripropoxysilane, 6-(2,4,5-trifluorophenyl)hexyltriisopropoxysilane, 6-(2,4,5-trifluorophenyl)hexylethoxydimethoxysilane, 6-(2,4,5-trifluorophenyl)hexyldiethoxymethoxysilane, 6-(2,4,5-trifluorophenyl)hexylisopropoxydimethoxysilane, 6-(2,4,5-trifluorophenyl)hexyldiisopropoxymethoxysilane, 6-(2,4,5-trifluorophenyl)hexyltriacetoxysilane, 6-(2,4,5-trifluorophenyl)hexyltri(propanoyloxy)silane, 6-(2,4,5-trifluorophenyl)hexylhydroxydimethoxysilane, 6-(2,4,5-trifluorophenyl)hexylhydroxydiethoxysilane, 6-(2,4,5-trifluorophenyl)hexylhydroxydiisopropoxysilane, 6-(2,4,5-trifluorophenyl)hexyldihydroxymethoxysilane, 6-(2,4,5-trifluorophenyl)hexyltrihydroxysilane, 6-(2,4,5-trifluorophenyl)hexylmethyl)dimethoxysilane, 6-(2,4,5-trifluorophenyl)hexylmethyl)diethoxysilane, 6-(2,4,5-trifluorophenyl)hexyl(ethyl)dimethoxysilane, 6-(2,4,5-trifluorophenyl)hexyldimethylmethoxysilane, 6-(2,4,5-trifluorophenyl)hexyldimethylethoxysilane, 6-(2,4,5-trifluorophenyl)hexyldiethylmethoxysilane, 6-(2,4,5-trifluorophenyl)hexyldiisopropylhydroxysilane;

4-(2,4,5-trifluorophenyl)phenyltrimethoxysilane, 4-(2,4,5-trifluorophenyl)phenyltriethoxysilane, 4-(2,4,5-trifluorophenyl)phenyltripropoxysilane, 4-(2,4,5-trifluorophenyl)phenyltriisopropoxysilane, 4-(2,4,5-trifluorophenyl)phenylethoxydimethoxysilane, 4-(2,4,5-trifluorophenyl)phenyldiethoxymethoxysilane, 4-(2,4,5-trifluorophenyl)phenylisopropoxydimethoxysilane, 4-(2,4,5-trifluorophenyl)phenyldiisopropoxymethoxysilane, 4-(2,4,5-trifluorophenyl)phenyltriacetoxysilane, 4-(2,4,5- trifluorophenyl)phenyltri(propanoyloxy)silane, 4-(2,4,5-trifluorophenyl)phenylhydroxydimethoxysilane, 4-(2,4,5-trifluorophenyl)phenylhydroxydiethoxysilane, 4-(2,4,5-trifluorophenyl)phenylhydroxydiisopropoxysilane, 4-(2,4,5-trifluorophenyl)phenyldihydroxymethoxysilane, 4-(2,4,5-trifluorophenyl)phenyltrihydroxysilane, 4-(2,4,5-trifluorophenyl)phenylmethyl)dimethoxysilane, 4-(2,4,5-trifluorophenyl)phenylmethyl)diethoxysilane, 4-(2,4,5-trifluorophenyl)phenyl(ethyl)dimethoxysilane, 4-(2,4,5-trifluorophenyl)phenyldimethylmethoxysilane, 4-(2,4,5-trifluorophenyl)phenyldimethylethoxysilane, 4-(2,4,5-trifluorophenyl)phenyldiethylmethoxysilane, 4-(2,4,5-trifluorophenyl)phenyldiisopropylhydroxysilane;

3,4,5-trifluorophenyltrimethoxysilane, 3,4,5-trifluorophenyltriethoxysilane, 3,4,5-trifluorophenyltripropoxysilane, 3,4,5-trifluorophenyltriisopropoxysilane, 3,4,5-trifluorophenylethoxydimethoxysilane, 3,4,5-trifluorophenyldiethoxymethoxysilane, 3,4,5-trifluorophenylisopropoxydimethoxysilane, 3,4,5-trifluorophenyldiisopropoxymethoxysilane, 3,4,5-trifluorophenyltriacetoxysilane, 3,4,5-trifluorophenyltri(propanoyloxy)silane, 3,4,5-trifluorophenylhydroxydimethoxysilane, 3,4,5-trifluorophenylhydroxydiethoxysilane, 3,4,5-trifluorophenylhydroxydiisopropoxysilane, 3,4,5-trifluorophenyldihydroxymethoxysilane, 3,4,5-trifluorophenyltrihydroxysilane, 3,4,5-trifluorophenyl(methyl)dimethoxysilane, 3,4,5-trifluorophenylmethyl)diethoxysilane, 3,4,5-trifluorophenyl(ethyl)dimethoxysilane, 3,4,5-trifluorophenyldimethylmethoxysilane, 3,4,5-trifluorophenyldimethylethoxysilane, 3,4,5-trifluorophenyldiethylmethoxysilane, 3,4,5-trifluorophenyldiisopropylhydroxysilane;

3,4,5-trifluorobenzyltrimethoxysilane, 3,4,5-trifluorobenzyltriethoxysilane, 3,4,5-trifluorobenzyltripropoxysilane, 3,4,5-trifluorobenzyltriisopropoxysilane, 3,4,5-trifluorobenzylethoxydimethoxysilane, 3,4,5-trifluorobenzyldiethoxymethoxysilane, 3,4,5-trifluorobenzylisopropoxydimethoxysilane, 3,4,5-trifluorobenzyldiisopropoxymethoxysilane, 3,4,5-trifluorobenzyltriacetoxysilane, 3,4,5-trifluorobenzyltri(propanoyloxy)silane, 3,4,5-trifluorobenzylhydroxydimethoxysilane, 3,4,5-trifluorobenzylhydroxydiethoxysilane, 3,4,5-trifluorobenzylhydroxydiisopropoxysilane, 3,4,5-trifluorobenzyldihydroxymethoxysilane, 3,4,5-trifluorobenzyltrihydroxysilane, 3,4,5-trifluorobenzyl(methyl)dimethoxysilane, 3,4,5-trifluorobenzylmethyl)diethoxysilane, 3,4,5-trifluorobenzyl(ethyl)dimethoxysilane, 3,4,5-trifluorobenzyldimethylmethoxysilane, 3,4,5-trifluorobenzyldimethylethoxysilane, 3,4,5-trifluorobenzyldiethylmethoxysilane, 3,4,5-trifluorobenzyldiisopropylhydroxysilane;

2-(3,4,5-trifluorophenyl)ethyltrimethoxysilane, 2-(3,4,5-trifluorophenyl)ethyltriethoxysilane, 2-(3,4,5-trifluorophenyl)ethyltripropoxysilane, 2-(3,4,5-trifluorophenyl)ethyltriisopropoxysilane, 2-(3,4,5-trifluorophenyl)ethylethoxydimethoxysilane, 2-(3,4,5-trifluorophenyl)ethyldiethoxymethoxysilane, 2-(3,4,5-trifluorophenyl)ethylisopropoxydimethoxysilane, 2-(3,4,5-trifluorophenyl)ethyldiisopropoxymethoxysilane, 2-(3,4,5-trifluorophenyl)ethyltriacetoxysilane, 2-(3,4,5-trifluorophenyl)ethyltri(propanoyloxy)silane, 2-(3,4,5-trifluorophenyl)ethylhydroxydimethoxysilane, 2-(3,4,5-trifluorophenyl)ethylhydroxydiethoxysilane, 2-(3,4,5-trifluorophenyl)ethylhydroxydiisopropoxysilane, 2-(3,4,5-trifluorophenyl)ethyldihydroxymethoxysilane, 2-(3,4,5-trifluorophenyl)ethyltrihydroxysilane, 2-(3,4,5-trifluorophenyl)ethyl(methyl)dimethoxysilane, 2-(3,4,5-trifluorophenyl)ethylmethyl)diethoxysilane, 2-(3,4,5-trifluorophenyl)ethyl(ethyl)dimethoxysilane, 2-(3,4,5-trifluorophenyl)ethyldimethylmethoxysilane, 2-(3,4,5-trifluorophenyl)ethyldimethylethoxysilane, 2-(3,4,5-trifluorophenyl)ethyldiethylmethoxysilane, 2-(3,4,5-trifluorophenyl)ethyldiisopropylhydroxysilane;

3-(3,4,5-trifluorophenyl)propyltrimethoxysilane, 3-(3,4,5-trifluorophenyl)propyltriethoxysilane, 3-(3,4,5-trifluorophenyl)propyltripropoxysilane, 3-(3,4,5-trifluorophenyl)propyltriisopropoxysilane, 3-(3,4,5-trifluorophenyl)propylethoxydimethoxysilane, 3-(3,4,5-trifluorophenyl)propyldiethoxymethoxysilane, 3-(3,4,5-trifluorophenyl)propylisopropoxydimethoxysilane, 3-(3,4,5-trifluorophenyl)propyldiisopropoxymethoxysilane, 3-(3,4,5-trifluorophenyl)propyltriacetoxysilane, 3-(3,4,5-trifluorophenyl)propyltri(propanoyloxy)silane, 3-(3,4,5-trifluorophenyl)propylhydroxydimethoxysilane, 3-(3,4,5-trifluorophenyl)propylhydroxydiethoxysilane, 3-(3,4,5-trifluorophenyl)propylhydroxydiisopropoxysilane, 3-(3,4,5-trifluorophenyl)propyldihydroxymethoxysilane, 3-(3,4,5-trifluorophenyl)propyltrihydroxysilane, 3-(3,4,5-trifluorophenyl)propyl(methyl)dimethoxysilane, 3-(3,4,5-trifluorophenyl)propyl(methyl)diethoxysilane, 3-(3,4,5-trifluorophenyl)propyl(ethyl)dimethoxysilane, 3-(3,4,5-trifluorophenyl)propyldimethylmethoxysilane, 3-(3,4,5-trifluorophenyl)propyldimethylethoxysilane, 3-(3,4,5-trifluorophenyl)propyldiethylmethoxysilane, 3-(3,4,5-trifluorophenyl)propyldiisopropylhydroxysilane;

4-(3,4,5-trifluorophenyl)butyltrimethoxysilane, 4-(3,4,5-trifluorophenyl)butyltriethoxysilane, 4-(3,4,5-trifluorophenyl)butyltripropoxysilane, 4-(3,4,5-trifluorophenyl)butyltriisopropoxysilane, 4-(3,4,5-trifluorophenyl)butylethoxydimethoxysilane, 4-(3,4,5-trifluorophenyl)butyldiethoxymethoxysilane, 4-(3,4,5-trifluorophenyl)butylisopropoxydimethoxysilane, 4-(3,4,5-trifluorophenyl)butyldiisopropoxymethoxysilane, 4-(3,4,5-trifluorophenyl)butyltriacetoxysilane, 4-(3,4,5-trifluorophenyl)butyltri(propanoyloxy)silane, 4-(3,4,5-trifluorophenyl)butylhydroxydimethoxysilane, 4-(3,4,5-trifluorophenyl)butylhydroxydiethoxysilane, 4-(3,4,5-trifluorophenyl)butylhydroxydiisopropoxysilane, 4-(3,4,5-trifluorophenyl)butyldihydroxymethoxysilane, 4-(3,4,5-trifluorophenyl)butyltrihydroxysilane, 4-(3,4,5-trifluorophenyl)butylmethyl)dimethoxysilane, 4-(3,4,5-trifluorophenyl)butylmethyl)diethoxysilane, 4-(3,4,5-trifluorophenyl)butyl(ethyl)dimethoxysilane, 4-(3,4,5-trifluorophenyl)butyldimethylmethoxysilane, 4-(3,4,5-trifluorophenyl)butyldimethylethoxysilane, 4-(3,4,5-trifluorophenyl)butyldiethylmethoxysilane, 4-(3,4,5-trifluorophenyl)butyldiisopropylhydroxysilane;

5-(3,4,5-trifluorophenyl)pentyltrimethoxysilane, 5-(3,4,5-trifluorophenyl)pentyltriethoxysilane, 5-(3,4,5-trifluorophenyl)pentyltripropoxysilane, 5-(3,4,5-trifluorophenyl)pentyltriisopropoxysilane, 5-(3,4,5-trifluorophenyl)pentylethoxydimethoxysilane, 5-(3,4,5-trifluorophenyl)pentyldiethoxymethoxysilane, 5-(3,4,5-trifluorophenyl)pentylisopropoxydimethoxysilane, 5-(3,4,5-trifluorophenyl)pentyldiisopropoxymethoxysilane, 5-(3,4,5-trifluorophenyl)pentyltriacetoxysilane, 5-(3,4,5-trifluorophenyl)pentyltri(propanoyloxy)silane, 5-(3,4,5-trifluorophenyl)pentylhydroxydimethoxysilane, 5-(3,4,5-trifluorophenyl)pentylhydroxydiethoxysilane, 5-(3,4,5-trifluorophenyl)pentylhydroxydiisopropoxysilane, 5-(3,4,5-trifluorophenyl)

pentyldihydroxymethoxysilane, 5-(3,4,5-trifluorophenyl)pentyltrihydroxysilane, 5-(3,4,5-trifluorophenyl)pentyl(methyl)dimethoxysilane, 5-(3,4,5-trifluorophenyl)pentyl(methyl)diethoxysilane, 5-(3,4,5-trifluorophenyl)pentyl(ethyl)dimethoxysilane, 5-(3,4,5-trifluorophenyl)pentyldimethylmethoxysilane, 5-(3,4,5-trifluorophenyl)pentyldimethylethoxysilane, 5-(3,4,5-trifluorophenyl)pentyldiethylmethoxysilane, 5-(3,4,5-trifluorophenyl)pentyldiisopropylhydroxysilane;

6-(3,4,5-trifluorophenyl)hexyltrimethoxysilane, 6-(3,4,5-trifluorophenyl)hexyltriethoxysilane, 6-(3,4,5-trifluorophenyl)hexyltripropoxysilane, 6-(3,4,5-trifluorophenyl)hexyltriisopropoxysilane, 6-(3,4,5-trifluorophenyl)hexylethoxydimethoxysilane, 6-(3,4,5-trifluorophenyl)hexyldiethoxymethoxysilane, 6-(3,4,5-trifluorophenyl)hexylisopropoxydimethoxysilane, 6-(3,4,5-trifluorophenyl)hexyldiisopropoxymethoxysilane, 6-(3,4,5-trifluorophenyl)hexyltriacetoxysilane, 6-(3,4,5-trifluorophenyl)hexyltri(propanoyloxy)silane, 6-(3,4,5-trifluorophenyl)hexylhydroxydimethoxysilane, 6-(3,4,5-trifluorophenyl)hexylhydroxydiethoxysilane, 6-(3,4,5-trifluorophenyl)hexylhydroxydiisopropoxysilane, 6-(3,4,5-trifluorophenyl)hexyldihydroxymethoxysilane, 6-(3,4,5-trifluorophenyl)hexyltrihydroxysilane, 6-(3,4,5-trifluorophenyl)hexylmethyl)dimethoxysilane, 6-(3,4,5-trifluorophenyl)hexylmethyl)diethoxysilane, 6-(3,4,5-trifluorophenyl)hexyl(ethyl)dimethoxysilane, 6-(3,4,5-trifluorophenyl)hexyldimethylmethoxysilane, 6-(3,4,5-trifluorophenyl)hexyldimethylethoxysilane, 6-(3,4,5-trifluorophenyl)hexyldiethylmethoxysilane, 6-(3,4,5-trifluorophenyl)hexyldiisopropylhydroxysilane;

4-(3,4,5-trifluorophenyl)phenyltrimethoxysilane, 4-(3,4,5-trifluorophenyl)phenyltriethoxysilane, 4-(3,4,5-trifluorophenyl)phenyltripropoxysilane, 4-(3,4,5-trifluorophenyl)phenyltriisopropoxysilane, 4-(3,4,5-trifluorophenyl)phenylethoxydimethoxysilane, 4-(3,4,5-trifluorophenyl)phenyldiethoxymethoxysilane, 4-(3,4,5-trifluorophenyl)phenylisopropoxydimethoxysilane, 4-(3,4,5-trifluorophenyl)phenyldiisopropoxymethoxysilane, 4-(3,4,5-trifluorophenyl)phenyltriacetoxysilane, 4-(3,4,5-trifluorophenyl)phenyltri(propanoyloxy)silane, 4-(3,4,5-trifluorophenyl)phenylhydroxydimethoxysilane, 4-(3,4,5-trifluorophenyl)phenylhydroxydiethoxysilane, 4-(3,4,5-trifluorophenyl)phenylhydroxydiisopropoxysilane, 4-(3,4,5-trifluorophenyl)phenyldihydroxymethoxysilane, 4-(3,4,5-trifluorophenyl)phenyltrihydroxysilane, 4-(3,4,5-trifluorophenyl)phenylmethyl)dimethoxysilane, 4-(3,4,5-trifluorophenyl)phenylmethyl)diethoxysilane, 4-(3,4,5-trifluorophenyl)phenyl(ethyl)dimethoxysilane, 4-(3,4,5-trifluorophenyl)phenyldimethylmethoxysilane, 4-(3,4,5-trifluorophenyl)phenyldimethylethoxysilane, 4-(3,4,5-trifluorophenyl)phenyldiethylmethoxysilane, 4-(3,4,5-trifluorophenyl)phenyldiisopropylhydroxysilane;

2,4,6-trifluorophenyltrimethoxysilane, 2,4,6-trifluorophenyltriethoxysilane, 2,4,6-trifluorophenyltripropoxysilane, 2,4,6-trifluorophenyltriisopropoxysilane, 2,4,6-trifluorophenylethoxydimethoxysilane, 2,4,6-trifluorophenyldiethoxymethoxysilane, 2,4,6-trifluorophenylisopropoxydimethoxysilane, 2,4,6-trifluorophenyldiisopropoxymethoxysilane, 2,4,6-trifluorophenyltriacetoxysilane, 2,4,6-trifluorophenyltri(propanoyloxy)silane, 2,4,6-trifluorophenylhydroxydimethoxysilane, 2,4,6-trifluorophenylhydroxydiethoxysilane, 2,4,6-trifluorophenylhydroxydiisopropoxysilane, 2,4,6-trifluorophenyldihydroxymethoxysilane, 2,4,6-trifluorophenyltrihydroxysilane, 2,4,6-trifluorophenyl(methyl)dimethoxysilane, 2,4,6-trifluorophenyl(methyl)diethoxysilane, 2,4,6-trifluorophenyl(ethyl)dimethoxysilane, 2,4,6-trifluorophenyldimethylmethoxysilane, 2,4,6-trifluorophenyldimethylethoxysilane, 2,4,6-trifluorophenyldiethylmethoxysilane, 2,4,6-trifluorophenyldiisopropylhydroxysilane;

2,4,6-trifluorobenzyltrimethoxysilane, 2,4,6-trifluorobenzyltriethoxysilane, 2,4,6-trifluorobenzyltripropoxysilane, 2,4,6-trifluorobenzyltriisopropoxysilane, 2,4,6-trifluorobenzylethoxydimethoxysilane, 2,4,6-trifluorobenzyldiethoxymethoxysilane, 2,4,6-trifluorobenzylisopropoxydimethoxysilane, 2,4,6-trifluorobenzyldiisopropoxymethoxysilane, 2,4,6-trifluorobenzyltriacetoxysilane, 2,4,6-trifluorobenzyltri(propanoyloxy)silane, 2,4,6-trifluorobenzylhydroxydimethoxysilane, 2,4,6-trifluorobenzylhydroxydiethoxysilane, 2,4,6-trifluorobenzylhydroxydiisopropoxysilane, 2,4,6-trifluorobenzyldihydroxymethoxysilane, 2,4,6-trifluorobenzyltrihydroxysilane, 2,4,6-trifluorobenzyl(methyl)dimethoxysilane, 2,4,6-trifluorobenzyl(methyl)diethoxysilane, 2,4,6-trifluorobenzyl(ethyl)dimethoxysilane, 2,4,6-trifluorobenzyldimethylmethoxysilane, 2,4,6-trifluorobenzyldimethylethoxysilane, 2,4,6-trifluorobenzyldiethylmethoxysilane, 2,4,6-trifluorobenzyldiisopropylhydroxysilane;

2-(2,4,6-trifluorophenyl)ethyltrimethoxysilane, 2-(2,4,6-trifluorophenyl)ethyltriethoxysilane, 2-(2,4,6-trifluorophenyl)ethyltripropoxysilane, 2-(2,4,6-trifluorophenyl)ethyltriisopropoxysilane, 2-(2,4,6-trifluorophenyl)ethylethoxydimethoxysilane, 2-(2,4,6-trifluorophenyl)ethyldiethoxymethoxysilane, 2-(2,4,6-trifluorophenyl)ethylisopropoxydimethoxysilane, 2-(2,4,6-trifluorophenyl)ethyldiisopropoxymethoxysilane, 2-(2,4,6-trifluorophenyl)ethyltriacetoxysilane, 2-(2,4,6-trifluorophenyl)ethyltri(propanoyloxy)silane, 2-(2,4,6-trifluorophenyl)ethylhydroxydimethoxysilane, 2-(2,4,6-trifluorophenyl)ethylhydroxydiethoxysilane, 2-(2,4,6-trifluorophenyl)ethylhydroxydiisopropoxysilane, 2-(2,4,6-trifluorophenyl)ethyldihydroxymethoxysilane, 2-(2,4,6-trifluorophenyl)ethyltrihydroxysilane, 2-(2,4,6-trifluorophenyl)ethyl(methyl)dimethoxysilane, 2-(2,4,6-trifluorophenyl)ethyl(methyl)diethoxysilane, 2-(2,4,6-trifluorophenyl)ethyl(ethyl)dimethoxysilane, 2-(2,4,6-trifluorophenyl)ethyldimethylmethoxysilane, 2-(2,4,6-trifluorophenyl)ethyldimethylethoxysilane, 2-(2,4,6-trifluorophenyl)ethyldiethylmethoxysilane, 2-(2,4,6-trifluorophenyl)ethyldiisopropylhydroxysilane;

3-(2,4,6-trifluorophenyl)propyltrimethoxysilane, 3-(2,4,6-trifluorophenyl)propyltriethoxysilane, 3-(2,4,6-trifluorophenyl)propyltripropoxysilane, 3-(2,4,6-trifluorophenyl)propyltriisopropoxysilane, 3-(2,4,6-trifluorophenyl)propylethoxydimethoxysilane, 3-(2,4,6-trifluorophenyl)propyldiethoxymethoxysilane, 3-(2,4,6-trifluorophenyl)propylisopropoxydimethoxysilane, 3-(2,4,6-trifluorophenyl)propyldiisopropoxymethoxysilane, 3-(2,4,6-trifluorophenyl)propyltriacetoxysilane, 3-(2,4,6-trifluorophenyl)propyltri(propanoyloxy)silane, 3-(2,4,6-trifluorophenyl)propylhydroxydimethoxysilane, 3-(2,4,6-trifluorophenyl)propylhydroxydiethoxysilane, 3-(2,4,6-trifluorophenyl)propylhydroxydiisopropoxysilane, 3-(2,4,6-trifluorophenyl)propyldihydroxymethoxysilane, 3-(2,4,6-trifluorophenyl)propyltrihydroxysilane, 3-(2,4,6-trifluorophenyl)propyl(methyl)dimethoxysilane, 3-(2,4,6-trifluorophenyl)propyl(methyl)diethoxysilane, 3-(2,4,6- trifluorophenyl)propyl(ethyl)dimethoxysilane, 3-(2,4,6-trifluorophenyl)propyldimethylmethoxysilane, 3-(2,4,6-trifluorophenyl)propyldimethylethoxysilane, 3-(2,4,6-trifluorophenyl)propyldiethylmethoxysilane, 3-(2,4,6-trifluorophenyl)propyldiisopropylhydroxysilane;

4-(2,4,6-trifluorophenyl)butyltrimethoxysilane, 4-(2,4,6-trifluorophenyl)butyltriethoxysilane, 4-(2,4,6-trifluorophenyl)butyltripropoxysilane, 4-(2,4,6-trifluorophenyl)butyltriisopropoxysilane, 4-(2,4,6-trifluorophenyl)butylethoxydimethoxysilane, 4-(2,4,6-trifluorophenyl)butyldiethoxymethoxysilane, 4-(2,4,6-trifluorophenyl)butylisopropoxydimethoxysilane, 4-(2,4,6-trifluorophenyl)butyldiisopropoxymethoxysilane, 4-(2,4,6-trifluorophenyl)butyltriacetoxysilane, 4-(2,4,6-trifluorophenyl)butyltri(propanoyloxy)silane, 4-(2,4,6-trifluorophenyl)butylhydroxydimethoxysilane, 4-(2,4,6-trifluorophenyl)butylhydroxydiethoxysilane, 4-(2,4,6-trifluorophenyl)butylhydroxydiisopropoxysilane, 4-(2,4,6-trifluorophenyl)butyldihydroxymethoxysilane, 4-(2,4,6-trifluorophenyl)butyltrihydroxysilane, 4-(2,4,6-trifluorophenyl)butyl(methyl)dimethoxysilane, 4-(2,4,6-trifluorophenyl)butyl(methyl)diethoxysilane, 4-(2,4,6-trifluorophenyl)butyl(ethyl)dimethoxysilane, 4-(2,4,6-trifluorophenyl)butyldimethylmethoxysilane, 4-(2,4,6-trifluorophenyl)butyldimethylethoxysilane, 4-(2,4,6-trifluorophenyl)butyldiethylmethoxysilane, 4-(2,4,6-trifluorophenyl)butyldiisopropylhydroxysilane;

5-(2,4,6-trifluorophenyl)pentyltrimethoxysilane, 5-(2,4,6-trifluorophenyl)pentyltriethoxysilane, 5-(2,4,6-trifluorophenyl)pentyltripropoxysilane, 5-(2,4,6-trifluorophenyl)pentyltriisopropoxysilane, 5-(2,4,6-trifluorophenyl)pentylethoxydimethoxysilane, 5-(2,4,6-trifluorophenyl)pentyldiethoxymethoxysilane, 5-(2,4,6-trifluorophenyl)pentylisopropoxydimethoxysilane, 5-(2,4,6-trifluorophenyl)pentyldiisopropoxymethoxysilane, 5-(2,4,6-trifluorophenyl)pentyltriacetoxysilane, 5-(2,4,6-trifluorophenyl)pentyltri(propanoyloxy)silane, 5-(2,4,6-trifluorophenyl)pentylhydroxydimethoxysilane, 5-(2,4,6-trifluorophenyl)pentylhydroxydiethoxysilane, 5-(2,4,6-trifluorophenyl)pentylhydroxydiisopropoxysilane, 5-(2,4,6-trifluorophenyl)pentyldihydroxymethoxysilane, 5-(2,4,6-trifluorophenyl)pentyltrihydroxysilane, 5-(2,4,6-trifluorophenyl)pentyl(methyl)dimethoxysilane, 5-(2,4,6-trifluorophenyl)pentyl(methyl)diethoxysilane, 5-(2,4,6-trifluorophenyl)pentyl(ethyl)dimethoxysilane, 5-(2,4,6-trifluorophenyl)pentyldimethylmethoxysilane, 5-(2,4,6-trifluorophenyl)pentyldimethylethoxysilane, 5-(2,4,6-trifluorophenyl)pentyldiethylmethoxysilane, 5-(2,4,6-trifluorophenyl)pentyldiisopropylhydroxysilane;

6-(2,4,6-trifluorophenyl)hexyltrimethoxysilane, 6-(2,4,6-trifluorophenyl)hexyltriethoxysilane, 6-(2,4,6-trifluorophenyl)hexyltripropoxysilane, 6-(2,4,6-trifluorophenyl)hexyltriisopropoxysilane, 6-(2,4,6-trifluorophenyl)hexylethoxydimethoxysilane, 6-(2,4,6-trifluorophenyl)hexyldiethoxymethoxysilane, 6-(2,4,6-trifluorophenyl)hexylisopropoxydimethoxysilane, 6-(2,4,6-trifluorophenyl)hexyldiisopropoxymethoxysilane, 6-(2,4,6-trifluorophenyl)hexyltriacetoxysilane, 6-(2,4,6-trifluorophenyl)hexyltri(propanoyloxy)silane, 6-(2,4,6-trifluorophenyl)hexylhydroxydimethoxysilane, 6-(2,4,6-trifluorophenyl)hexylhydroxydiethoxysilane, 6-(2,4,6-trifluorophenyl)hexylhydroxydiisopropoxysilane, 6-(2,4,6-trifluorophenyl)hexyldihydroxymethoxysilane, 6-(2,4,6-trifluorophenyl)hexyltrihydroxysilane, 6-(2,4,6-trifluorophenyl)hexyl(methyl)dimethoxysilane, 6-(2,4,6-trifluorophenyl)hexyl(methyl)diethoxysilane, 6-(2,4,6-trifluorophenyl)hexyl(ethyl)dimethoxysilane, 6-(2,4,6-trifluorophenyl)hexyldimethylmethoxysilane, 6-(2,4,6-trifluorophenyl)hexyldimethylethoxysilane, 6-(2,4,6-trifluorophenyl)hexyldiethylmethoxysilane, 6-(2,4,6-trifluorophenyl)hexyldiisopropylhydroxysilane;

4-(2,4,6-trifluorophenyl)phenyltrimethoxysilane, 4-(2,4,6-trifluorophenyl)phenyltriethoxysilane, 4-(2,4,6-trifluorophenyl)phenyltripropoxysilane, 4-(2,4,6-trifluorophenyl)phenyltriisopropoxysilane, 4-(2,4,6-trifluorophenyl)phenylethoxydimethoxysilane, 4-(2,4,6-trifluorophenyl)phenyldiethoxymethoxysilane, 4-(2,4,6-trifluorophenyl)phenylisopropoxydimethoxysilane, 4-(2,4,6-trifluorophenyl)phenyldiisopropoxymethoxysilane, 4-(2,4,6-trifluorophenyl)phenyltriacetoxysilane, 4-(2,4,6-trifluorophenyl)phenyltri(propanoyloxy)silane, 4-(2,4,6-trifluorophenyl)phenylhydroxydimethoxysilane, 4-(2,4,6-trifluorophenyl)phenylhydroxydiethoxysilane, 4-(2,4,6-trifluorophenyl)phenylhydroxydiisopropoxysilane, 4-(2,4,6-trifluorophenyl)phenyldihydroxymethoxysilane, 4-(2,4,6-trifluorophenyl)phenyltrihydroxysilane, 4-(2,4,6-trifluorophenyl)phenyl(methyl)dimethoxysilane, 4-(2,4,6-trifluorophenyl)phenyl(methyl)diethoxysilane, 4-(2,4,6-trifluorophenyl)phenyl(ethyl)dimethoxysilane, 4-(2,4,6-trifluorophenyl)phenyldimethylmethoxysilane, 4-(2,4,6-trifluorophenyl)phenyldimethylethoxysilane, 4-(2,4,6-trifluorophenyl)phenyldiethylmethoxysilane, 4-(2,4,6-trifluorophenyl)phenyldiisopropylhydroxysilane;

4-trifluoromethylphenyltrimethoxysilane, 4-trifluoromethylphenyltriethoxysilane, 4-trifluoromethylphenyltripropoxysilane, 4-trifluoromethylphenyltriisopropoxysilane, 4-trifluoromethylphenylethoxydimethoxysilane, 4-trifluoromethylphenyldiethoxymethoxysilane, 4-trifluoromethylphenylisopropoxydimethoxysilane, 4-trifluoromethylphenyldiisopropoxymethoxysilane, 4-trifluoromethylphenyltriacetoxysilane, 4-trifluoromethylphenyltri(propanoyloxy)silane, 4-trifluoromethylphenylhydroxydimethoxysilane, 4-trifluoromethylphenylhydroxydiethoxysilane, 4-trifluoromethylphenylhydroxydiisopropoxysilane, 4-trifluoromethylphenyldihydroxymethoxysilane, 4-trifluoromethylphenyltrihydroxysilane, 4-trifluoromethylphenyl(methyl)dimethoxysilane, 4-trifluoromethylphenyl(methyl)diethoxysilane, 4-trifluoromethylphenyl(ethyl)dimethoxysilane, 4-trifluoromethylphenyldimethylmethoxysilane, 4-trifluoromethylphenyldimethylethoxysilane, 4-trifluoromethylphenyldiethylmethoxysilane, 4-trifluoromethylphenyldiisopropylhydroxysilane;

4-trifluoromethylbenzyltrimethoxysilane, 4-trifluoromethylbenzyltriethoxysilane, 4-trifluoromethylbenzyltripropoxysilane, 4-trifluoromethylbenzyltriisopropoxysilane, 4-trifluoromethylbenzylethoxydimethoxysilane, 4-trifluoromethylbenzyldiethoxymethoxysilane, 4-trifluoromethylbenzylisopropoxydimethoxysilane, 4-trifluoromethylbenzyldiisopropoxymethoxysilane, 4-trifluoromethylbenzyltriacetoxysilane, 4-trifluoromethylbenzyltri(propanoyloxy)silane, 4-trifluoromethylbenzylhydroxydimethoxysilane, 4-trifluoromethylbenzylhydroxydiethoxysilane, 4-trifluoromethylbenzylhydroxydiisopropoxysilane, 4-trifluoromethylbenzyldihydroxymethoxysilane, 4-trifluoromethylbenzyltrihydroxysilane, 4-trifluoromethylbenzylmethyl)dimethoxysilane, 4-trifluoromethylbenzyl(methyl)diethoxysilane, 4-trifluoromethylbenzyl(ethyl)dimethoxysilane, 4-trifluoromethylbenzyldimethylmethoxysilane, 4-trifluoromethylbenzyldimethylethoxysilane, 4-trifluoromethylbenzyldiethylmethoxysilane, 4-trifluoromethylbenzyldiisopropylhydroxysilane;

2-(4-trifluoromethylphenyl)ethyltrimethoxysilane, 2-(4-trifluoromethylphenyl)ethyltriethoxysilane, 2-(4-trifluoromethylphenyl)ethyltripropoxysilane, 2-(4-trifluoromethylphenyl)ethyltriisopropoxysilane, 2-(4-trifluoromethylphenyl)ethylethoxydimethoxysilane, 2-(4-trifluoromethylphenyl)ethyldiethoxymethoxysilane, 2-(4-trifluoromethylphenyl)ethylisopropoxydimethoxysilane, 2-(4-trifluoromethylphenyl)ethyldiisopropoxymethoxysilane, 2-(4-trifluoromethylphenyl)ethyltriacetoxysilane, 2-(4-trifluoromethylphenyl)ethyltri(propanoyloxy)silane, 2-(4-trifluoromethylphenyl)ethylhydroxydimethoxysilane, 2-(4-trifluoromethylphenyl)ethylhydroxydiethoxysilane, 2-(4-trifluoromethylphenyl)ethylhydroxydiisopropoxysilane, 2-(4-trifluoromethylphenyl)ethyldihydroxymethoxysilane, 2-(4-trifluoromethylphenyl)ethyltrihydroxysilane, 2-(4-trifluoromethylphenyl)ethyl(methyl)dimethoxysilane, 2-(4-trifluoromethylphenyl)ethyl(methyl)diethoxysilane, 2-(4-trifluoromethylphenyl)ethyl(ethyl)dimethoxysilane, 2-(4-trifluoromethylphenyl)ethyldimethylmethoxysilane, 2-(4-trifluoromethylphenyl)ethyldimethylethoxysilane, 2-(4-trifluoromethylphenyl)ethyldiethylmethoxysilane, 2-(4-trifluoromethylphenyl)ethyldiisopropylhydroxysilane;

3-(4-trifluoromethylphenyl)propyltrimethoxysilane, 3-(4-trifluoromethylphenyl)propyltriethoxysilane, 3-(4-trifluoromethylphenyl)propyltripropoxysilane, 3-(4-trifluoromethylphenyl)propyltriisopropoxysilane, 3-(4-trifluoromethylphenyl)propylethoxydimethoxysilane, 3-(4-trifluoromethylphenyl)propyldiethoxymethoxysilane, 3-(4-trifluoromethylphenyl)propylisopropoxydimethoxysilane, 3-(4-trifluoromethylphenyl)propyldiisopropoxymethoxysilane, 3-(4-trifluoromethylphenyl)propyltriacetoxysilane, 3-(4-trifluoromethylphenyl)propyltri(propanoyloxy)silane, 3-(4-trifluoromethylphenyl)propylhydroxydimethoxysilane, 3-(4-trifluoromethylphenyl)propylhydroxydiethoxysilane, 3-(4-trifluoromethylphenyl)propylhydroxydiisopropoxysilane, 3-(4-trifluoromethylphenyl)propyldihydroxymethoxysilane, 3-(4-trifluoromethylphenyl)propyltrihydroxysilane, 3-(4-trifluoromethylphenyl)propyl(methyl)dimethoxysilane, 3-(4-trifluoromethylphenyl)propyl(methyl)diethoxysilane, 3-(4-trifluoromethylphenyl)propyl(ethyl)dimethoxysilane, 3-(4-trifluoromethylphenyl)propyldimethylmethoxysilane, 3-(4-trifluoromethylphenyl)propyldimethylethoxysilane, 3-(4-trifluoromethylphenyl)propyldiethylmethoxysilane, 3-(4-trifluoromethylphenyl)propyldiisopropylhydroxysilane;

4-(4-trifluoromethylphenyl)butyltrimethoxysilane, 4-(4-trifluoromethylphenyl)butyltriethoxysilane, 4-(4-trifluoromethylphenyl)butyltripropoxysilane, 4-(4-trifluoromethylphenyl)butyltriisopropoxysilane, 4-(4-trifluoromethylphenyl)butylethoxydimethoxysilane, 4-(4-trifluoromethylphenyl)butyldiethoxymethoxysilane, 4-(4-trifluoromethylphenyl)butylisopropoxydimethoxysilane, 4-(4-trifluoromethylphenyl)butyldiisopropoxymethoxysilane, 4-(4-trifluoromethylphenyl)butyltriacetoxysilane, 4-(4-trifluoromethylphenyl)butyltri(propanoyloxy)silane, 4-(4-trifluoromethylphenyl)butylhydroxydimethoxysilane, 4-(4-trifluoromethylphenyl)butylhydroxydiethoxysilane, 4-(4-trifluoromethylphenyl)butylhydroxydiisopropoxysilane, 4-(4-trifluoromethylphenyl)butyldihydroxymethoxysilane, 4-(4-trifluoromethylphenyl)butyltrihydroxysilane, 4-(4-trifluoromethylphenyl)butyl(methyl)dimethoxysilane, 4-(4-trifluoromethylphenyl)butyl(methyl)diethoxysilane, 4-(4-trifluoromethylphenyl)butyl(ethyl)dimethoxysilane, 4-(4-trifluoromethylphenyl)butyldimethylmethoxysilane, 4-(4-trifluoromethylphenyl)butyldimethylethoxysilane, 4-(4-trifluoromethylphenyl)butyldiethylmethoxysilane, 4-(4-trifluoromethylphenyl)butyldiisopropylhydroxysilane;

5-(4-trifluoromethylphenyl)pentyltrimethoxysilane, 5-(4-trifluoromethylphenyl)pentyltriethoxysilane, 5-(4-trifluoromethylphenyl)pentyltripropoxysilane, 5-(4-trifluoromethylphenyl)pentyltriisopropoxysilane, 5-(4-trifluoromethylphenyl)pentylethoxydimethoxysilane, 5-(4-trifluoromethylphenyl)pentyldiethoxymethoxysilane, 5-(4-trifluoromethylphenyl)pentylisopropoxydimethoxysilane, 5-(4-trifluoromethylphenyl)pentyldiisopropoxymethoxysilane, 5-(4-trifluoromethylphenyl)pentyltriacetoxysilane, 5-(4-trifluoromethylphenyl)pentyltri(propanoyloxy)silane, 5-(4-trifluoromethylphenyl)pentylhydroxydimethoxysilane, 5-(4-trifluoromethylphenyl)pentylhydroxydiethoxysilane, 5-(4-trifluoromethylphenyl)pentylhydroxydiisopropoxysilane, 5-(4-trifluoromethylphenyl)pentyldihydroxymethoxysilane, 5-(4-trifluoromethylphenyl)pentyltrihydroxysilane, 5-(4-trifluoromethylphenyl)pentyl(methyl)dimethoxysilane, 5-(4-trifluoromethylphenyl)pentyl(methyl)diethoxysilane, 5-(4-trifluoromethylphenyl)pentyl(ethyl)dimethoxysilane, 5-(4-trifluoromethylphenyl)pentyldimethylmethoxysilane, 5-(4-trifluoromethylphenyl)pentyldimethylethoxysilane, 5-(4-trifluoromethylphenyl)pentyldiethylmethoxysilane, 5-(4-trifluoromethylphenyl)pentyldiisopropylhydroxysilane;

6-(4-trifluoromethylphenyl)hexyltrimethoxysilane, 6-(4-trifluoromethylphenyl)hexyltriethoxysilane, 6-(4-trifluoromethylphenyl)hexyltripropoxysilane, 6-(4-trifluoromethylphenyl)hexyltriisopropoxysilane, 6-(4-trifluoromethylphenyl)hexylethoxydimethoxysilane, 6-(4-trifluoromethylphenyl)hexyldiethoxymethoxysilane, 6-(4-trifluoromethylphenyl)hexylisopropoxydimethoxysilane, 6-(4-trifluoromethylphenyl)hexyldiisopropoxymethoxysilane, 6-(4-trifluoromethylphenyl)hexyltriacetoxysilane, 6-(4-trifluoromethylphenyl)hexyltri(propanoyloxy)silane, 6-(4-trifluoromethylphenyl)hexylhydroxydimethoxysilane, 6-(4-trifluoromethylphenyl)hexylhydroxydiethoxysilane, 6-(4-trifluoromethylphenyl)hexylhydroxydiisopropoxysilane, 6-(4-trifluoromethylphenyl)hexyldihydroxymethoxysilane, 6-(4-trifluoromethylphenyl)hexyltrihydroxysilane, 6-(4-trifluoromethylphenyl)hexyl(methyl)dimethoxysilane, 6-(4-trifluoromethylphenyl)hexyl(methyl)diethoxysilane, 6-(4-trifluoromethylphenyl)hexyl(ethyl)dimethoxysilane, 6-(4-trifluoromethylphenyl)hexyldimethylmethoxysilane, 6-(4-trifluoromethylphenyl)hexyldimethylethoxysilane, 6-(4-trifluoromethylphenyl)hexyldiethylmethoxysilane, 6-(4-trifluoromethylphenyl)hexyldiisopropylhydroxysilane;

4-(4-trifluoromethylphenyl)phenyltrimethoxysilane, 4-(4-trifluoromethylphenyl)phenyltriethoxysilane, 4-(4-trifluoromethylphenyl)phenyltripropoxysilane, 4-(4-trifluoromethylphenyl)phenyltriisopropoxysilane, 4-(4-trifluoromethylphenyl)phenylethoxydimethoxysilane, 4-(4-trifluoromethylphenyl)phenyldiethoxymethoxysilane, 4-(4-trifluoromethylphenyl)phenylisopropoxydimethoxysilane, 4-(4-trifluoromethylphenyl)phenyldiisopropoxymethoxysilane, 4-(4-trifluoromethylphenyl)phenyltriacetoxysilane, 4-(4-trifluoromethylphenyl)phenyltri(propanoyloxy)silane, 4-(4-trifluoromethylphenyl)phenylhydroxydimethoxysilane, 4-(4-trifluoromethylphenyl)phenylhydroxydiethoxysilane, 4-(4-trifluoromethylphenyl)phenylhydroxydiisopropoxysilane, 4-(4-trifluoromethylphenyl)phenyldihydroxymethoxysilane, 4-(4-trifluoromethylphenyl)phenyltrihydroxysilane, 4-(4-trifluoromethylphenyl)phenyl(methyl)dimethoxysilane, 4-(4-trifluoromethylphenyl)phenyl(methyl)diethoxysilane, 4-(4-trifluoromethylphenyl)phenyl(ethyl)dimethoxysilane, 4-(4-trifluoromethylphenyl)phenyldimethylmethoxysilane, 4-(4-trifluoromethylphenyl)phenyldimethylethoxysilane, 4-(4-trifluoromethylphenyl)phenyldiethylmethoxysilane, 4-(4-trifluoromethylphenyl)phenyldiisopropylhydroxysilane;

3-trifluoromethylphenyltrimethoxysilane, 3-trifluoromethylphenyltriethoxysilane, 3-trifluoromethylphenyltripropoxysilane, 3-trifluoromethylphenyltriisopropoxysilane, 3-trifluoromethylphenylethoxydimethoxysilane, 3-trifluoromethylphenyldiethoxymethoxysilane, 3-trifluoromethylphenylisopropoxydimethoxysilane, 3-trifluoromethylphenyldiisopropoxymethoxysilane, 3-trifluoromethylphenyltriacetoxysilane, 3-trifluoromethylphenyltri(propanoyloxy)silane, 3-trifluoromethylphenylhydroxydimethoxysilane, 3-trifluoromethylphenylhydroxydiethoxysilane, 3-trifluoromethylphenylhydroxydiisopropoxysilane, 3-trifluoromethylphenyldihydroxymethoxysilane, 3-trifluoromethylphenyltrihydroxysilane, 3-trifluoromethylphenylmethyl)dimethoxysilane, 3-trifluoromethylphenylmethyl)diethoxysilane, 3-trifluoromethylphenyl(ethyl)dimethoxysilane, 3-trifluoromethylphenyldimethylmethoxysilane, 3-trifluoromethylphenyldimethylethoxysilane, 3-trifluoromethylphenyldiethylmethoxysilane, 3-trifluoromethylphenyldiisopropylhydroxysilane;

3-trifluoromethylbenzyltrimethoxysilane, 3-trifluoromethylbenzyltriethoxysilane, 3-trifluoromethylbenzyltripropoxysilane, 3-trifluoromethylbenzyltriisopropoxysilane, 3-trifluoromethylbenzylethoxydimethoxysilane, 3-trifluoromethylbenzyldiethoxymethoxysilane, 3-trifluoromethylbenzylisopropoxydimethoxysilane, 3-trifluoromethylbenzyldiisopropoxymethoxysilane, 3-trifluoromethylbenzyltriacetoxysilane, 3-trifluoromethylbenzyltri(propanoyloxy)silane, 3-trifluoromethylbenzylhydroxydimethoxysilane, 3-trifluoromethylbenzylhydroxydiethoxysilane, 3-trifluoromethylbenzylhydroxydiisopropoxysilane, 3-trifluoromethylbenzyldihydroxymethoxysilane, 3-trifluoromethylbenzyltrihydroxysilane, 3-trifluoromethylbenzylmethyl)dimethoxysilane, 3-trifluoromethylbenzylmethyl)diethoxysilane, 3-trifluoromethylbenzyl(ethyl)dimethoxysilane, 3-trifluoromethylbenzyldimethylmethoxysilane, 3-trifluoromethylbenzyldimethylethoxysilane, 3-trifluoromethylbenzyldiethylmethoxysilane, 3-trifluoromethylbenzyldiisopropylhydroxysilane;

2-(3-trifluoromethylphenyl)ethyltrimethoxysilane, 2-(3-trifluoromethylphenyl)ethyltriethoxysilane, 2-(3-trifluoromethylphenyl)ethyltripropoxysilane, 2-(3-trifluoromethylphenyl)ethyltriisopropoxysilane, 2-(3-trifluoromethylphenyl)ethylethoxydimethoxysilane, 2-(3-trifluoromethylphenyl)ethyldiethoxymethoxysilane, 2-(3-trifluoromethylphenyl)ethylisopropoxydimethoxysilane, 2-(3-trifluoromethylphenyl)ethyldiisopropoxymethoxysilane, 2-(3-trifluoromethylphenyl)ethyltriacetoxysilane, 2-(3-trifluoromethylphenyl)ethyltri(propanoyloxy)silane, 2-(3-trifluoromethylphenyl)ethylhydroxydimethoxysilane, 2-(3-trifluoromethylphenyl)ethylhydroxydiethoxysilane, 2-(3-trifluoromethylphenyl)ethylhydroxydiisopropoxysilane, 2-(3-trifluoromethylphenyl)ethyldihydroxymethoxysilane, 2-(3-trifluoromethylphenyl)ethyltrihydroxysilane, 2-(3-trifluoromethylphenyl)ethyl(methyl)dimethoxysilane, 2-(3-trifluoromethylphenyl)ethyl(methyl)diethoxysilane, 2-(3-trifluoromethylphenyl)ethyl(ethyl)dimethoxysilane, 2-(3-trifluoromethylphenyl)ethyldimethylmethoxysilane, 2-(3-trifluoromethylphenyl)ethyldimethylethoxysilane, 2-(3-trifluoromethylphenyl)ethyldiethylmethoxysilane, 2-(3-trifluoromethylphenyl)ethyldiisopropylhydroxysilane;

3-(3-trifluoromethylphenyl)propyltrimethoxysilane, 3-(3-trifluoromethylphenyl)propyltriethoxysilane, 3-(3-trifluoromethylphenyl)propyltripropoxysilane, 3-(3-trifluoromethylphenyl)propyltriisopropoxysilane, 3-(3-trifluoromethylphenyl)propylethoxydimethoxysilane, 3-(3-trifluoromethylphenyl)propyldiethoxymethoxysilane, 3-(3-trifluoromethylphenyl)propylisopropoxydimethoxysilane, 3-(3-trifluoromethylphenyl)propyldiisopropoxymethoxysilane, 3-(3-trifluoromethylphenyl)propyltriacetoxysilane, 3-(3-trifluoromethylphenyl)propyltri(propanoyloxy)silane, 3-(3-trifluoromethylphenyl)propylhydroxydimethoxysilane, 3-(3-trifluoromethylphenyl)propylhydroxydiethoxysilane, 3-(3-trifluoromethylphenyl)propylhydroxydiisopropoxysilane, 3-(3-trifluoromethylphenyl)propyldihydroxymethoxysilane, 3-(3-trifluoromethylphenyl)propyltrihydroxysilane, 3-(3-trifluoromethylphenyl)propyl(methyl)dimethoxysilane, 3-(3-trifluoromethylphenyl)propyl(methyl)diethoxysilane, 3-(3-trifluoromethylphenyl)propyl(ethyl)dimethoxysilane, 3-(3-trifluoromethylphenyl)propyldimethylmethoxysilane, 3-(3-trifluoromethylphenyl)propyldimethylethoxysilane, 3-(3-trifluoromethylphenyl)propyldiethylmethoxysilane, 3-(3-trifluoromethylphenyl)propyldiisopropylhydroxysilane;

4-(3-trifluoromethylphenyl)butyltrimethoxysilane, 4-(3-trifluoromethylphenyl)butyltriethoxysilane, 4-(3-trifluoromethylphenyl)butyltripropoxysilane, 4-(3-trifluoromethylphenyl)butyltriisopropoxysilane, 4-(3-trifluoromethylphenyl)butylethoxydimethoxysilane, 4-(3-trifluoromethylphenyl)butyldiethoxymethoxysilane, 4-(3-trifluoromethylphenyl)butylisopropoxydimethoxysilane, 4-(3-trifluoromethylphenyl)butyldiisopropoxymethoxysilane, 4-(3-trifluoromethylphenyl)butyltriacetoxysilane, 4-(3-trifluoromethylphenyl)butyltri(propanoyloxy)silane, 4-(3-trifluoromethylphenyl)butylhydroxydimethoxysilane, 4-(3-trifluoromethylphenyl)butylhydroxydiethoxysilane, 4-(3-trifluoromethylphenyl)butylhydroxydiisopropoxysilane, 4-(3-trifluoromethylphenyl)butyldihydroxymethoxysilane, 4-(3-trifluoromethylphenyl)butyltrihydroxysilane, 4-(3-trifluoromethylphenyl)butyl(methyl)dimethoxysilane, 4-(3-trifluoromethylphenyl)butyl(methyl)diethoxysilane, 4-(3-trifluoromethylphenyl)butyl(ethyl)dimethoxysilane, 4-(3-trifluoromethylphenyl)butyldimethylmethoxysilane, 4-(3-trifluoromethylphenyl)butyldimethylethoxysilane, 4-(3-trifluoromethylphenyl)butyldiethylmethoxysilane, 4-(3-trifluoromethylphenyl)butyldiisopropylhydroxysilane;

5-(3-trifluoromethylphenyl)pentyltrimethoxysilane, 5-(3-trifluoromethylphenyl)pentyltriethoxysilane, 5-(3-trifluoromethylphenyl)pentyltripropoxysilane, 5-(3-trifluoromethylphenyl)pentyltriisopropoxysilane, 5-(3-trifluoromethylphenyl)pentylethoxydimethoxysilane, 5-(3-trifluoromethylphenyl)pentyldiethoxymethoxysilane, 5-(3-trifluoromethylphenyl)pentylisopropoxydimethoxysilane, 5-(3-trifluoromethylphenyl)pentyldiisopropoxymethoxysilane, 5-(3-trifluoromethylphenyl)pentyltriacetoxysilane, 5-(3-trifluoromethylphenyl)pentyltri(propanoyloxy)silane, 5-(3-trifluoromethylphenyl)pentylhydroxydimethoxysilane, 5-(3-trifluoromethylphenyl)pentylhydroxydiethoxysilane, 5-(3-trifluoromethylphenyl)pentylhydroxydiisopropoxysilane, 5-(3-trifluoromethylphenyl)pentyldihydroxymethoxysilane, 5-(3-trifluoromethylphenyl)pentyltrihydroxysilane, 5-(3-trifluoromethylphenyl)pentyl(methyl)dimethoxysilane, 5-(3-trifluoromethylphenyl)pentyl(methyl)diethoxysilane, 5-(3-trifluoromethylphenyl)pentyl(ethyl)dimethoxysilane, 5-(3-trifluoromethylphenyl)pentyldimethylmethoxysilane, 5-(3-trifluoromethylphenyl)pentyldimethylethoxysilane, 5-(3-trifluoromethylphenyl)pentyldiethylmethoxysilane, 5-(3-trifluoromethylphenyl)pentyldiisopropylhydroxysilane;

6-(3-trifluoromethylphenyl)hexyltrimethoxysilane, 6-(3-trifluoromethylphenyl)hexyltriethoxysilane, 6-(3-trifluoromethylphenyl)hexyltripropoxysilane, 6-(3-trifluoromethylphenyl)hexyltriisopropoxysilane, 6-(3-trifluoromethylphenyl)hexylethoxydimethoxysilane, 6-(3-trifluoromethylphenyl)hexyldiethoxymethoxysilane, 6-(3-trifluoromethylphenyl)hexylisopropoxydimethoxysilane, 6-(3-trifluoromethylphenyl)hexyldiisopropoxymethoxysilane, 6-(3-trifluoromethylphenyl)hexyltriacetoxysilane, 6-(3-trifluoromethylphenyl)hexyltri(propanoyloxy)silane, 6-(3-trifluoromethylphenyl)hexylhydroxydimethoxysilane, 6-(3-trifluoromethylphenyl)hexylhydroxydiethoxysilane, 6-(3-trifluoromethylphenyl)hexylhydroxydiisopropoxysilane, 6-(3-trifluoromethylphenyl)hexyldihydroxymethoxysilane, 6-(3-trifluoromethylphenyl)hexyltrihydroxysilane, 6-(3-trifluoromethylphenyl)hexylmethyl)dimethoxysilane, 6-(3-trifluoromethylphenyl)hexylmethyl)diethoxysilane, 6-(3-trifluoromethylphenyl)hexyl(ethyl)dimethoxysilane, 6-(3-trifluoromethylphenyl)hexyldimethylmethoxysilane, 6-(3-trifluoromethylphenyl)hexyldimethylethoxysilane, 6-(3-trifluoromethylphenyl)hexyldiethylmethoxysilane, 6-(3-trifluoromethylphenyl)hexyldiisopropylhydroxysilane;

4-(3-trifluoromethylphenyl)phenyltrimethoxysilane, 4-(3-trifluoromethylphenyl)phenyltriethoxysilane, 4-(3-trifluoromethylphenyl)phenyltripropoxysilane, 4-(3-trifluoromethylphenyl)phenyltriisopropoxysilane, 4-(3-trifluoromethylphenyl)phenylethoxydimethoxysilane, 4-(3-trifluoromethylphenyl)phenyldiethoxymethoxysilane, 4-(3-trifluoromethylphenyl)phenylisopropoxydimethoxysilane, 4-(3-trifluoromethylphenyl)phenyldiisopropoxymethoxysilane, 4-(3-trifluoromethylphenyl)phenyltriacetoxysilane, 4-(3-trifluoromethylphenyl)phenyltri(propanoyloxy)silane, 4-(3-trifluoromethylphenyl)phenylhydroxydimethoxysilane, 4-(3-trifluoromethylphenyl)phenylhydroxydiethoxysilane, 4-(3-trifluoromethylphenyl)phenylhydroxydiisopropoxysilane, 4-(3-trifluoromethylphenyl)phenyldihydroxymethoxysilane, 4-(3-trifluoromethylphenyl)phenyltrihydroxysilane, 4-(3-trifluoromethylphenyl)phenylmethyl)dimethoxysilane, 4-(3-trifluoromethylphenyl)phenylmethyl)diethoxysilane, 4-(3-trifluoromethylphenyl)phenyl(ethyl)dimethoxysilane, 4-(3-trifluoromethylphenyl)phenyldimethylmethoxysilane, 4-(3-trifluoromethylphenyl)phenyldimethylethoxysilane, 4-(3-trifluoromethylphenyl)phenyldiethylmethoxysilane, 4-(3-trifluoromethylphenyl)phenyldiisopropylhydroxysilane;

3,5-bis(trifluoromethyl)phenyltrimethoxysilane, 3,5-bis(trifluoromethyl)phenyltriethoxysilane, 3,5-bis(trifluoromethyl)phenyltripropoxysilane, 3,5-bis(trifluoromethyl)phenyltriisopropoxysilane, 3,5-bis(trifluoromethyl)phenylethoxydimethoxysilane, 3,5-bis(trifluoromethyl)phenyldiethoxymethoxysilane, 3,5-bis(trifluoromethyl)phenylisopropoxydimethoxysilane, 3,5-bis(trifluoromethyl)phenyldiisopropoxymethoxysilane, 3,5-bis(trifluoromethyl)phenyltriacetoxysilane, 3,5-bis(trifluoromethyl)phenyltri(propanoyloxy)silane, 3,5-bis(trifluoromethyl)phenylhydroxydimethoxysilane, 3,5-bis(trifluoromethyl)phenylhydroxydiethoxysilane, 3,5-bis(trifluoromethyl)phenylhydroxydiisopropoxysilane, 3,5-bis(trifluoromethyl)phenyldihydroxymethoxysilane, 3,5-bis(trifluoromethyl)phenyltrihydroxysilane, 3,5-bis(trifluoromethyl)phenyl(methyl)dimethoxysilane, 3,5-bis(trifluoromethyl)phenyl(methyl)diethoxysilane, 3,5-bis(trifluoromethyl)phenyl(ethyl)dimethoxysilane, 3,5-bis(trifluoromethyl)phenyldimethylmethoxysilane, 3,5-bis(trifluoromethyl)phenyldimethylethoxysilane, 3,5-bis(trifluoromethyl)phenyldiethylmethoxysilane, 3,5-bis(trifluoromethyl)phenyldiisopropylhydroxysilane;

3,5-bis(trifluoromethyl)benzyltrimethoxysilane, 3,5-bis(trifluoromethyl)benzyltriethoxysilane, 3,5-bis(trifluoromethyl)benzyltripropoxysilane, 3,5-bis(trifluoromethyl)benzyltriisopropoxysilane, 3,5-bis(trifluoromethyl)benzylethoxydimethoxysilane, 3,5-bis(trifluoromethyl)benzyldiethoxymethoxysilane, 3,5-bis(trifluoromethyl)benzylisopropoxydimethoxysilane, 3,5-bis(trifluoromethyl)benzyldiisopropoxymethoxysilane, 3,5-bis(trifluoromethyl)benzyltriacetoxysilane, 3,5-bis(trifluoromethyl)benzyltri(propanoyloxy)silane, 3,5-bis(trifluoromethyl)benzylhydroxydimethoxysilane, 3,5-bis(trifluoromethyl)benzylhydroxydiethoxysilane, 3,5-bis(trifluoromethyl)benzylhydroxydiisopropoxysilane, 3,5-bis(trifluoromethyl)benzyldihydroxymethoxysilane, 3,5-bis(trifluoromethyl)benzyltrihydroxysilane, 3,5-bis(trifluoromethyl)benzyl(methyl)dimethoxysilane, 3,5-bis(trifluoromethyl)benzyl(methyl)diethoxysilane, 3,5-bis(trifluoromethyl)benzykethyl)dimethoxysilane, 3,5-bis(trifluoromethyl)benzyldimethylmethoxysilane, 3,5-bis(trifluoromethyl)benzyldimethylethoxysilane, 3,5-bis(trifluoromethyl)benzyldiethylmethoxysilane, 3,5-bis(trifluoromethyl)benzyldiisopropylhydroxysilane;

2-(3,5-bis(trifluoromethyl)phenyl)ethyltrimethoxysilane, 2-(3,5-bis(trifluoromethyl)phenyl)ethyltriethoxysilane, 2-(3,5-bis(trifluoromethyl)phenyl)ethyltripropoxysilane, 2-(3,5-bis(trifluoromethyl)phenyl)ethyltriisopropoxysilane, 2-(3,5-bis(trifluoromethyl)phenyl)ethylethoxydimethoxysilane, 2-(3,5-bis(trifluoromethyl)phenyl)ethyldiethoxymethoxysilane, 2-(3,5-bis(trifluoromethyl)phenyl)ethylisopropoxydimethoxysilane, 2-(3,5-bis(trifluoromethyl)phenyl)ethyldiisopropoxymethoxysilane, 2-(3,5-bis(trifluoromethyl)phenyl)ethyltriacetoxysilane, 2-(3,5-bis(trifluoromethyl)phenyl)ethyltri(propanoyloxy)silane, 2-(3,5-bis(trifluoromethyl)phenyl)ethylhydroxydimethoxysilane, 2-(3,5-bis(trifluoromethyl)phenyl)ethylhydroxydiethoxysilane, 2-(3,5-bis(trifluoromethyl)phenyl)ethylhydroxydiisopropoxysilane, 2-(3,5-bis(trifluoromethyl)phenyl)ethyldihydroxymethoxysilane, 2-(3,5-bis(trifluoromethyl)phenyl)ethyltrihydroxysilane, 2-(3,5-bis(trifluoromethyl)phenyl)ethyl(methyl)dimethoxysilane, 2-(3,5-bis(trifluoromethyl)phenyl)ethyl(methyl)diethoxysilane, 2-(3,5-bis(trifluoromethyl)phenyl)ethyl(ethyl)dimethoxysilane, 2-(3,5-bis(trifluoromethyl)phenyl)ethyldimethylmethoxysilane, 2-(3,5-bis(trifluoromethyl)phenyl)ethyldimethylethoxysilane, 2-(3,5-bis(trifluoromethyl)phenyl)ethyldiethylmethoxysilane, 2-(3,5-bis(trifluoromethyl)phenyl)ethyldiisopropylhydroxysilane;

3-(3,5-bis(trifluoromethyl)phenyl)propyltrimethoxysilane, 3-(3,5-bis(trifluoromethyl)phenyl)propyltriethoxysilane, 3-(3,5-bis(trifluoromethyl)phenyl)propyltripropoxysilane, 3-(3,5-bis(trifluoromethyl)phenyl)propyltriisopropoxysilane, 3-(3,5-bis(trifluoromethyl)phenyl)propylethoxydimethoxysilane, 3-(3,5-bis(trifluoromethyl)phenyl)propyldiethoxymethoxysilane, 3-(3,5-bis(trifluoromethyl)phenyl)propylisopropoxydimethoxysilane, 3-(3,5-bis(trifluoromethyl)phenyl)propyldiisopropoxymethoxysilane, 3-(3,5-bis(trifluoromethyl)phenyl)propyltriacetoxysilane, 3-(3,5-bis(trifluoromethyl)phenyl)propyltri(propanoyloxy)silane, 3-(3,5-bis(trifluoromethyl)phenyl)propylhydroxydimethoxysilane, 3-(3,5-bis(trifluoromethyl)phenyl)propylhydroxydiethoxysilane, 3-(3,5-bis(trifluoromethyl)phenyl)propylhydroxydiisopropoxysilane, 3-(3,5-bis(trifluoromethyl)phenyl)propyldihydroxymethoxysilane, 3-(3,5-bis(trifluoromethyl)phenyl)propyltrihydroxysilane, 3-(3,5-bis(trifluoromethyl)phenyl)propyl(methyl)dimethoxysilane, 3-(3,5-bis(trifluoromethyl)phenyl)propyl(methyl)diethoxysilane, 3-(3,5-bis(trifluoromethyl)phenyl)propyl(ethyl)dimethoxysilane, 3-(3,5-bis(trifluoromethyl)phenyl)propyldimethylmethoxysilane, 3-(3,5-bis(trifluoromethyl)phenyl)propyldimethylethoxysilane, 3-(3,5-bis(trifluoromethyl)phenyl)propyldiethylmethoxysilane, 3-(3,5-bis(trifluoromethyl)phenyl)propyldiisopropylhydroxysilane;

4-(3,5-bis(trifluoromethyl)phenyl)butyltrimethoxysilane, 4-(3,5-bis(trifluoromethyl)phenyl)butyltriethoxysilane, 4-(3,5-bis(trifluoromethyl)phenyl)butyltripropoxysilane, 4-(3,5-bis(trifluoromethyl)phenyl)butyltriisopropoxysilane, 4-(3,5-bis(trifluoromethyl)phenyl)butylethoxydimethoxysilane, 4-(3,5-bis(trifluoromethyl)phenyl)butyldiethoxymethoxysilane, 4-(3,5-bis(trifluoromethyl)phenyl)butylisopropoxydimethoxysilane, 4-(3,5-bis(trifluoromethyl)phenyl)butyldiisopropoxymethoxysilane, 4-(3,5-bis(trifluoromethyl)phenyl)butyltriacetoxysilane, 4-(3,5-bis(trifluoromethyl)phenyl)butyltri(propanoyloxy)silane, 4-(3,5-bis(trifluoromethyl)phenyl)butylhydroxydimethoxysilane, 4-(3,5-bis(trifluoromethyl)phenyl)butylhydroxydiethoxysilane, 4-(3,5-bis(trifluoromethyl)phenyl)butylhydroxydiisopropoxysilane, 4-(3,5-bis(trifluoromethyl)phenyl)butyldihydroxymethoxysilane, 4-(3,5-bis(trifluoromethyl)phenyl)butyltrihydroxysilane, 4-(3,5-bis(trifluoromethyl)phenyl)butyl(methyl)dimethoxysilane, 4-(3,5-bis(trifluoromethyl)phenyl)butyl(methyl)diethoxysilane, 4-(3,5-bis(trifluoromethyl)phenyl)butyl(ethyl)dimethoxysilane, 4-(3,5-bis(trifluoromethyl)phenyl)butyldimethylmethoxysilane, 4-(3,5-bis(trifluoromethyl)phenyl)butyldimethylethoxysilane, 4-(3,5-bis(trifluoromethyl)phenyl)butyldiethylmethoxysilane, 4-(3,5-bis(trifluoromethyl)phenyl)butyldiisopropylhydroxysilane;

5-(3,5-bis(trifluoromethyl)phenyl)pentyltrimethoxysilane, 5-(3,5-bis(trifluoromethyl)phenyl)pentyltriethoxysilane, 5-(3,5-bis(trifluoromethyl)phenyl)pentyltripropoxysilane, 5-(3,5-bis(trifluoromethyl)phenyl)pentyltriisopropoxysilane, 5-(3,5-bis(trifluoromethyl)phenyl)pentylethoxydimethoxysilane, 5-(3,5-bis(trifluoromethyl)phenyl)pentyldiethoxymethoxysilane, 5-(3,5-bis(trifluoromethyl)phenyl)pentylisopropoxydimethoxysilane, 5-(3,5-bis(trifluoromethyl)phenyl)pentyldiisopropoxymethoxysilane, 5-(3,5-bis(trifluoromethyl)phenyl)pentyltriacetoxysilane, 5-(3,5-bis(trifluoromethyl)phenyl)pentyltri(propanoyloxy)silane, 5-(3,5-bis(trifluoromethyl)phenyl)pentylhydroxydimethoxysilane, 5-(3,5-bis(trifluoromethyl)phenyl)pentylhydroxydiethoxysilane, 5-(3,5-bis(trifluoromethyl)phenyl)pentylhydroxydiisopropoxysilane, 5-(3,5-bis(trifluoromethyl)phenyl)pentyldihydroxymethoxysilane, 5-(3,5-bis(trifluoromethyl)phenyl)pentyltrihydroxysilane, 5-(3,5-bis(trifluoromethyl)phenyl)pentyl(methyl)dimethoxysilane, 5-(3,5-bis(trifluoromethyl)phenyl)pentyl(methyl)diethoxysilane, 5-(3,5-bis(trifluoromethyl)phenyl)pentyk-ethyl)dimethoxysilane, 5-(3,5-bis(trifluoromethyl)phenyl)pentyldimethylmethoxysilane, 5-(3,5-bis(trifluoromethyl)phenyl)pentyldimethylethoxysilane, 5-(3,5-bis(trifluoromethyl)phenyl)pentyldiethylmethoxysilane, 5-(3,5-bis(trifluoromethyl)phenyl)pentyldiisopropylhydroxysilane;

6-(3,5-bis(trifluoromethyl)phenyl)hexyltrimethoxysilane, 6-(3,5-bis(trifluoromethyl)phenyl)hexyltriethoxysilane, 6-(3,5-bis(trifluoromethyl)phenyl)hexyltripropoxysilane, 6-(3,5-bis(trifluoromethyl)phenyl)hexyltriisopropoxysilane, 6-(3,5-bis(trifluoromethyl)phenyl)hexylethoxydimethoxysilane, 6-(3,5-bis(trifluoromethyl)phenyl)hexyldiethoxymethoxysilane, 6-(3,5-bis(trifluoromethyl)phenyl)hexylisopropoxydimethoxysilane, 6-(3,5-bis(trifluoromethyl)phenyl)hexyldiisopropoxymethoxysilane, 6-(3,5-bis(trifluoromethyl)phenyl)hexyltriacetoxysilane, 6-(3,5-bis(trifluoromethyl)phenyl)hexyltri(propanoyloxy)silane, 6-(3,5-bis(trifluoromethyl)phenyl)hexylhydroxydimethoxysilane, 6-(3,5-bis(trifluoromethyl)phenyl)hexylhydroxydiethoxysilane, 6-(3,5-bis(trifluoromethyl)phenyl)hexylhydroxydiisopropoxysilane, 6-(3,5-bis(trifluoromethyl)phenyl)hexyldihydroxymethoxysilane, 6-(3,5-bis(trifluoromethyl)phenyl)hexyltrihydroxysilane, 6-(3,5-bis(trifluoromethyl)phenyl)hexyl(methyl)dimethoxysilane, 6-(3,5-bis(trifluoromethyl)phenyl)hexyl(methyl)diethoxysilane, 6-(3,5-bis(trifluoromethyl)phenyl)hexyl(ethyl)dimethoxysilane, 6-(3,5-bis(trifluoromethyl)phenyl)hexyldimethylmethoxysilane, 6-(3,5-bis(trifluoromethyl)phenyl)hexyldimethylethoxysilane, 6-(3,5-bis(trifluoromethyl)phenyl)hexyldiethylmethoxysilane, 6-(3,5-bis(trifluoromethyl)phenyl)hexyldiisopropylhydroxysilane;

4-(3,5-bis(trifluoromethyl)phenyl)phenyltrimethoxysilane, 4-(3,5-bis(trifluoromethyl)phenyl)phenyltriethoxysilane, 4-(3,5-bis(trifluoromethyl)phenyl)phenyltripropoxysilane, 4-(3,5-bis(trifluoromethyl)phenyl)phenyltriisopropoxysilane, 4-(3,5-bis(trifluoromethyl)phenyl)phenylethoxydimethoxysilane, 4-(3,5-bis(trifluoromethyl)phenyl)phenyldiethoxymethoxysilane, 4-(3,5-bis(trifluoromethyl)phenyl)phenylisopropoxydimethoxysilane, 4-(3,5-bis(trifluoromethyl)phenyl)phenyldiisopropoxymethoxysilane, 4-(3,5-bis(trifluoromethyl)phenyl)phenyltriacetoxysilane, 4-(3,5-bis(trifluoromethyl)phenyl)phenyltri(propanoyloxy)silane, 4-(3,5-bis(trifluoromethyl)phenyl)phenylhydroxydimethoxysilane, 4-(3,5-bis(trifluoromethyl)phenyl)phenylhydroxydiethoxysilane, 4-(3,5-bis(trifluoromethyl)phenyl)phenylhydroxydiisopropoxysilane, 4-(3,5-bis(trifluoromethyl)phenyl)phenyldihydroxymethoxysilane, 4-(3,5-bis(trifluoromethyl)phenyl)phenyltrihydroxysilane, 4-(3,5-bis(trifluoromethyl)phenyl)phenyl(methyl)dimethoxysilane, 4-(3,5-bis(trifluoromethyl)phenyl)phenyl(methyl)diethoxysilane, 4-(3,5-bis(trifluoromethyl)phenyl)phenyl(ethyl)dimethoxysilane, 4-(3,5-bis(trifluoromethyl)phenyl)phenyldimethylmethoxysilane, 4-(3,5-bis(trifluoromethyl)phenyl)phenyldimethylethoxysilane, 4-(3,5-bis(trifluoromethyl)phenyl)phenyldiethylmethoxysilane, 4-(3,5-bis(trifluoromethyl)phenyl)phenyldiisopropylhydroxysilane;

2,4-difluorophenyltrimethoxysilane, 2,4-difluorophenyltriethoxysilane, 2,4-difluorophenyltripropoxysilane, 2,4-difluorophenyltriisopropoxysilane, 2,4-difluorophenylethoxydimethoxysilane, 2,4-difluorophenyldiethoxymethoxysilane, 2,4-difluorophenylisopropoxydimethoxysilane, 2,4-difluorophenyldiisopropoxymethoxysilane, 2,4-difluorophenyltriacetoxysilane, 2,4-difluorophenyltri(propanoyloxy)silane, 2,4-difluorophenylhydroxydimethoxysilane, 2,4-difluorophenylhydroxydiethoxysilane, 2,4-difluorophenylhydroxydiisopropoxysilane, 2,4-difluorophenyldihydroxymethoxysilane, 2,4-difluorophenyltrihydroxysilane, 2,4-difluorophenyl(methyl)dimethoxysilane, 2,4-difluorophenyl(methyl)diethoxysilane, 2,4-difluorophenyl(ethyl)dimethoxysilane, 2,4-difluorophenyldimethylmethoxysilane, 2,4-difluorophenyldimethylethoxysilane, 2,4-difluorophenyldiethylmethoxysilane, 2,4-difluorophenyldiisopropylhydroxysilane;

2,4-difluorobenzyltrimethoxysilane, 2,4-difluorobenzyltriethoxysilane, 2,4-difluorobenzyltripropoxysilane, 2,4-difluorobenzyltriisopropoxysilane, 2,4-difluorobenzylethoxydimethoxysilane, 2,4-difluorobenzyldiethoxymethoxysilane, 2,4-difluorobenzylisopropoxydimethoxysilane, 2,4-difluorobenzyldiisopropoxymethoxysilane, 2,4-difluorobenzyltriacetoxysilane, 2,4-difluorobenzyltri(propanoyloxy)silane, 2,4-difluorobenzylhydroxydimethoxysilane, 2,4-difluorobenzylhydroxydiethoxysilane, 2,4-difluorobenzylhydroxydiisopropoxysilane, 2,4-difluorobenzyldihydroxymethoxysilane, 2,4-difluorobenzyltrihydroxysilane, 2,4-difluorobenzil(methyl)dimethoxysilane, 2,4-difluorobenzil(methyl)diethoxysilane, 2,4-difluorobenzil(ethyl)dimethoxysilane, 2,4-difluorobenzyldimethylmethoxysilane, 2,4-difluorobenzyldimethylethoxysilane, 2,4-difluorobenzyldiethylmethoxysilane, 2,4-difluorobenzyldiisopropylhydroxysilane;

2-(2,4-difluorophenyl)ethyltrimethoxysilane, 2-(2,4-difluorophenyl)ethyltriethoxysilane, 2-(2,4-difluorophenyl)ethyltripropoxysilane, 2-(2,4-difluorophenyl)ethyltriisopropoxysilane, 2-(2,4-difluorophenyl)ethylethoxydimethoxysilane, 2-(2,4-difluorophenyl)ethyldiethoxymethoxysilane, 2-(2,4-difluorophenyl)ethylisopropoxydimethoxysilane, 2-(2,4-difluorophenyl)ethyldiisopropoxymethoxysilane, 2-(2,4-difluorophenyl)ethyltriacetoxysilane, 2-(2,4-difluorophenyl)ethyltri(propanoyloxy)silane, 2-(2,4-difluorophenyl)ethylhydroxydimethoxysilane, 2-(2,4-difluorophenyl)ethylhydroxydiethoxysilane, 2-(2,4-difluorophenyl)ethylhydroxydiisopropoxysilane, 2-(2,4-difluorophenyl)ethyldihydroxymethoxysilane, 2-(2,4-difluorophenyl)ethyltrihydroxysilane, 2-(2,4-difluorophenyl)ethyl(methyl)dimethoxysilane, 2-(2,4-difluorophenyl)ethyl(methyl)diethoxysilane, 2-(2,4-difluorophenyl)ethyl(ethyl)dimethoxysilane, 2-(2,4-difluorophenyl)ethyldimethylmethoxysilane, 2-(2,4-difluorophenyl)ethyldimethylethoxysilane, 2-(2,4-difluorophenyl)ethyldiethylmethoxysilane, 2-(2,4-difluorophenyl)ethyldiisopropylhydroxysilane;

3-(2,4-difluorophenyl)propyltrimethoxysilane, 3-(2,4-difluorophenyl)propyltriethoxysilane, 3-(2,4-difluorophenyl)propyltripropoxysilane, 3-(2,4-difluorophenyl)propyltriisopropoxysilane, 3-(2,4-difluorophenyl)propylethoxydimethoxysilane, 3-(2,4-difluorophenyl)propyldiethoxymethoxysilane, 3-(2,4-difluorophenyl)propylisopropoxydimethoxysilane, 3-(2,4-difluorophenyl)propyldiisopropoxymethoxysilane, 3-(2,4-difluorophenyl)propyltriacetoxysilane, 3-(2,4-difluorophenyl)propyltri(propanoyloxy)silane, 3-(2,4-difluorophenyl)propylhydroxydimethoxysilane, 3-(2,4-difluorophenyl)propylhydroxydiethoxysilane, 3-(2,4-difluorophenyl)propylhydroxydiisopropoxysilane, 3-(2,4-difluorophenyl)propyldihydroxymethoxysilane, 3-(2,4-difluorophenyl)propyltrihydroxysilane, 3-(2,4-difluorophenyl)propyl(methyl)dimethoxysilane, 3-(2,4-difluorophenyl)propyl(methyl)diethoxysilane, 3-(2,4-difluorophenyl)propyl(ethyl)dimethoxysilane, 3-(2,4-difluorophenyl)propyldimethylmethoxysilane, 3-(2,4-difluorophenyl)propyldimethylethoxysilane, 3-(2,4-difluorophenyl)propyldiethylmethoxysilane, 3-(2,4-difluorophenyl)propyldiisopropylhydroxysilane;

4-(2,4-difluorophenyl)butyltrimethoxysilane, 4-(2,4-difluorophenyl)butyltriethoxysilane, 4-(2,4-difluorophenyl)butyltripropoxysilane, 4-(2,4-difluorophenyl)butyltriisopropoxysilane, 4-(2,4-difluorophenyl)butylethoxydimethoxysilane, 4-(2,4-difluorophenyl)butyldiethoxymethoxysilane, 4-(2,4-difluorophenyl)butylisopropoxydimethoxysilane, 4-(2,4-difluorophenyl)butyldiisopropoxymethoxysilane, 4-(2,4-difluorophenyl)butyltriacetoxysilane, 4-(2,4-difluorophenyl)butyltri(propanoyloxy)silane, 4-(2,4-difluorophenyl)butylhydroxydimethoxysilane, 4-(2,4-difluorophenyl)butylhydroxydiethoxysilane, 4-(2,4-difluorophenyl)butylhydroxydiisopropoxysilane, 4-(2,4-difluorophenyl)butyldihydroxymethoxysilane, 4-(2,4-difluorophenyl)butyltrihydroxysilane, 4-(2,4-difluorophenyl)butyl(methyl)dimethoxysilane, 4-(2,4-difluorophenyl)butyl(methyl)diethoxysilane, 4-(2,4-difluorophenyl)butyl(ethyl)dimethoxysilane, 4-(2,4-difluorophenyl)butyldimethylmethoxysilane, 4-(2,4-difluorophenyl)butyldimethylethoxysilane, 4-(2,4-difluorophenyl)butyldiethylmethoxysilane, 4-(2,4-difluorophenyl)butyldiisopropylhydroxysilane;

5-(2,4-difluorophenyl)pentyltrimethoxysilane, 5-(2,4-difluorophenyl)pentyltriethoxysilane, 5-(2,4-difluorophenyl)pentyltripropoxysilane, 5-(2,4-difluorophenyl)pentyltriisopropoxysilane, 5-(2,4-difluorophenyl)pentylethoxydimethoxysilane, 5-(2,4-difluorophenyl)pentyldiethoxymethoxysilane, 5-(2,4-difluorophenyl)pentylisopropoxydimethoxysilane, 5-(2,4-difluorophenyl)pentyldiisopropoxymethoxysilane, 5-(2,4-difluorophenyl)pentyltriacetoxysilane, 5-(2,4-difluorophenyl)pentyltri(propanoyloxy)silane, 5-(2,4-difluorophenyl)pentylhydroxydimethoxysilane, 5-(2,4-difluorophenyl)pentylhydroxydiethoxysilane, 5-(2,4-difluorophenyl)pentylhydroxydiisopropoxysilane, 5-(2,4-difluorophenyl)pentyldihydroxymethoxysilane, 5-(2,4-difluorophenyl)pentyltrihydroxysilane, 5-(2,4-difluorophenyl)pentyl(methyl)dimethoxysilane, 5-(2,4-difluorophenyl)pentyl(methyl)diethoxysilane, 5-(2,4-difluorophenyl)pentyl(ethyl)dimethoxysilane, 5-(2,4-difluorophenyl)pentyldimethylmethoxysilane, 5-(2,4-difluorophenyl)pentyldimethylethoxysilane, 5-(2,4-difluorophenyl)pentyldiethylmethoxysilane, 5-(2,4-difluorophenyl)pentyldiisopropylhydroxysilane;

6-(2,4-difluorophenyl)hexyltrimethoxysilane, 6-(2,4-difluorophenyl)hexyltriethoxysilane, 6-(2,4-difluorophenyl)hexyltripropoxysilane, 6-(2,4-difluorophenyl)hexyltriisopropoxysilane, 6-(2,4-difluorophenyl)hexylethoxydimethoxysilane, 6-(2,4-difluorophenyl)hexyldiethoxymethoxysilane, 6-(2,4-difluorophenyl)hexylisopropoxydimethoxysilane, 6-(2,4-difluorophenyl)hexyldiisopropoxymethoxysilane, 6-(2,4-difluorophenyl)hexyltriacetoxysilane, 6-(2,4-difluorophenyl)hexyltri(propanoyloxy)silane, 6-(2,4-difluorophenyl)hexylhydroxydimethoxysilane, 6-(2,4-difluorophenyl)hexylhydroxydiethoxysilane, 6-(2,4-difluorophenyl)hexylhydroxydiisopropoxysilane, 6-(2,4-difluorophenyl)hexyldihydroxymethoxysilane, 6-(2,4-difluorophenyl)hexyltrihydroxysilane, 6-(2,4-difluorophenyl)hexyl(methyl)dimethoxysilane, 6-(2,4-difluorophenyl)hexyl(methyl)diethoxysilane, 6-(2,4-difluorophenyl)hexyl(ethyl)dimethoxysilane, 6-(2,4-difluorophenyl)hexyldimethylmethoxysilane, 6-(2,4-difluorophenyl)hexyldimethylethoxysilane, 6-(2,4-difluorophenyl)hexyldiethylmethoxysilane, 6-(2,4-difluorophenyl)hexyldiisopropylhydroxysilane;

4-(2,4-difluorophenyl)phenyltrimethoxysilane, 4-(2,4-difluorophenyl)phenyltriethoxysilane, 4-(2,4-difluorophenyl)phenyltripropoxysilane, 4-(2,4-difluorophenyl)phenyltriisopropoxysilane, 4-(2,4-difluorophenyl)phenylethoxydimethoxysilane, 4-(2,4-difluorophenyl)phenyldiethoxymethoxysilane, 4-(2,4-difluorophenyl)phenylisopropoxydimethoxysilane, 4-(2,4-difluorophenyl)

phenyldiisopropoxymethoxysilane, 4-(2,4-difluorophenyl)phenyltriacetoxysilane, 4-(2,4-difluorophenyl)phenyltri(propanoyloxy)silane, 4-(2,4-difluorophenyl)phenylhydroxydimethoxysilane, 4-(2,4-difluorophenyl)phenylhydroxydiethoxysilane, 4-(2,4-difluorophenyl)phenylhydroxydiisopropoxysilane, 4-(2,4-difluorophenyl)phenyldihydroxymethoxysilane, 4-(2,4-difluorophenyl)phenyltrihydroxysilane, 4-(2,4-difluorophenyl)phenyl(methyl)dimethoxysilane, 4-(2,4-difluorophenyl)phenyl(methyl)diethoxysilane, 4-(2,4-difluorophenyl)phenyl(ethyl)dimethoxysilane, 4-(2,4-difluorophenyl)phenyldimethylmethoxysilane, 4-(2,4-difluorophenyl)phenyldimethylethoxysilane, 4-(2,4-difluorophenyl)phenyldiethylmethoxysilane, 4-(2,4-difluorophenyl)phenyldiisopropylhydroxysilane;

3,4-difluorophenyltrimethoxysilane, 3,4-difluorophenyltriethoxysilane, 3,4-difluorophenyltripropoxysilane, 3,4-difluorophenyltriisopropoxysilane, 3,4-difluorophenylethoxydimethoxysilane, 3,4-difluorophenyldiethoxymethoxysilane, 3,4-difluorophenylisopropoxydimethoxysilane, 3,4-difluorophenyldiisopropoxymethoxysilane, 3,4-difluorophenyltriacetoxysilane, 3,4-difluorophenyltri(propanoyloxy)silane, 3,4-difluorophenylhydroxydimethoxysilane, 3,4-difluorophenylhydroxydiethoxysilane, 3,4-difluorophenylhydroxydiisopropoxysilane, 3,4-difluorophenyldihydroxymethoxysilane, 3,4-difluorophenyltrihydroxysilane, 3,4-difluorophenyl(methyl)dimethoxysilane, 3,4-difluorophenyl(methyl)diethoxysilane, 3,4-difluorophenyl(ethyl)dimethoxysilane, 3,4-difluorophenyldimethylmethoxysilane, 3,4-difluorophenyldimethylethoxysilane, 3,4-difluorophenyldiethylmethoxysilane, 3,4-difluorophenyldiisopropylhydroxysilane;

3,4-difluorobenzyltrimethoxysilane, 3,4-difluorobenzyltriethoxysilane, 3,4-difluorobenzyltripropoxysilane, 3,4-difluorobenzyltriisopropoxysilane, 3,4-difluorobenzylethoxydimethoxysilane, 3,4-difluorobenzyldiethoxymethoxysilane, 3,4-difluorobenzylisopropoxydimethoxysilane, 3,4-difluorobenzyldiisopropoxymethoxysilane, 3,4-difluorobenzyltriacetoxysilane, 3,4-difluorobenzyltri(propanoyloxy)silane, 3,4-difluorobenzylhydroxydimethoxysilane, 3,4-difluorobenzylhydroxydiethoxysilane, 3,4-difluorobenzylhydroxydiisopropoxysilane, 3,4-difluorobenzyldihydroxymethoxysilane, 3,4-difluorobenzyltrihydroxysilane, 3,4-difluorobenzil(methyl)dimethoxysilane, 3,4-difluorobenzil(methyl)diethoxysilane, 3,4-difluorobenzil(ethyl)dimethoxysilane, 3,4-difluorobenzyldimethylmethoxysilane, 3,4-difluorobenzyldimethylethoxysilane, 3,4-difluorobenzyldiethylmethoxysilane, 3,4-difluorobenzyldiisopropylhydroxysilane;

2-(3,4-difluorophenyl)ethyltrimethoxysilane, 2-(3,4-difluorophenyl)ethyltriethoxysilane, 2-(3,4-difluorophenyl)ethyltripropoxysilane, 2-(3,4-difluorophenyl)ethyltriisopropoxysilane, 2-(3,4-difluorophenyl)ethylethoxydimethoxysilane, 2-(3,4-difluorophenyl)ethyldiethoxymethoxysilane, 2-(3,4-difluorophenyl)ethylisopropoxydimethoxysilane, 2-(3,4-difluorophenyl)ethyldiisopropoxymethoxysilane, 2-(3,4-difluorophenyl)ethyltriacetoxysilane, 2-(3,4-difluorophenyl)ethyltri(propanoyloxy)silane, 2-(3,4-difluorophenyl)ethylhydroxydimethoxysilane, 2-(3,4-difluorophenyl)ethylhydroxydiethoxysilane, 2-(3,4-difluorophenyl)ethylhydroxydiisopropoxysilane, 2-(3,4-difluorophenyl)ethyldihydroxymethoxysilane, 2-(3,4-difluorophenyl)ethyltrihydroxysilane, 2-(3,4-difluorophenyl)ethyl(methyl)dimethoxysilane, 2-(3,4-difluorophenyl)ethyl(methyl)diethoxysilane, 2-(3,4-difluorophenyl)ethyl(ethyl)dimethoxysilane, 2-(3,4-difluorophenyl)ethyldimethylmethoxysilane, 2-(3,4-difluorophenyl)ethyldimethylethoxysilane, 2-(3,4-difluorophenyl)ethyldiethylmethoxysilane, 2-(3,4-difluorophenyl)ethyldiisopropylhydroxysilane;

3-(3,4-difluorophenyl)propyltrimethoxysilane, 3-(3,4-difluorophenyl)propyltriethoxysilane, 3-(3,4-difluorophenyl)propyltripropoxysilane, 3-(3,4-difluorophenyl)propyltriisopropoxysilane, 3-(3,4-difluorophenyl)propylethoxydimethoxysilane, 3-(3,4-difluorophenyl)propyldiethoxymethoxysilane, 3-(3,4-difluorophenyl)propylisopropoxydimethoxysilane, 3-(3,4-difluorophenyl)propyldiisopropoxymethoxysilane, 3-(3,4-difluorophenyl)propyltriacetoxysilane, 3-(3,4-difluorophenyl)propyltri(propanoyloxy)silane, 3-(3,4-difluorophenyl)propylhydroxydimethoxysilane, 3-(3,4-difluorophenyl)propylhydroxydiethoxysilane, 3-(3,4-difluorophenyl)propylhydroxydiisopropoxysilane, 3-(3,4-difluorophenyl)propyldihydroxymethoxysilane, 3-(3,4-difluorophenyl)propyltrihydroxysilane, 3-(3,4-difluorophenyl)propyl(methyl)dimethoxysilane, 3-(3,4-difluorophenyl)propyl(methyl)diethoxysilane, 3-(3,4-difluorophenyl)propyl(ethyl)dimethoxysilane, 3-(3,4-difluorophenyl)propyldimethylmethoxysilane, 3-(3,4-difluorophenyl)propyldimethylethoxysilane, 3-(3,4-difluorophenyl)propyldiethylmethoxysilane, 3-(3,4-difluorophenyl)propyldiisopropylhydroxysilane;

4-(3,4-difluorophenyl)butyltrimethoxysilane, 4-(3,4-difluorophenyl)butyltriethoxysilane, 4-(3,4-difluorophenyl)butyltripropoxysilane, 4-(3,4-difluorophenyl)butyltriisopropoxysilane, 4-(3,4-difluorophenyl)butylethoxydimethoxysilane, 4-(3,4-difluorophenyl)butyldiethoxymethoxysilane, 4-(3,4-difluorophenyl)butylisopropoxydimethoxysilane, 4-(3,4-difluorophenyl)butyldiisopropoxymethoxysilane, 4-(3,4-difluorophenyl)butyltriacetoxysilane, 4-(3,4-difluorophenyl)butyltri(propanoyloxy)silane, 4-(3,4-difluorophenyl)butylhydroxydimethoxysilane, 4-(3,4-difluorophenyl)butylhydroxydiethoxysilane, 4-(3,4-difluorophenyl)butylhydroxydiisopropoxysilane, 4-(3,4-difluorophenyl)butyldihydroxymethoxysilane, 4-(3,4-difluorophenyl)butyltrihydroxysilane, 4-(3,4-difluorophenyl)butyl(methyl)dimethoxysilane, 4-(3,4-difluorophenyl)butyl(methyl)diethoxysilane, 4-(3,4-difluorophenyl)butyl(ethyl)dimethoxysilane, 4-(3,4-difluorophenyl)butyldimethylmethoxysilane, 4-(3,4-difluorophenyl)butyldimethylethoxysilane, 4-(3,4-difluorophenyl)butyldiethylmethoxysilane, 4-(3,4-difluorophenyl)butyldiisopropylhydroxysilane;

5-(3,4-difluorophenyl)pentyltrimethoxysilane, 5-(3,4-difluorophenyl)pentyltriethoxysilane, 5-(3,4-difluorophenyl)pentyltripropoxysilane, 5-(3,4-difluorophenyl)pentyltriisopropoxysilane, 5-(3,4-difluorophenyl)pentylethoxydimethoxysilane, 5-(3,4-difluorophenyl)pentyldiethoxymethoxysilane, 5-(3,4-difluorophenyl)pentylisopropoxydimethoxysilane, 5-(3,4-difluorophenyl)pentyldiisopropoxymethoxysilane, 5-(3,4-difluorophenyl)pentyltriacetoxysilane, 5-(3,4-difluorophenyl)pentyltri(propanoyloxy)silane, 5-(3,4-difluorophenyl)pentylhydroxydimethoxysilane, 5-(3,4-difluorophenyl)pentylhydroxydiethoxysilane, 5-(3,4-difluorophenyl)pentylhydroxydiisopropoxysilane, 5-(3,4-difluorophenyl)pentyldihydroxymethoxysilane, 5-(3,4-difluorophenyl)pentyltrihydroxysilane, 5-(3,4-difluorophenyl)pentyl (methyl)dimethoxysilane, 5-(3,4-difluorophenyl)pentyl (methyl)diethoxysilane, 5-(3,4-difluorophenyl)pentyl(ethyl) dimethoxysilane, 5-(3,4-difluorophenyl) pentyldimethylmethoxysilane, 5-(3,4-difluorophenyl) pentyldimethylethoxysilane, 5-(3,4-difluorophenyl) pentyldiethylmethoxysilane, 5-(3,4-difluorophenyl) pentyldiisopropylhydroxysilane;

6-(3,4-difluorophenyl)hexyltrimethoxysilane, 6-(3,4-difluorophenyl)hexyltriethoxysilane, 6-(3,4-difluorophenyl) hexyltripropoxysilane, 6-(3,4-difluorophenyl)hexyltriisopropoxysilane, 6-(3,4-difluorophenyl) hexylethoxydimethoxysilane, 6-(3,4-difluorophenyl) hexyldiethoxymethoxysilane, 6-(3,4-difluorophenyl) hexylisopropoxydimethoxysilane, 6-(3,4-difluorophenyl) hexyldiisopropoxymethoxysilane, 6-(3,4-difluorophenyl) hexyltriacetoxysilane, 6-(3,4-difluorophenyl)hexyltri (propanoyloxy)silane, 6-(3,4-difluorophenyl) hexylhydroxydimethoxysilane, 6-(3,4-difluorophenyl) hexylhydroxydiethoxysilane, 6-(3,4-difluorophenyl) hexylhydroxydiisopropoxysilane, 6-(3,4-difluorophenyl) hexyldihydroxymethoxysilane, 6-(3,4-difluorophenyl) hexyltrihydroxysilane, 6-(3,4-difluorophenyl)hexyl(methyl) dimethoxysilane, 6-(3,4-difluorophenyl)hexyl(methyl) diethoxysilane, 6-(3,4-difluorophenyl)hexyl(ethyl) dimethoxysilane, 6-(3,4-difluorophenyl) hexyldimethylmethoxysilane, 6-(3,4-difluorophenyl) hexyldimethylethoxysilane, 6-(3,4-difluorophenyl) hexyldiethylmethoxysilane, 6-(3,4-difluorophenyl) hexyldiisopropylhydroxysilane;

4-(3,4-difluorophenyl)phenyltrimethoxysilane, 4-(3,4-difluorophenyl)phenyltriethoxysilane, 4-(3,4-difluorophenyl) phenyltripropoxysilane, 4-(3,4-difluorophenyl)phenyltriisopropoxysilane, 4-(3,4-difluorophenyl) phenylethoxydimethoxysilane, 4-(3,4-difluorophenyl) phenyldiethoxymethoxysilane, 4-(3,4-difluorophenyl) phenylisopropoxydimethoxysilane, 4-(3,4-difluorophenyl) phenyldiisopropoxymethoxysilane, 4-(3,4-difluorophenyl) phenyltriacetoxysilane, 4-(3,4-difluorophenyl)phenyltri (propanoyloxy)silane, 4-(3,4-difluorophenyl) phenylhydroxydimethoxysilane, 4-(3,4-difluorophenyl) phenylhydroxydiethoxysilane, 4-(3,4-difluorophenyl) phenylhydroxydiisopropoxysilane, 4-(3,4-difluorophenyl) phenyldihydroxymethoxysilane, 4-(3,4-difluorophenyl) phenyltrihydroxysilane, 4-(3,4-difluorophenyl)phenyl (methyl)dimethoxysilane, 4-(3,4-difluorophenyl)phenyl (methyl)diethoxysilane, 4-(3,4-difluorophenyl)phenyl (ethyl)dimethoxysilane, 4-(3,4-difluorophenyl) phenyldimethylmethoxysilane, 4-(3,4-difluorophenyl) phenyldimethylethoxysilane, 4-(3,4-difluorophenyl) phenyldiethylmethoxysilane, 4-(3,4-difluorophenyl) phenyldiisopropylhydroxysilane;

3,5-difluorophenyltrimethoxysilane, 3,5-difluorophenyltriethoxysilane, 3,5-difluorophenyltripropoxysilane, 3,5-difluorophenyltriisopropoxysilane, 3,5-difluorophenylethoxydimethoxysilane, 3,5-difluorophenyldiethoxymethoxysilane, 3,5-difluorophenylisopropoxydimethoxysilane, 3,5-difluorophenyldiisopropoxymethoxysilane, 3,5-difluorophenyltriacetoxysilane, 3,5-difluorophenyltri (propanoyloxy)silane, 3,5-difluorophenylhydroxydimethoxysilane, 3,5-difluorophenylhydroxydiethoxysilane, 3,5-difluorophenylhydroxydiisopropoxysilane, 3,5-difluorophenyldihydroxymethoxysilane, 3,5-difluorophenyltrihydroxysilane, 3,5-difluorophenyl(methyl) dimethoxysilane, 3,5-difluorophenyl(methyl) diethoxysilane, 3,5-difluorophenyl(ethyl)dimethoxysilane, 3,5-difluorophenyldimethylmethoxysilane, 3,5-difluorophenyldimethylethoxysilane, 3,5-difluorophenyldiethylmethoxysilane, 3,5-difluorophenyldiisopropylhydroxysilane;

3,5-difluorobenzyltrimethoxysilane, 3,5-difluorobenzyltriethoxysilane, 3,5-difluorobenzyltripropoxysilane, 3,5-difluorobenzyltriisopropoxysilane, 3,5-difluorobenzylethoxydimethoxysilane, 3,5-difluorobenzyldiethoxymethoxysilane, 3,5-difluorobenzylisopropoxydimethoxysilane, 3,5-difluorobenzyldiisopropoxymethoxysilane, 3,5-difluorobenzyltriacetoxysilane, 3,5-difluorobenzyltri (propanoyloxy)silane, 3,5-difluorobenzylhydroxydimethoxysilane, 3,5-difluorobenzylhydroxydiethoxysilane, 3,5-difluorobenzylhydroxydiisopropoxysilane, 3,5-difluorobenzyldihydroxymethoxysilane, 3,5-difluorobenzyltrihydroxysilane, 3,5-difluorobenzil(methyl) dimethoxysilane, 3,5-difluorobenzil(methyl)diethoxysilane, 3,5-difluorobenzil(ethyl)dimethoxysilane, 3,5-difluorobenzyldimethylmethoxysilane, 3,5-difluorobenzyldimethylethoxysilane, 3,5-difluorobenzyldiethylmethoxysilane, 3,5-difluorobenzyldiisopropylhydroxysilane;

2-(3,5-difluorophenyl)ethyltrimethoxysilane, 2-(3,5-difluorophenyl)ethyltriethoxysilane, 2-(3,5-difluorophenyl) ethyltripropoxysilane, 2-(3,5-difluorophenyl)ethyltriisopropoxysilane, 2-(3,5-difluorophenyl) ethylethoxydimethoxysilane, 2-(3,5-difluorophenyl) ethyldiethoxymethoxysilane, 2-(3,5-difluorophenyl) ethylisopropoxydimethoxysilane, 2-(3,5-difluorophenyl) ethyldiisopropoxymethoxysilane, 2-(3,5-difluorophenyl) ethyltriacetoxysilane, 2-(3,5-difluorophenyl)ethyltri (propanoyloxy)silane, 2-(3,5-difluorophenyl) ethylhydroxydimethoxysilane, 2-(3,5-difluorophenyl) ethylhydroxydiethoxysilane, 2-(3,5-difluorophenyl) ethylhydroxydiisopropoxysilane, 2-(3,5-difluorophenyl) ethyldihydroxymethoxysilane, 2-(3,5-difluorophenyl) ethyltrihydroxysilane, 2-(3,5-difluorophenyl)ethyl(methyl) dimethoxysilane, 2-(3,5-difluorophenyl)ethyl(methyl) diethoxysilane, 2-(3,5-difluorophenyl)ethyl(ethyl) dimethoxysilane, 2-(3,5-difluorophenyl) ethyldimethylmethoxysilane, 2-(3,5-difluorophenyl) ethyldimethylethoxysilane, 2-(3,5-difluorophenyl) ethyldiethylmethoxysilane, 2-(3,5-difluorophenyl) ethyldiisopropylhydroxysilane;

3-(3,5-difluorophenyl)propyltrimethoxysilane, 3-(3,5-difluorophenyl)propyltriethoxysilane, 3-(3,5-difluorophenyl) propyltripropoxysilane, 3-(3,5-difluorophenyl)propyltriisopropoxysilane, 3-(3,5-difluorophenyl) propylethoxydimethoxysilane, 3-(3,5-difluorophenyl) propyldiethoxymethoxysilane, 3-(3,5-difluorophenyl) propylisopropoxydimethoxysilane, 3-(3,5-difluorophenyl) propyldiisopropoxymethoxysilane, 3-(3,5-difluorophenyl) propyltriacetoxysilane, 3-(3,5-difluorophenyl)propyltri (propanoyloxy)silane, 3-(3,5-difluorophenyl) propylhydroxydimethoxysilane, 3-(3,5-difluorophenyl) propylhydroxydiethoxysilane, 3-(3,5-difluorophenyl) propylhydroxydiisopropoxysilane, 3-(3,5-difluorophenyl) propyldihydroxymethoxysilane, 3-(3,5-difluorophenyl) propyltrihydroxysilane, 3-(3,5-difluorophenyl)propyl (methyl)dimethoxysilane, 3-(3,5-difluorophenyl)propyl (methyl)diethoxysilane, 3-(3,5-difluorophenyl)propyl (ethyl)dimethoxysilane, 3-(3,5-difluorophenyl) propyldimethylmethoxysilane, 3-(3,5-difluorophenyl) propyldimethylethoxysilane, 3-(3,5-difluorophenyl) propyldiethylmethoxysilane, 3-(3,5-difluorophenyl) propyldiisopropylhydroxysilane;

4-(3,5-difluorophenyl)butyltrimethoxysilane, 4-(3,5-difluorophenyl)butyltriethoxysilane, 4-(3,5-difluorophenyl)butyltripropoxysilane, 4-(3,5-difluorophenyl)butyltriisopropoxysilane, 4-(3,5-difluorophenyl)butylethoxydimethoxysilane, 4-(3,5-difluorophenyl)butyldiethoxymethoxysilane, 4-(3,5-difluorophenyl)butylisopropoxydimethoxysilane, 4-(3,5-difluorophenyl)butyldiisopropoxymethoxysilane, 4-(3,5-difluorophenyl)butyltriacetoxysilane, 4-(3,5-difluorophenyl)butyltri(propanoyloxy)silane, 4-(3,5-difluorophenyl)butylhydroxydimethoxysilane, 4-(3,5-difluorophenyl)butylhydroxydiethoxysilane, 4-(3,5-difluorophenyl)butylhydroxydiisopropoxysilane, 4-(3,5-difluorophenyl)butyldihydroxymethoxysilane, 4-(3,5-difluorophenyl)butyltrihydroxysilane, 4-(3,5-difluorophenyl)butyl(methyl)dimethoxysilane, 4-(3,5-difluorophenyl)butyl(methyl)diethoxysilane, 4-(3,5-difluorophenyl)butyl(ethyl)dimethoxysilane, 4-(3,5-difluorophenyl)butyldimethylmethoxysilane, 4-(3,5-difluorophenyl)butyldimethylethoxysilane, 4-(3,5-difluorophenyl)butyldiethylmethoxysilane, 4-(3,5-difluorophenyl)butyldiisopropylhydroxysilane;

5-(3,5-difluorophenyl)pentyltrimethoxysilane, 5-(3,5-difluorophenyl)pentyltriethoxysilane, 5-(3,5-difluorophenyl)pentyltripropoxysilane, 5-(3,5-difluorophenyl)pentyltriisopropoxysilane, 5-(3,5-difluorophenyl)pentylethoxydimethoxysilane, 5-(3,5-difluorophenyl)pentyldiethoxymethoxysilane, 5-(3,5-difluorophenyl)pentylisopropoxydimethoxysilane, 5-(3,5-difluorophenyl)pentyldiisopropoxymethoxysilane, 5-(3,5-difluorophenyl)pentyltriacetoxysilane, 5-(3,5-difluorophenyl)pentyltri(propanoyloxy)silane, 5-(3,5-difluorophenyl)pentylhydroxydimethoxysilane, 5-(3,5-difluorophenyl)pentylhydroxydiethoxysilane, 5-(3,5-difluorophenyl)pentylhydroxydiisopropoxysilane, 5-(3,5-difluorophenyl)pentyldihydroxymethoxysilane, 5-(3,5-difluorophenyl)pentyltrihydroxysilane, 5-(3,5-difluorophenyl)pentyl(methyl)dimethoxysilane, 5-(3,5-difluorophenyl)pentyl(methyl)diethoxysilane, 5-(3,5-difluorophenyl)pentyl(ethyl)dimethoxysilane, 5-(3,5-difluorophenyl)pentyldimethylmethoxysilane, 5-(3,5-difluorophenyl)pentyldimethylethoxysilane, 5-(3,5-difluorophenyl)pentyldiethylmethoxysilane, 5-(3,5-difluorophenyl)pentyldiisopropylhydroxysilane;

6-(3,5-difluorophenyl)hexyltrimethoxysilane, 6-(3,5-difluorophenyl)hexyltriethoxysilane, 6-(3,5-difluorophenyl)hexyltripropoxysilane, 6-(3,5-difluorophenyl)hexyltriisopropoxysilane, 6-(3,5-difluorophenyl)hexylethoxydimethoxysilane, 6-(3,5-difluorophenyl)hexyldiethoxymethoxysilane, 6-(3,5-difluorophenyl)hexylisopropoxydimethoxysilane, 6-(3,5-difluorophenyl)hexyldiisopropoxymethoxysilane, 6-(3,5-difluorophenyl)hexyltriacetoxysilane, 6-(3,5-difluorophenyl)hexyltri(propanoyloxy)silane, 6-(3,5-difluorophenyl)hexylhydroxydimethoxysilane, 6-(3,5-difluorophenyl)hexylhydroxydiethoxysilane, 6-(3,5-difluorophenyl)hexylhydroxydiisopropoxysilane, 6-(3,5-difluorophenyl)hexyldihydroxymethoxysilane, 6-(3,5-difluorophenyl)hexyltrihydroxysilane, 6-(3,5-difluorophenyl)hexyl(methyl)dimethoxysilane, 6-(3,5-difluorophenyl)hexyl(methyl)diethoxysilane, 6-(3,5-difluorophenyl)hexyl(ethyl)dimethoxysilane, 6-(3,5-difluorophenyl)hexyldimethylmethoxysilane, 6-(3,5-difluorophenyl)hexyldimethylethoxysilane, 6-(3,5-difluorophenyl)hexyldiethylmethoxysilane, 6-(3,5-difluorophenyl)hexyldiisopropylhydroxysilane;

4-(3,5-difluorophenyl)phenyltrimethoxysilane, 4-(3,5-difluorophenyl)phenyltriethoxysilane, 4-(3,5-difluorophenyl)phenyltripropoxysilane, 4-(3,5-difluorophenyl)phenyltriisopropoxysilane, 4-(3,5-difluorophenyl)phenylethoxydimethoxysilane, 4-(3,5-difluorophenyl)phenyldiethoxymethoxysilane, 4-(3,5-difluorophenyl)phenylisopropoxydimethoxysilane, 4-(3,5-difluorophenyl)phenyldiisopropoxymethoxysilane, 4-(3,5-difluorophenyl)phenyltriacetoxysilane, 4-(3,5-difluorophenyl)phenyltri(propanoyloxy)silane, 4-(3,5-difluorophenyl)phenylhydroxydimethoxysilane, 4-(3,5-difluorophenyl)phenylhydroxydiethoxysilane, 4-(3,5-difluorophenyl)phenylhydroxydiisopropoxysilane, 4-(3,5-difluorophenyl)phenyldihydroxymethoxysilane, 4-(3,5-difluorophenyl)phenyltrihydroxysilane, 4-(3,5-difluorophenyl)phenyl(methyl)dimethoxysilane, 4-(3,5-difluorophenyl)phenyl(methyl)diethoxysilane, 4-(3,5-difluorophenyl)phenyl(ethyl)dimethoxysilane, 4-(3,5-difluorophenyl)phenyldimethylmethoxysilane, 4-(3,5-difluorophenyl)phenyldimethylethoxysilane, 4-(3,5-difluorophenyl)phenyldiethylmethoxysilane, 4-(3,5-difluorophenyl)phenyldiisopropylhydroxysilane;

3-fluorophenyltrimethoxysilane, 3-fluorophenyltriethoxysilane, 3-fluorophenyltripropoxysilane, 3-fluorophenyltriisopropoxysilane, 3-fluorophenylethoxydimethoxysilane, 3-fluorophenyldiethoxymethoxysilane, 3-fluorophenylisopropoxydimethoxysilane, 3-fluorophenyldiisopropoxymethoxysilane, 3-fluorophenyltriacetoxysilane, 3-fluorophenyltri(propanoyloxy)silane, 3-fluorophenylhydroxydimethoxysilane, 3-fluorophenylhydroxydiethoxysilane, 3-fluorophenylhydroxydiisopropoxysilane, 3-fluorophenyldihydroxymethoxysilane, 3-fluorophenyltrihydroxysilane, 3-fluorophenylmethyl)dimethoxysilane, 3-fluorophenyl(methyl)diethoxysilane, 3-fluorophenyl(ethyl)dimethoxysilane, 3-fluorophenyldimethylmethoxysilane, 3-fluorophenyldimethylethoxysilane, 3-fluorophenyldiethylmethoxysilane, 3-fluorophenyldiisopropylhydroxysilane;

3-fluorobenzyltrimethoxysilane, 3-fluorobenzyltriethoxysilane, 3-fluorobenzyltripropoxysilane, 3-fluorobenzyltriisopropoxysilane, 3-fluorobenzylethoxydimethoxysilane, 3-fluorobenzyldiethoxymethoxysilane, 3-fluorobenzylisopropoxydimethoxysilane, 3-fluorobenzyldiisopropoxymethoxysilane, 3-fluorobenzyltriacetoxysilane, 3-fluorobenzyltri(propanoyloxy)silane, 3-fluorobenzylhydroxydimethoxysilane, 3-fluorobenzylhydroxydiethoxysilane, 3-fluorobenzylhydroxydiisopropoxysilane, 3-fluorobenzyldihydroxymethoxysilane, 3-fluorobenzyltrihydroxysilane, 3-fluorobenzylmethyl)dimethoxysilane, 3-fluorobenzyl(methyl)diethoxysilane, 3-fluorobenzyl(ethyl)dimethoxysilane, 3-fluorobenzyldimethylmethoxysilane, 3-fluorobenzyldimethylethoxysilane, 3-fluorobenzyldiethylmethoxysilane, 3-fluorobenzyldiisopropylhydroxysilane;

2-(3-fluorophenyl)ethyltrimethoxysilane, 2-(3-fluorophenyl)ethyltriethoxysilane, 2-(3-fluorophenyl)ethyltripropoxysilane, 2-(3-fluorophenyl)ethyltriisopropoxysilane, 2-(3-fluorophenyl)ethylethoxydimethoxysilane, 2-(3-fluorophenyl)ethyldiethoxymethoxysilane, 2-(3-fluorophenyl)ethylisopropoxydimethoxysilane, 2-(3-fluorophenyl)ethyldiisopropoxymethoxysilane, 2-(3-fluorophenyl)ethyltriacetoxysilane, 2-(3-fluorophenyl)ethyltri(propanoyloxy)silane, 2-(3-fluorophenyl)ethylhydroxydimethoxysilane, 2-(3-fluorophenyl)ethylhydroxydiethoxysilane, 2-(3-fluorophenyl)ethylhydroxydiisopropoxysilane, 2-(3-fluorophenyl)ethyldihydroxymethoxysilane, 2-(3-fluorophenyl)

ethyltrihydroxysilane, 2-(3-fluorophenyl)ethyl(methyl)dimethoxysilane, 2-(3-fluorophenyl)ethyl(methyl)diethoxysilane, 2-(3-fluorophenyl)ethyl(ethyl)dimethoxysilane, 2-(3-fluorophenyl)ethyldimethylmethoxysilane, 2-(3-fluorophenyl)ethyldimethylethoxysilane, 2-(3-fluorophenyl)ethyldiethylmethoxysilane, 2-(3-fluorophenyl)ethyldiisopropylhydroxysilane;

3-(3-fluorophenyl)propyltrimethoxysilane, 3-(3-fluorophenyl)propyltriethoxysilane, 3-(3-fluorophenyl)propyltripropoxysilane, 3-(3-fluorophenyl)propyltriisopropoxysilane, 3-(3-fluorophenyl)propylethoxydimethoxysilane, 3-(3-fluorophenyl)propyldiethoxymethoxysilane, 3-(3-fluorophenyl)propylisopropoxydimethoxysilane, 3-(3-fluorophenyl)propyldiisopropoxymethoxysilane, 3-(3-fluorophenyl)propyltriacetoxysilane, 3-(3-fluorophenyl)propyltri(propanoyloxy)silane, 3-(3-fluorophenyl)propylhydroxydimethoxysilane, 3-(3-fluorophenyl)propylhydroxydiethoxysilane, 3-(3-fluorophenyl)propylhydroxydiisopropoxysilane, 3-(3-fluorophenyl)propyldihydroxymethoxysilane, 3-(3-fluorophenyl)propyltrihydroxysilane, 3-(3-fluorophenyl)propyl(methyl)dimethoxysilane, 3-(3-fluorophenyl)propyl(methyl)diethoxysilane, 3-(3-fluorophenyl)propyl(ethyl)dimethoxysilane, 3-(3-fluorophenyl)propyldimethylmethoxysilane, 3-(3-fluorophenyl)propyldimethylethoxysilane, 3-(3-fluorophenyl)propyldiethylmethoxysilane, 3-(3-fluorophenyl)propyldiisopropylhydroxysilane;

4-(3-fluorophenyl)butyltrimethoxysilane, 4-(3-fluorophenyl)butyltriethoxysilane, 4-(3-fluorophenyl)butyltripropoxysilane, 4-(3-fluorophenyl)butyltriisopropoxysilane, 4-(3-fluorophenyl)butylethoxydimethoxysilane, 4-(3-fluorophenyl)butyldiethoxymethoxysilane, 4-(3-fluorophenyl)butylisopropoxydimethoxysilane, 4-(3-fluorophenyl)butyldiisopropoxymethoxysilane, 4-(3-fluorophenyl)butyltriacetoxysilane, 4-(3-fluorophenyl)butyltri(propanoyloxy)silane, 4-(3-fluorophenyl)butylhydroxydimethoxysilane, 4-(3-fluorophenyl)butylhydroxydiethoxysilane, 4-(3-fluorophenyl)butylhydroxydiisopropoxysilane, 4-(3-fluorophenyl)butyldihydroxymethoxysilane, 4-(3-fluorophenyl)butyltrihydroxysilane, 4-(3-fluorophenyl)butyl(methyl)dimethoxysilane, 4-(3-fluorophenyl)butyl(methyl)diethoxysilane, 4-(3-fluorophenyl)butyl(ethyl)dimethoxysilane, 4-(3-fluorophenyl)butyldimethylmethoxysilane, 4-(3-fluorophenyl)butyldimethylethoxysilane, 4-(3-fluorophenyl)butyldiethylmethoxysilane, 4-(3-fluorophenyl)butyldiisopropylhydroxysilane;

5-(3-fluorophenyl)pentyltrimethoxysilane, 5-(3-fluorophenyl)pentyltriethoxysilane, 5-(3-fluorophenyl)pentyltripropoxysilane, 5-(3-fluorophenyl)pentyltriisopropoxysilane, 5-(3-fluorophenyl)pentylethoxydimethoxysilane, 5-(3-fluorophenyl)pentyldiethoxymethoxysilane, 5-(3-fluorophenyl)pentylisopropoxydimethoxysilane, 5-(3-fluorophenyl)pentyldiisopropoxymethoxysilane, 5-(3-fluorophenyl)pentyltriacetoxysilane, 5-(3-fluorophenyl)pentyltri(propanoyloxy)silane, 5-(3-fluorophenyl)pentylhydroxydimethoxysilane, 5-(3-fluorophenyl)pentylhydroxydiethoxysilane, 5-(3-fluorophenyl)pentylhydroxydiisopropoxysilane, 5-(3-fluorophenyl)pentyldihydroxymethoxysilane, 5-(3-fluorophenyl)pentyltrihydroxysilane, 5-(3-fluorophenyl)pentyl(methyl)dimethoxysilane, 5-(3-fluorophenyl)pentyl(methyl)diethoxysilane, 5-(3-fluorophenyl)pentyl(ethyl)dimethoxysilane, 5-(3-fluorophenyl)pentyldimethylmethoxysilane, 5-(3-fluorophenyl)pentyldimethylethoxysilane, 5-(3-fluorophenyl)pentyldiethylmethoxysilane, 5-(3-fluorophenyl)pentyldiisopropylhydroxysilane;

6-(3-fluorophenyl)hexyltrimethoxysilane, 6-(3-fluorophenyl)hexyltriethoxysilane, 6-(3-fluorophenyl)hexyltripropoxysilane, 6-(3-fluorophenyl)hexyltriisopropoxysilane, 6-(3-fluorophenyl)hexylethoxydimethoxysilane, 6-(3-fluorophenyl)hexyldiethoxymethoxysilane, 6-(3-fluorophenyl)hexylisopropoxydimethoxysilane, 6-(3-fluorophenyl)hexyldiisopropoxymethoxysilane, 6-(3-fluorophenyl)hexyltriacetoxysilane, 6-(3-fluorophenyl)hexyltri(propanoyloxy)silane, 6-(3-fluorophenyl)hexylhydroxydimethoxysilane, 6-(3-fluorophenyl)hexylhydroxydiethoxysilane, 6-(3-fluorophenyl)hexylhydroxydiisopropoxysilane, 6-(3-fluorophenyl)hexyldihydroxymethoxysilane, 6-(3-fluorophenyl)hexyltrihydroxysilane, 6-(3-fluorophenyl)hexyl(methyl)dimethoxysilane, 6-(3-fluorophenyl)hexyl(methyl)diethoxysilane, 6-(3-fluorophenyl)hexyl(ethyl)dimethoxysilane, 6-(3-fluorophenyl)hexyldimethylmethoxysilane, 6-(3-fluorophenyl)hexyldimethylethoxysilane, 6-(3-fluorophenyl)hexyldiethylmethoxysilane, 6-(3-fluorophenyl)hexyldiisopropylhydroxysilane;

4-(3-fluorophenyl)phenyltrimethoxysilane, 4-(3-fluorophenyl)phenyltriethoxysilane, 4-(3-fluorophenyl)phenyltripropoxysilane, 4-(3-fluorophenyl)phenyltriisopropoxysilane, 4-(3-fluorophenyl)phenylethoxydimethoxysilane, 4-(3-fluorophenyl)phenyldiethoxymethoxysilane, 4-(3-fluorophenyl)phenylisopropoxydimethoxysilane, 4-(3-fluorophenyl)phenyldiisopropoxymethoxysilane, 4-(3-fluorophenyl)phenyltriacetoxysilane, 4-(3-fluorophenyl)phenyltri(propanoyloxy)silane, 4-(3-fluorophenyl)phenylhydroxydimethoxysilane, 4-(3-fluorophenyl)phenylhydroxydiethoxysilane, 4-(3-fluorophenyl)phenylhydroxydiisopropoxysilane, 4-(3-fluorophenyl)phenyldihydroxymethoxysilane, 4-(3-fluorophenyl)phenyltrihydroxysilane, 4-(3-fluorophenyl)phenyl(methyl)dimethoxysilane, 4-(3-fluorophenyl)phenyl(methyl)diethoxysilane, 4-(3-fluorophenyl)phenyl(ethyl)dimethoxysilane, 4-(3-fluorophenyl)phenyldimethylmethoxysilane, 4-(3-fluorophenyl)phenyldimethylethoxysilane, 4-(3-fluorophenyl)phenyldiethylmethoxysilane, 4-(3-fluorophenyl)phenyldiisopropylhydroxysilane;

4-fluorophenyltrimethoxysilane, 4-fluorophenyltriethoxysilane, 4-fluorophenyltripropoxysilane, 4-fluorophenyltriisopropoxysilane, 4-fluorophenylethoxydimethoxysilane, 4-fluorophenyldiethoxymethoxysilane, 4-fluorophenylisopropoxydimethoxysilane, 4-fluorophenyldiisopropoxymethoxysilane, 4-fluorophenyltriacetoxysilane, 4-fluorophenyltri(propanoyloxy)silane, 4-fluorophenylhydroxydimethoxysilane, 4-fluorophenylhydroxydiethoxysilane, 4-fluorophenylhydroxydiisopropoxysilane, 4-fluorophenyldihydroxymethoxysilane, 4-fluorophenyltrihydroxysilane, 4-fluorophenyl(methyl)dimethoxysilane, 4-fluorophenyl(methyl)diethoxysilane, 4-fluorophenyl(ethyl)dimethoxysilane, 4-fluorophenyldimethylmethoxysilane, 4-fluorophenyldimethylethoxysilane, 4-fluorophenyldiethylmethoxysilane, 4-fluorophenyldiisopropylhydroxysilane;

4-fluorobenzyltrimethoxysilane, 4-fluorobenzyltriethoxysilane, 4-fluorobenzyltripropoxysilane, 4-fluorobenzyltriisopropoxysilane, 4-fluorobenzylethoxydimethoxysilane, 4-fluorobenzyldiethoxymethoxysilane, 4-fluorobenzylisopropoxydimethoxysilane, 4-fluorobenzyldiisopropoxymethoxysilane, 4-fluorobenzyltriacetoxysilane, 4-fluorobenzyltri(propanoyloxy)silane, 4-fluorobenzylhydroxydimethoxysilane, 4-fluorobenzylhydroxydiethoxysilane, 4-fluorobenzylhydroxydiisopropoxysilane, 4-fluorobenzyldihydroxymethoxysilane, 4-fluorobenzyltrihydroxysilane, 4-fluorobenzyl(methyl)dimethoxysilane, 4-fluorobenzyl(methyl)diethoxysilane, 4-fluorobenzyl(ethyl)dimethoxysilane, 4-fluorobenzyldimethylmethoxysilane, 4-fluorobenzyldimethylethoxysilane, 4-fluorobenzyldiethylmethoxysilane, 4-fluorobenzyldiisopropylhydroxysilane;

2-(4-fluorophenyl)ethyltrimethoxysilane, 2-(4-fluorophenyl)ethyltriethoxysilane, 2-(4-fluorophenyl)ethyltripropoxysilane, 2-(4-fluorophenyl)ethyltriisopropoxysilane, 2-(4-fluorophenyl)ethylethoxydimethoxysilane, 2-(4-fluorophenyl)ethyldiethoxymethoxysilane, 2-(4-fluorophenyl)ethylisopropoxydimethoxysilane, 2-(4-fluorophenyl)ethyldiisopropoxymethoxysilane, 2-(4-fluorophenyl)ethyltriacetoxysilane, 2-(4-fluorophenyl)ethyltri(propanoyloxy)silane, 2-(4-fluorophenyl)ethylhydroxydimethoxysilane, 2-(4-fluorophenyl)ethylhydroxydiethoxysilane, 2-(4-fluorophenyl)ethylhydroxydiisopropoxysilane, 2-(4-fluorophenyl)ethyldihydroxymethoxysilane, 2-(4-fluorophenyl)ethyltrihydroxysilane, 2-(4-fluorophenyl)ethyl(methyl)dimethoxysilane, 2-(4-fluorophenyl)ethyl(methyl)diethoxysilane, 2-(4-fluorophenyl)ethyl(ethyl)dimethoxysilane, 2-(4-fluorophenyl)ethyldimethylmethoxysilane, 2-(4-fluorophenyl)ethyldimethylethoxysilane, 2-(4-fluorophenyl)ethyldiethylmethoxysilane, 2-(4-fluorophenyl)ethyldiisopropylhydroxysilane;

3-(4-fluorophenyl)propyltrimethoxysilane, 3-(4-fluorophenyl)propyltriethoxysilane, 3-(4-fluorophenyl)propyltripropoxysilane, 3-(4-fluorophenyl)propyltriisopropoxysilane, 3-(4-fluorophenyl)propylethoxydimethoxysilane, 3-(4-fluorophenyl)propyldiethoxymethoxysilane, 3-(4-fluorophenyl)propylisopropoxydimethoxysilane, 3-(4-fluorophenyl)propyldiisopropoxymethoxysilane, 3-(4-fluorophenyl)propyltriacetoxysilane, 3-(4-fluorophenyl)propyltri(propanoyloxy)silane, 3-(4-fluorophenyl)propylhydroxydimethoxysilane, 3-(4-fluorophenyl)propylhydroxydiethoxysilane, 3-(4-fluorophenyl)propylhydroxydiisopropoxysilane, 3-(4-fluorophenyl)propyldihydroxymethoxysilane, 3-(4-fluorophenyl)propyltrihydroxysilane, 3-(4-fluorophenyl)propyl(methyl)dimethoxysilane, 3-(4-fluorophenyl)propyl(methyl)diethoxysilane, 3-(4-fluorophenyl)propyl(ethyl)dimethoxysilane, 3-(4-fluorophenyl)propyldimethylmethoxysilane, 3-(4-fluorophenyl)propyldimethylethoxysilane, 3-(4-fluorophenyl)propyldiethylmethoxysilane, 3-(4-fluorophenyl)propyldiisopropylhydroxysilane;

4-(4-fluorophenyl)butyltrimethoxysilane, 4-(4-fluorophenyl)butyltriethoxysilane, 4-(4-fluorophenyl)butyltripropoxysilane, 4-(4-fluorophenyl)butyltriisopropoxysilane, 4-(4-fluorophenyl)butylethoxydimethoxysilane, 4-(4-fluorophenyl)butyldiethoxymethoxysilane, 4-(4-fluorophenyl)butylisopropoxydimethoxysilane, 4-(4-fluorophenyl)butyldiisopropoxymethoxysilane, 4-(4-fluorophenyl)butyltriacetoxysilane, 4-(4-fluorophenyl)butyltri(propanoyloxy)silane, 4-(4-fluorophenyl)butylhydroxydimethoxysilane, 4-(4-fluorophenyl)butylhydroxydiethoxysilane, 4-(4-fluorophenyl)butylhydroxydiisopropoxysilane, 4-(4-fluorophenyl)butyldihydroxymethoxysilane, 4-(4-fluorophenyl)butyltrihydroxysilane, 4-(4-fluorophenyl)butyl(methyl)dimethoxysilane, 4-(4-fluorophenyl)butyl(methyl)diethoxysilane, 4-(4-fluorophenyl)butyl(ethyl)dimethoxysilane, 4-(4-fluorophenyl)butyldimethylmethoxysilane, 4-(4-fluorophenyl)butyldimethylethoxysilane, 4-(4-fluorophenyl)butyldiethylmethoxysilane, 4-(4-fluorophenyl)butyldiisopropylhydroxysilane;

5-(4-fluorophenyl)pentyltrimethoxysilane, 5-(4-fluorophenyl)pentyltriethoxysilane, 5-(4-fluorophenyl)pentyltripropoxysilane, 5-(4-fluorophenyl)pentyltriisopropoxysilane, 5-(4-fluorophenyl)pentylethoxydimethoxysilane, 5-(4-fluorophenyl)pentyldiethoxymethoxysilane, 5-(4-fluorophenyl)pentylisopropoxydimethoxysilane, 5-(4-fluorophenyl)pentyldiisopropoxymethoxysilane, 5-(4-fluorophenyl)pentyltriacetoxysilane, 5-(4-fluorophenyl)pentyltri(propanoyloxy)silane, 5-(4-fluorophenyl)pentylhydroxydimethoxysilane, 5-(4-fluorophenyl)pentylhydroxydiethoxysilane, 5-(4-fluorophenyl)pentylhydroxydiisopropoxysilane, 5-(4-fluorophenyl)pentyldihydroxymethoxysilane, 5-(4-fluorophenyl)pentyltrihydroxysilane, 5-(4-fluorophenyl)pentyl(methyl)dimethoxysilane, 5-(4-fluorophenyl)pentyl(methyl)diethoxysilane, 5-(4-fluorophenyl)pentyl(ethyl)dimethoxysilane, 5-(4-fluorophenyl)pentyldimethylmethoxysilane, 5-(4-fluorophenyl)pentyldimethylethoxysilane, 5-(4-fluorophenyl)pentyldiethylmethoxysilane, 5-(4-fluorophenyl)pentyldiisopropylhydroxysilane;

6-(4-fluorophenyl)hexyltrimethoxysilane, 6-(4-fluorophenyl)hexyltriethoxysilane, 6-(4-fluorophenyl)hexyltripropoxysilane, 6-(4-fluorophenyl)hexyltriisopropoxysilane, 6-(4-fluorophenyl)hexylethoxydimethoxysilane, 6-(4-fluorophenyl)hexyldiethoxymethoxysilane, 6-(4-fluorophenyl)hexylisopropoxydimethoxysilane, 6-(4-fluorophenyl)hexyldiisopropoxymethoxysilane, 6-(4-fluorophenyl)hexyltriacetoxysilane, 6-(4-fluorophenyl)hexyltri(propanoyloxy)silane, 6-(4-fluorophenyl)hexylhydroxydimethoxysilane, 6-(4-fluorophenyl)hexylhydroxydiethoxysilane, 6-(4-fluorophenyl)hexylhydroxydiisopropoxysilane, 6-(4-fluorophenyl)hexyldihydroxymethoxysilane, 6-(4-fluorophenyl)hexyltrihydroxysilane, 6-(4-fluorophenyl)hexyl(methyl)dimethoxysilane, 6-(4-fluorophenyl)hexyl(methyl)diethoxysilane, 6-(4-fluorophenyl)hexyl(ethyl)dimethoxysilane, 6-(4-fluorophenyl)hexyldimethylmethoxysilane, 6-(4-fluorophenyl)hexyldimethylethoxysilane, 6-(4-fluorophenyl)hexyldiethylmethoxysilane, 6-(4-fluorophenyl)hexyldiisopropylhydroxysilane;

4-(4-fluorophenyl)phenyltrimethoxysilane, 4-(4-fluorophenyl)phenyltriethoxysilane, 4-(4-fluorophenyl)phenyltripropoxysilane, 4-(4-fluorophenyl)phenyltriisopropoxysilane, 4-(4-fluorophenyl)phenylethoxydimethoxysilane, 4-(4-fluorophenyl)phenyldiethoxymethoxysilane, 4-(4-fluorophenyl)phenylisopropoxydimethoxysilane, 4-(4-fluorophenyl)phenyldiisopropoxymethoxysilane, 4-(4-fluorophenyl)phenyltriacetoxysilane, 4-(4-fluorophenyl)phenyltri(propanoyloxy)silane, 4-(4-fluorophenyl)phenylhydroxydimethoxysilane, 4-(4-fluorophenyl)phenylhydroxydiethoxysilane, 4-(4-fluorophenyl)phenylhydroxydiisopropoxysilane, 4-(4-fluorophenyl)phenyldihydroxymethoxysilane, 4-(4-fluorophenyl)phenyltrihydroxysilane, 4-(4-fluorophenyl)phenyl(methyl)dimethoxysilane, 4-(4-fluorophenyl)phenyl(methyl)diethoxysilane, 4-(4-fluorophenyl)phenyl(ethyl)dimethoxysilane, 4-(4-fluorophenyl)phenyldimethylmethoxysilane, 4-(4-fluorophenyl)

phenyldimethylethoxysilane, 4-(4-fluorophenyl)phenyldiethylmethoxysilane, 4-(4-fluorophenyl)phenyldiisopropylhydroxysilane.

Among the above-described compounds, from a viewpoint of heat resistance and durability of the surface modified layer, a compound wherein X in General Formula (1) is a single bond and A is a straight chain divalent hydrocarbon group, or a compound wherein X is a single bond and A is an aromatic divalent hydrocarbon group is preferred. Additionally, a compound wherein n is 3, and $R^2$ is a monovalent hydrocarbon group, in particular, $R^2$ is a methyl group or an ethyl group, and particularly, a compound wherein n is 2, $R^1$ is a methyl group, and $R^2$ is a monovalent hydrocarbon group, in particular, $R^2$ is a methyl group or an ethyl group, are preferably used. This is from a viewpoint that the balance between the stability of the compound of General Formula (1) and the reactivity of the electrode surface is good. Additionally, from a viewpoint of regulating coverage of surface modifiers described in detail below, it can be said that generally, the more bulky the substituent A and/or $R^1$, the lower the coverage can be, and the less bulky the substituent A and/or $R^1$, the higher the coverage can be. Thus, from a viewpoint of increasing the coverage, a non-bulky substituent can be selected as A and/or $R^1$.

A surface modifier according to this embodiment comprises the above described compound having a reactive silyl group represented by General Formula (1) as a main ingredient. The main ingredient may be composed of only one among the above described compounds having a reactive silyl group represented by General Formula (1), or two or more compounds may be mixed in combination to form the main ingredient. In the case in which two or more compounds are combined, the combination is optional. For example, compounds can be combined, from a viewpoint of achieving desired physical properties of the electrode surface by combining several modifiers different in characteristics, such as compounds with different values of work function and surface free energy, compounds with bonding densities to the electrode surface different from that of the surface modifier, compounds having a reaction rate with the electrode surface different from that of the modifier, and compounds having modifier molecules different in size and length in the case in which the surface has been modified with one compound alone. The combinations include, for example, but not limited to, 3-(pentafluorophenyl)propyltrimethoxysilane and 3-(4-fluorophenyl)propyltrimethoxysilane, 2-(pentafluorophenyl)ethyltrimethoxysilane and 3-(4-fluorophenyl)propyltrimethoxysilane, 3-(pentafluorophenyl)propyltriethoxysilane and 3-(2,4-difluorophenyl)propyltrimethoxysilane, 3-(pentafluorophenyl)propyltrimethoxysilane and 3-(4-fluorophenyl)propyldimethylmethoxysilane, 3-(4-fluorophenyl)propyltrimethoxysilane and 3-(pentafluorophenyl)propyl(methyl)dimethoxysilane, 3-(4-trifluoromethylphenyl)propyltrimethoxysilane and 3-(4-fluorophenylpropyl)trimethoxysilane, 6-(pentafluorophenyl)hexyltrimethoxysilane and 3-(3,4,5-trifluorophenyl)propyltrimethoxysilane, and 3-(pentafluorophenyl)propyltrimethoxysilane and 3-(pentafluorophenyl)propyldimethoxydihydroxysilane and 3-(pentafluorophenyl)propylmethoxydihydroxysilane.

A surface modifier according to this embodiment may be composed of a main ingredient only, not including other ingredients. In this case, the probability of a compound comprising a reactive silyl group represented by General Formula (1), which is the main ingredient, coming in contact and reacting with the electrode surface is maximized. In particular, it is preferable that the surface modifier does not contain water or low-volatile ionic compounds, which may result in self-polycondensation of the surface modifier before use. However, as long as the work function and the surface free energy can be maintained at appropriate values without inhibiting formation of self-assembled monolayers, the surface modifier is not prevented from containing other ingredients. The surface modifier may include solvents, such as toluene, tetrahydrofuran, ethanol, methanol, hexafluoro-2-propanol, and chloroform. In this case, the amount of the solvents can be, for example, 5 to 100,000 times of, preferably 10 to 10,000 times of the mass of the surface modifier. These solvents may be lost in the surface modification process described below, and not remain as ingredients of the self-assembled monolayer in the end.

In addition, as additives to enhance the reactivity of the surface modifier to the electrode surface, acids such as acetic acid and nitric acid and bases such as triethylamine, which are used for preparing solutions of silane coupling agents in the known art, can be added as catalysts in a proportion of, preferably 5% by mass, more preferably 0.1 to 1% by mass. In the case in which catalysts are added, it is preferable to use catalysts composed of volatile substances that can be easily removed from the electrode surface after modification.

Now, a method for producing a surface modifier according to this embodiment is described. The method for producing a surface modifier according to this embodiment includes steps of: providing a compound containing a reactive silyl group represented by General Formula (1), which is a main ingredient, and optionally mixing a plurality of compounds constituting the main ingredient and additives.

Some of the compounds containing a reactive silyl group represented by General Formula (1), which are the main ingredient, are commercially available. Thus, such commercially available compounds can be the main ingredient as it is or after purification, as appropriate. Alternatively, in accordance with the prior art references, those skilled in the art can synthesize these compounds, which can be purified to the extent required for surface modifiers, for example, 99% or more to provide the main ingredient.

The surface modifier according to the present invention can be used in a method for surface modifying a transparent oxide electrode. In this context, the method for surface-modifying a transparent oxide electrode can be also referred to as a method for producing a surface-modified transparent oxide electrode. The method for producing a surface-modified transparent oxide electrode will be described below.

That is, the present invention, according to yet another embodiment, includes a method for producing a surface-modified transparent oxide electrode using the above described surface modifier comprising steps of: contacting a surface modifier with a surface of a transparent oxide electrode, and thereby obtaining a surface-modified transparent oxide electrode. There may be optionally provided a step of activating the surface of the transparent oxide electrode before the contacting step, and a step of removing extra surface modifier and removing moisture on the surface-modified electrode surface after the contacting step.

In the method for producing a surface-modified transparent oxide electrode according to this embodiment, the production method is performed by surface modification of the surface of the transparent oxide electrode. Generally, the surface of a transparent oxide electrode used in organic EL devices can be modified. Examples of the transparent conductive oxides forming a transparent oxide electrode include, but are not limited to, fluorine-doped tin oxides, aluminum-doped zinc oxides, indium-doped zinc oxides, gallium-doped zinc oxides, tin-doped indium oxides, and niobium-doped titanium oxides. Particularly preferred transparent oxide electrodes are tin-doped indium oxides (ITO).

The method for producing a surface-modified transparent oxide electrode according to the present invention is performed with a step of contacting at least one of surface modifiers comprising a reactive silyl group represented by General Formula (1) with the surface of the above described transparent oxide electrode. This step is hereinafter referred to as "the contacting step". Contacting methods are optional, and may include a method in which a surface modifier or its solution is brought into contact with a transparent oxide electrode in a liquid phase and a method in which vapor of a surface modifier is brought into contact with a transparent oxide electrode in a gas phase. The latter gas phase method is more preferred, in that impurities are difficult to contaminate compared to the former liquid phase method, and additionally in that growing of coarse particles due to self-polycondensation of the surface modifier is difficult to progress. The coarse particles attached on the modified surface of the transparent oxide electrode may adversely affect the performance of a device using the electrode. The presence of the coarse particles can be detected with a root mean square (RMS) surface roughness observed using an atomic force microscope (AFM) detailed in the following.

The temperature of the surface modifier in performing the contacting step in a liquid phase can be set in a range of about 0 to 250° C. The temperature is preferably about 15 to 80° C., and is more preferably about 20 to 60° C. In the case in which the contacting step is performed in a gas phase, the temperature and the pressure are set such that the vapor pressure of the surface modifier is preferably 0.01 Pa or higher, more preferably 0.1 Pa or higher.

The amount of a surface modifier used in the contacting step is preferably $1 \times 10^{-6}$ to 10 mol, more preferably $1 \times 10^{-5}$ to 5 mol, and further preferably $1 \times 10^{-4}$ to 3 mol per 1 $m^2$ of the surface area of an electrode to be modified. Use of a large excess of a surface modifier is preferred from a viewpoint of increasing the surface modification rate. The surface modifier not bonded to the electrode can be collected to be reused. In this context, the surface area of the electrode herein refers to the effective surface area of the electrode. The effective surface area means a surface area with the roughness, the texture and the fine configuration of the electrode surface considered. Taking into account of the molecular size of the surface modifier according to the present invention, the effective surface area can be calculated in consideration of the surface roughness of about 1 nm and the fine shape to determine the amount of the surface modifier to be used.

In performing the contacting step, water may coexist. In the case in which reactive groups bonded to silicon atoms of a compound containing a reactive silyl group represented by General Formula (1), which is the main ingredient, are alkoxy group and acyloxy groups, silanol is formed in hydrolysis reaction to facilitate reaction with the electrode surface. In the case in which a compound containing a reactive silyl group represented by General Formula (1) is silanol, addition of water is not necessarily needed. In performing the contacting step in a liquid phase, water can be added to a surface modifier or its solution. In performing the contacting step in a gas phase, water can be added as water vapor. Alternatively, water adsorbed on the electrode surface before performing the contacting step can be employed. In this case, contact operation can be performed without adding water. For example, in a case in which the contact angle of water on the electrode surface is determined to be 30° or less, which corresponds to a hydrophilic state, it is believed that water vapor in the atmosphere, if any, is supplied to the electrode surface and a sufficient amount of water is adsorbed on the electrode surface.

In the contacting step, it is preferred that the amount of water to be added in the case in which water is added to the surface modifier is normally 0.01 to 1 mol per 1 mol of the surface modifier used in the contacting step to minimize self-polycondensation of the surface modifier.

In the above-described contacting step, at least one surface modifier represented by General Formula (1) is used. Thus, for example, a plurality of surface modifiers can be mixed to perform the contacting step. An aspect of the contacting step in which a plurality of surface modifiers are mixed can be performed similarly both in a liquid phase and in a gas phase. Alternatively, the contacting step can be also performed using simultaneously a plurality of surface modifiers without mixing. The aspect of the contacting step performed using simultaneously a plurality of surface modifiers without mixing is applied to, in particular, a case of gas phase contact. Furthermore, sequential contacting steps can be performed using a plurality of surface modifiers. Also in the case in which the sequential contacting steps can be performed similarly both in a liquid phase and in a gas phase. These aspects have an advantage that the work function and the surface free energy of the electrode surface can be finely adjusted because a plurality of surface modifiers can be bonded to the surface of the transparent oxide electrode.

The method for producing a surface-modified transparent oxide electrode according to the present invention may include an optional step of activating the electrode surface before the contacting step. Examples of the activation method include corona discharge treatment, UV ozone treatment, and oxygen plasma treatment, each of which oxidatively decomposes one or more organic substances adsorbed on the surface as well as oxidizes the electrode surface. Thus, the treated electrode surface will be hydrophilic and enter into a state of high surface free energy. Therefore, activation can increase the surface modification rate and shorten the contacting step. It is preferable that the activation step be performed in an atmosphere containing water vapor. Alternatively, it is preferable that a step of contacting the electrode surface after completion of the activation step with water be further included. That is because water becomes adsorbed evenly on the electrode surface.

Post-treatment steps such as heating, washing, and drying may be optionally performed on the surface-modified transparent oxide electrode after the contacting step. Particularly, in the case in which the contacting step is performed in a liquid phase, it is preferable that an excess surface modifier be removed from the electrode by washing with solvent. In this case, washing efficiency can be increased by simultaneous ultrasonication. Specifically, the step can be performed by immersing the transparent oxide electrode after completion of the contacting step in washing solvent contained in ultrasonic cleaner. A step of removing moisture adsorbed on the surface may be performed as a post-treatment step. Specifically, the step can be performed by heating the surface-modified transparent oxide electrode on a hot plate or in an oven. The heating temperature and time in this case can be freely determined by those skilled in the art. The heating temperature and time are typically 40 to 300° C., preferably 60 to 250° C. for 1 to 120 minutes, preferably 5 to 60 minutes. The heating may be performed in the atmosphere, or in inert gases such as nitrogen and argon.

The method for producing a surface-modified transparent oxide electrode or the method for surface-modifying a transparent oxide electrode using the above described surface modifier can provide a surface-modified transparent oxide electrode by bringing the above-described surface modifier into contact with at least one surface of the transparent oxide electrode for coating.

On the surface of the surface-modified transparent oxide electrode, a self-assembled monolayer has been theoretically formed. According to another aspect, the present invention relates to a surface-modified transparent oxide electrode. The surface-modified transparent oxide electrode according to the present invention may have very useful physical properties as organic EL devices and the like by comprising a surface-modified layer formed with the surface modifier. The surface-modified transparent oxide electrode of the present invention is described hereinafter, from a viewpoint of each physical property.

[Coverage Index]

A coverage, which is one of indexes for properties of a transparent oxide electrode surface modified using the surface modifier for a transparent oxide electrode according to the present invention is described. The coverage of the electrode surface can be varied by choosing the type of compounds represented by General Formula (1). For example, reducing the molecular size, reducing the molecular length, or substituting A and/or $R^1$, which are non-reactive substituents directly bonded to the silicon atom in the compound represented by General Formula (1), with an non-bulky substituent can increase the coverage. On the other hand, increasing the molecular size, increasing the molecular length, or using a more bulky substituent as A and/or $R^1$ can decrease the coverage. Modulation of a molecule with substituents, from a viewpoint of size and length, can be carried out using calculation approaches such as computer modeling, considering interaction among a plurality of substituents and the like. Alternatively, an index to choose a preferable substituent from a viewpoint of bulkiness is as described in the exemplification of preferable A and $R^1$ in General Formula (1).

Methods for evaluating coverage include various methods, one of which is quantification by X-ray photoelectron spectroscopy (XPS). In the present invention, a coverage specified in the following is based on a value obtained by X-ray photoelectron spectroscopy. In this case, the take-off angle of the photoelectron is 90 degrees. The surface modifier of the present invention includes a silicon atom per molecule of the compound constituting the surface modifier. Thus, the ratio (F) of the quantified value of the number of silicon atoms ($C_{Si}$) to the quantified value of the number of metal atoms ($C_M$) contained in the metal oxides constituting the transparent oxide electrode can be determined by taking the ratio in atomic % to thereby estimate the amount of the surface modifier present on the electrode. That is, the ratio (F) is as shown in the following Equation 1:

$$F = \frac{C_{Si}}{C_M}$$

For example, in the case in which the material constituting the transparent oxide electrode is ITO, ratios of silicon, indium and tin present were determined in atomic % by XPS measurement of the modified electrode surface. According to the following Equation 2, the value F (ITO), which is the quantified value of silicon ($C_{Si}$) divided by the sum of the quantified value of indium ($C_{In}$) and the quantified value of tin ($C_{Sn}$), will be the index of the amount of the surface modifier present on the electrode surface.

$$F(ITO) = \frac{C_{Si}}{C_{In} + C_{Sn}} \qquad \text{Equation 2}$$

When the surface modifier forms a monolayer, that is, in the case in which formation of a monolayer is confirmed, comprehensively judging from the results, such as layer thickness measurement by ellipsometry and surface form observation with an atomic force microscope (AFM), the value F can be regarded as an index of the coverage. The coverage may vary depending on the chemical structure of the surface modifier and its orientation on the electrode surface, and thus, the coverage may not be always determined to be the same even if the value F is the same. However, the index is useful from a viewpoint that the coverage can be relatively evaluated easily. Although XPS measurement of organic substance generally tends to damage samples by X-ray, the above described value F substantially has no influence due to the sample damages on the quantified values because the quantified value of silicon, which is an inorganic element, is used. Additionally, ITO has been described as an example here, but the value F may be different depending on the type of metal oxide constituting the electrode even if the same surface modifier is used. Therefore, it is preferable to compare and evaluate coverage among the same electrode materials and among surface modifier of similar structures. This is suitable to determine the coverage of the electrode with a monolayer composed of the surface modifier of the present invention.

In the present invention, the coverage of the surface modifier preferably has a value F of 0.04 or greater, more preferably a value F of 0.05 to 0.15. This is for the purpose of achieving sufficient surface modification effect. However, the coverage is one index as described above. Sufficient surface modification effect may be confirmed with values of other physical properties even if the coverage is out of this numerical range.

[Surface Free Energy]

In the case of evaluation from another viewpoint, a surface-modified transparent oxide electrode produced by the above described production method preferably has a surface free energy value of 20 mN/m or more.

By modification using the surface modifier of the present invention, the surface free energy of the electrode surface is normally reduced to less than the value before treatment (for ITO, typically 50 to 70 mN/m). Typical organic solvents, except solvents generally having low solubility of aromatic compounds such as aliphatic hydrocarbons and fluorine solvents, have a surface tension of 20 to 50 mN/m. Thus, in order to enhance applicability of organic solution on a surface-modified transparent oxide electrode, the surface free energy of the transparent oxide electrode is preferably 20 mN/m to 50 mN/m, more preferably 25 mN/m to 50 mN/m. In the case in which the surface free energy is less than 20 mN/m, wettability with organic compounds and organic solvents is poor. The poor wettability may cause adverse effects, particularly when organic compounds are layered on the transparent oxide electrode by coating or printing of organic solution. In contrast, in the case in which the surface free energy is more than 50 mN/m, water tends to be adsorbed due to higher hydrophilicity, and thus the performance of the device may be degraded. In this context, these values are the surface free energy values at normal temperature under normal pressure all obtained using the Owens-Wendt plot.

The surface free energy of the modified transparent oxide electrode can be calculated on the basis of the contact angle measured using a liquid of which surface tension is known. Calculation methods, such as the Zisman method, which handles surface free energy as one component, the Owens-Wendt method or the Fowkes method, in which the surface free energy is considered to be composed of two components, the van Oss method, in which the surface free energy is considered to be composed of three components, and some other methods are suggested. It is appropriate to calculate the surface free energy of the transparent oxide electrode modified with the surface modifier of the present invention, using, for example, the Owens-Wendt method, because the surface of the electrode, on which no ions and metals are present, has a moderate polarity.

As for the transparent oxide electrode modified with the surface modifier of the present invention, in the case in which the value F obtained by Equation 1 described above is small, the transparent oxide electrode has a large proportion of exposure, resulting in a large surface free energy value. As the value F increases, the surface free energy decreases. Furthermore, when the value F become larger than a certain extent (for example, in the case of that the value F is 0.05 or more), the surface free energy value becomes substantially constant. Accordingly, it can be said that the surface free energy of the sufficiently-surface-modified transparent oxide electrode takes an intrinsic value depending on the type of surface modifier. The surface free energy of the transparent oxide electrode modified with the surface modifier of the present invention is preferably 20 mN/m or more, which provides sufficient wettability to an organic solution.

[Amount of Change in Root-Mean-Squared Surface Roughness]

In the surface-modified transparent oxide electrode of the present invention, the absolute value of the amount of change between the root mean square (RMS) surface roughness of an untreated transparent oxide electrode and that of a surface-modified transparent oxide electrode is preferably 0.5 nm or less, more preferably 0.4 nm or less, and further preferably 0.3 nm or less. If it is more than 0.5 nm, the layer thickness of the surface modified layer may become very inhomogeneous. This is because use of such an electrode with coarse particles adsorbed may cause adversely effects on the performance of a device. For example, in the case of organic EL devices, life of devices may be shortened due to electric field concentration, and dark spots may occur due to short circuiting.

The amount of change in RMS surface roughness can be obtained by observation and measurement with an atomic force microscope (AFM). On the surface with coarse particles adsorbed, if the surface roughness has significantly increased compared to before modification and the surface modifier is uniformly distributed on the electrode surface, the RMS roughness of the electrode surface does not greatly vary before and after modification. It is preferable to perform the contacting step using the gas-phase method in order to prevent adsorption of coarse particles as described above.

[Thickness of the Surface-Modified Layer]

The average thickness of surface modified layers of the surface-modified transparent oxide electrode of the present invention is preferably 3 nm or less, more preferably 0.5 to 3 nm, and further preferably 1 to 2.5 nm. In the case of a surface-modified layer less than 0.5 nm thick, a sufficient modification effect may not be achieved due to small amount of change in the work function, whereas in the case of more than 3 nm thick, transfer of electric charges by the electrode may be inhibited. Such a thickness is determined depending on the size of the compound represented by General Formula (1) constituting the surface modifier according to the present invention and the arrangement and the orientation state on the electrode surface. An example of the method for measuring the average thickness of surface-modified layers includes polarimetric method (ellipsometry).

[Amount of Change in the Surface Work Function]

The surface work function of the surface-modified transparent oxide electrode of the present invention is significantly increased compared to the surface work function of an untreated transparent oxide electrode. The amount of change in the surface work function, that is, the difference between the surface work function of a surface-modified transparent oxide electrode after modification and the surface work function of an untreated transparent oxide electrode before modification, if measured in the atmosphere, is preferably +0.55 V or more to +2.0 eV or less, further preferably +0.60 V or more to +1.8 eV or less. This is because these values are effective for reducing the hole injection barrier.

The surface work function of oxide transparent electrodes can be measured with, for example, the Kelvin probe (KP), vacuum ultraviolet photoelectron spectroscopy (UPS), and photoelectron yield spectroscopy (PYS). Substantially similar values can be obtained if the values are obtained with any of the above measurement methods. It is preferable to have an amount of change in the surface work function within the above described numerical range, if any measurement method is used.

The amount of change in the surface work function varies in accordance with the value F, which is an index of the coverage. Furthermore, the amount depends on the structure of the surface modifier. Thus, a surface-modified transparent oxide electrode having a desired amount of change in the above described range can be obtained by changing the value F and the structure of the surface modifier. Particularly, in the case in which the value F is the above-described predetermined value or greater and the compound constituting the surface modifier is a compound represented by General Formula (1), the value of the amount of change in the surface work function can be within the above-described preferable range.

The preferable properties of surface-modified transparent oxide electrodes according to the present invention have been described above. However, a surface-modified transparent oxide electrode according to the present invention may be an electrode comprising a surface-modified layer formed by being coated on the above described surface modifier. It is not necessary for the electrode to have all the numerical properties.

EXAMPLES

A surface modifier and a method for producing a surface-modified transparent oxide electrode of the present invention will be specifically described below, referring to Examples and Comparative Examples.

Examples 1 to 5

Tin-doped indium oxide (ITO) electrode surfaces were modified using a surface modifier composed solely of each compound shown in Table 1 and its footnote. 300 mg (about 0.9 to 1 mmol (depending on the compound used in each Example)) of each surface modifier was charged in a resin cup, which was placed in the center of the bottom of a glass container with a lid having an internal volume of 350 mL. As an electrode sample, an about 150 nm-thick ITO layered glass (ITO glass) cut to a size of 18×18 mm was used. The surface of the ITO glass was UV-ozone treated by irradiation with ultraviolet light of 172 nm in the atmosphere for 1 minute. Subsequently, the ITO glass was placed around the resin cup such that the ITO surface faced upward. After the lid of the glass container was closed, the gas phase contacting step was performed at room temperature. When the gas phase contacting step was performed, the vapor pressures of all the surface modifiers were about 1 Pa or more. After 1 hour passed, the ITO glass was removed from the container. The surface-modified ITO glass was subjected to surface work function measurement, surface free energy measurement, X-ray photoelectron spectroscopy spectrum (XPS) and atomic force microscope (AFM) measurement. The results are shown in Table 1.

<Change in Surface Work Function>

Changes in the surface work function were measured in the atmosphere using a Kelvin probe (KP: scanning probe microscope equipped with a KFM unit manufactured by JEOL Ltd.). Two points were measured to calculate the average of the values. Amounts of change were determined on the basis of the value of the surface work function measured on untreated ITO.

<Surface Free Energy>

Four liquids, that is, pure water, glycerin, formaldehyde, and methylene iodide were placed on four points to thereby determine their contact angles on the ITO surface using DropMaster 500 (manufactured by Kyowa Interface Science Co., LTD) at room temperature in the atmosphere. On the basis of the obtained contact angles, surface free energies were calculated using the Owens-Wendt plot. For calculating surface free energy, the arithmetic average of the values obtained from those four points.

<Ratio of the Number of Silicon Atom to the Number of Metal Atoms: F (ITO)>

XPS measurement was performed on the surface of oxide transparent electrode after surface modification with a surface modifier. K-Alpha (manufactured by Thermo Scientific Inc.) was used for the measurement. The X ray source was a monochromatic aluminum Kα ray, the irradiation diameter was set to 400 μm, and the take-off angle of photoelectron was set to 90 degrees. The number of silicon atoms derived from the surface treatment agent (Si2p peak), the number of indium atoms contained in the ITO ($In3d^{5/2}$ peak) and the number of tin atoms ($Sn3d^{5/2}$ peak) were separately calculated as atomic %. On the basis of these values, the value of F (ITO) was calculated in accordance with Expression 2.

<Root-Mean-Squared (RMS) Roughness>

AFM measurement of the ITO surface was performed using Nano-IM-8 (manufactured by Pacific Nanotechnology Inc.). Two points with an observation area of a 10 μm square were measured. RMS roughness was determined as the average of root mean square surface roughness obtained from each point.

Comparative Example 1

The amount of change in the surface work function, surface free energy, F (ITO), and RMS roughness of an unmodified ITO surface were measured and are shown in Table 1. The amount of change in the RMS roughness was calculated on the basis of the case of Comparative Example (untreated).

Comparative Example 2

After only UV-ozone treatment was performed on an unmodified ITO surface, the amount of change in the surface work function, surface free energy, F (ITO), and RMS roughness of the surface were measured and are shown in Table 1.

Comparative Example 3

An ITO surface was modified as in Examples 1 to 5 using heptadecafluorodecyl trimethoxysilane as a surface modifier.

TABLE 1

| | Surface modifier | Amount of change in the surface work function | Surface free energy | F (ITO) | RMS roughness | Amount of change in the RMS roughness |
|---|---|---|---|---|---|---|
| Example 1 | A-1 | +1.08 eV | 29.7 mN/m | 0.077 | 2.50 nm | +0.19 nm |
| Example 2 | A-2 | +1.20 eV | 30.7 mN/m | 0.059 | 2.55 nm | +0.24 nm |
| Example 3 | A-3 | +0.94 eV | 35.5 mN/m | 0.059 | 2.41 nm | +0.10 nm |
| Example 4 | A-4 | +0.80 eV | 31.5 mN/m | 0.066 | 2.52 nm | +0.21 nm |
| Example 5 | A-5 | +1.05 eV | 37.7 mN/m | 0.062 | 2.40 nm | +0.09 nm |
| Comparative Example 1 | None | (0 eV, Reference) | 30.6 mN/m | 0 | 2.31 nm | 0 |
| Comparative Example 2 | None | +0.54 eV (Unstable) | 69.3 mN/m | 0 | 2.35 nm | — |
| Comparative Example 3 | B-1 | +1.04 eV | 8.0 mN/m | 0.072 | 2.63 nm | +0.32 nm |

A-1: pentafluorophenyltrimethoxysilane
A-2: 2-(pentafluorophenyl)ethyltrimethoxysilane
A-3: 3-(pentafluorophenyl)propyltrimethoxysilane
A-4: 4-(pentafluorophenyl)butyltrimethoxysilane
A-5: 3-(3,4,5-trifluorophenyl)propyltrimethoxysilane
B-1: heptadecafluorodecyltrimethoxysilane In Examples 1 to 5 in which the surface modifiers of the present invention were used, every ITO surface work function has been greatly increased compared to the unmodified Comparative Example 1. In Comparative Example 2 in which only the UV-ozone treatment was performed without using a surface modifier, the work function changed during measurement to thereby provide no reliable measurements. In Comparative Example 3, although the ITO surface work function has been increased, the surface free energy was extremely low and the wettability with common organic solvents was poor.

The surface modifier for a transparent oxide electrode of the present invention, which allows the surface work function or surface free energy of transparent oxide electrodes to be adjusted, can be employed for manufacturing organic electronic devices such as organic electroluminescent devices and organic solar cells.

What is claimed is:

1. A surface-modified transparent oxide electrode formed by coating a transparent oxide electrode with a surface modifier for a transparent oxide electrode comprising a reactive silyl compound represented by General Formula (1):

$$Rf\text{—}X\text{-}A\text{-}SiR^1_{3-n}(OR^2)_n \qquad (1)$$

wherein,
Rf is an aryl group having 6 to 10 carbon atoms that may have an alkyl substituent having 1 to 5 carbon atoms, wherein 1 to 6 hydrogen atoms are replaced with a fluorine atom, and wherein a pentafluorophenyl group is excluded from Rf,
X is a single bond,
A is a straight chain aliphatic divalent hydrocarbon group having 1 to 10 carbon atoms,
$R^1$ is a monovalent hydrocarbon group having 1 to 3 carbon atoms,
$R^2$ represents a monovalent hydrocarbon group having 1 to 3 carbon atoms, an acetyl group, a propanoyl group, or a hydrogen atom, and
n is an integer of 1 to 3,
wherein General Formula (1) excludes triethoxy (fluoro-phenethyl)silane.

2. The surface-modified transparent oxide electrode according to claim 1, wherein the surface-modified transparent oxide electrode has a surface free energy of at least 20 mN/m.

3. The surface-modified transparent oxide electrode according to claim 1, wherein, on the surface of the surface-modified transparent oxide electrode, a ratio of the number of silicon atoms to the number of the metal atoms contained on the electrode surface obtained by X-ray photoelectron spectroscopy is at least 0.04.

4. The surface-modified transparent oxide electrode according to claim 1, wherein an absolute value of the amount of change in the root mean square surface roughness between the unmodified transparent oxide electrode and surface-modified transparent oxide electrode is not more than 0.5 nm.

5. The surface-modified transparent oxide electrode according to claim 1, wherein an average thickness of the surface-modified layer of the surface-modified transparent oxide electrode is not more than 3 nm.

6. The surface-modified transparent oxide electrode according to claim 1, wherein the transparent oxide electrode is selected from the group consisting of fluorine-doped tin oxides, aluminum-doped zinc oxides, indium-doped zinc oxides, gallium-doped zinc oxides, tin-doped indium oxides, and niobium-doped titanium oxides.

7. A method for producing a surface-modified transparent oxide electrode, comprising the steps of:
contacting the surface modifier for the transparent oxide electrode comprising a reactive silyl compound represented by General Formula (1) according to claim 1 with a surface of the transparent oxide electrode, and thereby obtaining a surface-modified transparent oxide electrode,
wherein a surface work function of the surface-modified transparent oxide electrode is greater by at least 0.55 eV than a surface work function of the transparent oxide electrode before the contacting step.

8. The method for producing a surface-modified transparent oxide electrode according to claim 7, wherein the contacting step is performed using a gas phase contact method in which the surface of the transparent oxide electrode is exposed to an atmosphere of the surface modifier that is vaporized.

9. The method for producing a surface-modified transparent oxide electrode according to claim 7, comprising a step of activating a surface of the transparent oxide electrode before the contacting step.

* * * * *